US012334884B2

(12) United States Patent
Samata et al.

(10) Patent No.: US 12,334,884 B2
(45) Date of Patent: Jun. 17, 2025

(54) POWER AMPLIFICATION DEVICE AND AN RF CIRCUIT MODULE

(71) Applicant: Murata Manufacturing Co., Ltd., Kyoto-fu (JP)

(72) Inventors: Mitsunori Samata, Nagaokakyo (JP); Satoshi Arayashiki, Nagaokakyo (JP); Koshi Himeda, Nagaokakyo (JP); Masayuki Aoike, Nagaokakyo (JP)

(73) Assignee: Murata Manufacturing Co., Ltd., Kyoto-fu (JP)

( * ) Notice: Subject to any disclaimer, the term of this patent is extended or adjusted under 35 U.S.C. 154(b) by 634 days.

(21) Appl. No.: 17/644,035

(22) Filed: Dec. 13, 2021

(65) Prior Publication Data

US 2022/0200551 A1 Jun. 23, 2022

(30) Foreign Application Priority Data

Dec. 17, 2020 (JP) ................. 2020-209635

(51) Int. Cl.
*H03F 3/195* (2006.01)
*H01L 23/66* (2006.01)
*H03F 1/56* (2006.01)
*H03F 3/24* (2006.01)

(52) U.S. Cl.
CPC ............ *H03F 3/245* (2013.01); *H01L 23/66* (2013.01); *H03F 1/565* (2013.01); *H03F 3/195* (2013.01); *H01L 2223/6611* (2013.01); *H01L 2223/6655* (2013.01); *H03F 2200/451* (2013.01)

(58) Field of Classification Search
CPC .................. H03F 3/195; H03F 1/30

USPC .......................... 330/307, 296, 285
See application file for complete search history.

(56) References Cited

U.S. PATENT DOCUMENTS

| | | | | |
|---|---|---|---|---|
| 6,466,094 B2* | 10/2002 | Leighton | ................ | H03F 1/565 |
| | | | | 330/307 |
| 9,041,472 B2* | 5/2015 | Chen | ...................... | H01L 29/20 |
| | | | | 330/307 |
| 2008/0136729 A1 | 6/2008 | Kang et al. | | |
| 2015/0295548 A1* | 10/2015 | Zhang | ...................... | H03F 3/21 |
| | | | | 330/296 |

(Continued)

FOREIGN PATENT DOCUMENTS

| | | |
|---|---|---|
| JP | 2005-303771 A | 10/2005 |
| JP | 2013-197655 A | 9/2013 |

(Continued)

*Primary Examiner* — Henry Choe
(74) *Attorney, Agent, or Firm* — Studebaker Brackett PLLC

(57) ABSTRACT

A power amplification device includes a first member in which a first circuit is formed, a second member in which a second circuit is formed, and a member-member connection conductor that electrically connects the first circuit and the second circuit to each other. The second member is mounted on the first member. The second circuit includes a first amplifier, which amplifies a radio frequency signal to output a first amplified signal. The first circuit includes a control circuit that controls an operation of the second circuit. At least part of a first termination circuit, which is connected to the first amplifier through the member-member connection conductor and which attenuates a harmonic wave component of the first amplified signal, is formed in the first member.

20 Claims, 40 Drawing Sheets

(56) References Cited

U.S. PATENT DOCUMENTS

2015/0303971 A1    10/2015    Reisner et al.

FOREIGN PATENT DOCUMENTS

| JP | 2016-528735 A | 9/2016 |
| JP | 2020-028108 A | 2/2020 |
| JP | 2020-136729 A | 8/2020 |

* cited by examiner

POWER AMPLIFICATION DEVICE AND AN RF CIRCUIT MODULE

CROSS-REFERENCE TO RELATED APPLICATION

This application claims benefit of priority to Japanese Patent Application No. 2020-209635, filed Dec. 17, 2020, the entire content of which is incorporated herein by reference.

BACKGROUND

Technical Field

The present disclosure relates to a power amplification device and a radio frequency (RF) circuit module.

Background Art

Hitherto, an RF front end unit that has both of a transmission function and a reception function for radio frequency signals has been incorporated into an electronic device for, for example, mobile communications or satellite communication. The RF front end unit is constituted by, for example, a radio frequency amplifier, a control integrated circuit (IC), a switch IC, and a duplexer, which are mounted on a package substrate. The control integrated circuit (IC) controls the radio frequency amplifier. The entirety of the RF front end unit is sealed with resin.

The radio frequency amplifier is, for example, a monolithic microwave IC (MMIC) formed on a gallium arsenide (GaAs) substrate. The control IC and the switch IC are, for example, MMICs formed on a silicon (Si) substrate. These are mounted separately from each other on the surface of the package substrate.

In contrast, U.S. Patent Application Publication No. 2015/0303971 discloses a structure in which, for example, a control IC is stacked on a radio frequency amplifier, and these are connected to electrodes on a package substrate by wire bonding to reduce the size of the package substrate.

U.S. Patent Application Publication No. 2015/0303971 discloses a structure in which a heterojunction bipolar transistor (HBT) die on which the radio frequency amplifier is formed and a Si die on which the control IC is formed are stacked and provided on a laminated substrate. An output matching circuit and a band selection switch are stacked and provided on the laminated substrate at a different position from the position where the HBT die and the Si die are provided. An amplified signal that is a signal amplified by the radio frequency amplifier is transmitted to the band selection switch through the output matching circuit.

However, with such a configuration, a harmonic wave of the amplified signal may be emitted from a wiring line routed from the radio frequency amplifier to the output matching circuit. The emitted harmonic wave enters another device and acts as noise, and thus a technology for suppressing entering of a harmonic wave into another device is desired.

SUMMARY

The present disclosure has been made in light of such circumstances, and the present disclosure provides a power amplification device and an RF circuit module that suppress entering of a harmonic wave included in an amplified signal that is a signal amplified by an amplifier into another device.

A power amplification device according to an aspect of the present disclosure includes a first member in which a first circuit is formed, a second member in which a second circuit is formed, and a member-member connection conductor that electrically connects the first circuit and the second circuit to each other. The second member is mounted on the first member. The second circuit includes a first amplifier, which amplifies a radio frequency signal to output a first amplified signal. The first circuit includes a control circuit that controls an operation of the second circuit. At least part of a first termination circuit, which is connected to the first amplifier through the member-member connection conductor and which attenuates a harmonic wave component of the first amplified signal, is formed in the first member.

According to the present disclosure, it is possible to provide a power amplification device and an RF circuit module that suppress entering of a harmonic wave included in an amplified signal that is a signal amplified by an amplifier into another device.

DETAILED DESCRIPTION

Figure 1A:
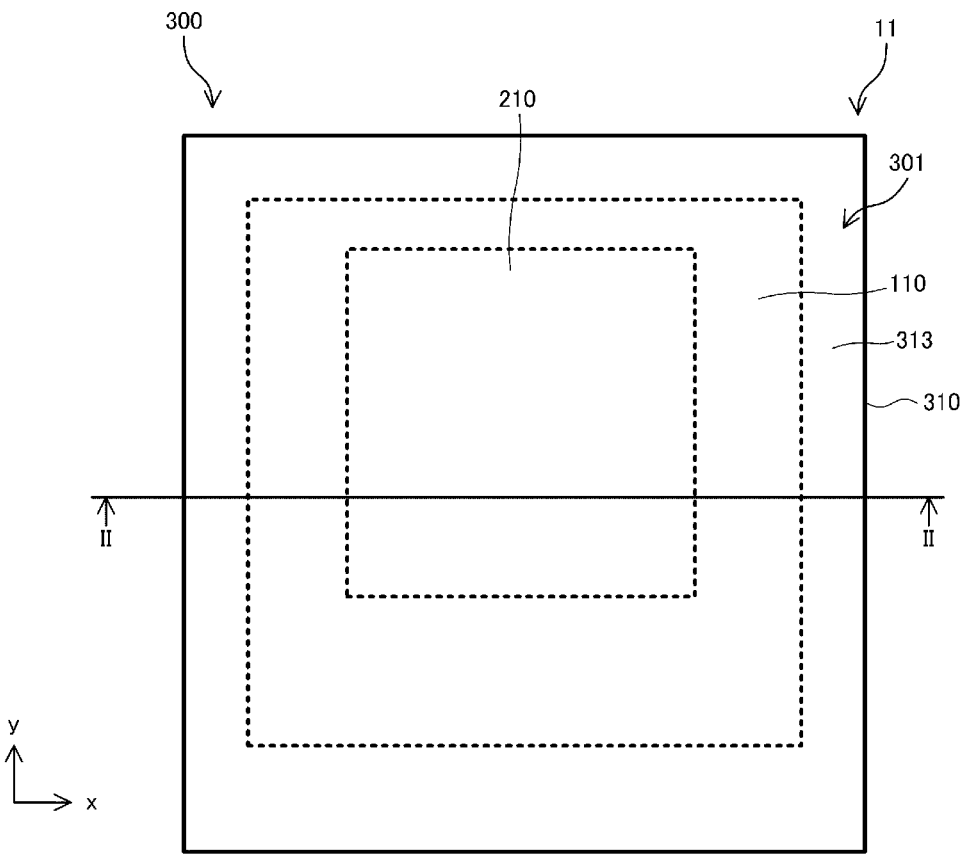
FIG. 1A is a plan view of an RF circuit module.

In the following, embodiments of the present disclosure will be described in detail with reference to the drawings. Note that identical elements are denoted by the same reference numerals, and redundant description will be omitted as much as possible.

First Embodiment

The summary of an RF circuit unit according to a first embodiment will be described.

Figure 1B:
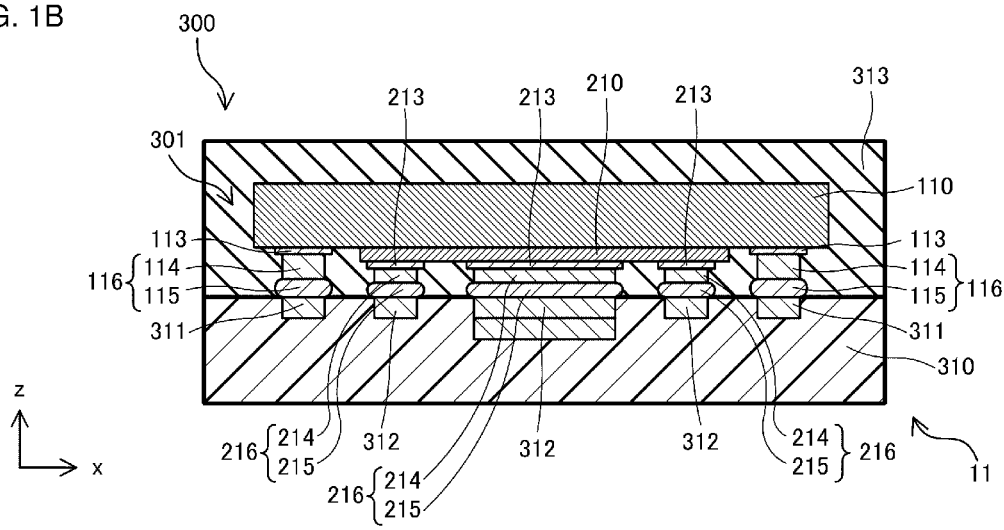
FIG. 1B is a schematic cross-sectional view of the configuration of a cross section of the RF circuit module illustrated in FIG. 1A and taken along line II-II.

FIG. 1A is a plan view of an RF circuit module 300. FIG. 1B is a schematic cross-sectional view of the configuration of a cross section of the RF circuit module 300 illustrated in FIG. 1A and taken along line II-II.

As illustrated in FIGS. 1A and 1B, the RF circuit module 300 has a power amplification device 11 and a mold resin 313. The power amplification device 11 has a power amplifier (PA) circuit element 301 and a module board 310. The PA circuit element 301 includes a first member 110, a second member 210, a first-member-side electrode 113, a first conductive protrusion 116 (first-member-side conductive protrusion portion), a second-member-side electrode 213, a second conductive protrusion 216 (second-member-side conductive protrusion portion), and a member-member connection conductor (not illustrated). The first conductive protrusion 116 includes a conductive pillar 114 and a solder layer 115. The second conductive protrusion 216 includes a conductive pillar 214 and a solder layer 215.

In the drawings, the x axis, the y axis, and the z axis may be illustrated. The x axis, the y axis, and the z axis form three dimensional right-hand rectangular coordinates. Hereinafter, the direction of the arrow represented by the z axis may be called the +z axis side, and the direction opposite the direction of the arrow may be called the −z axis side. The same substantially applies to the other axes. Note that the +z axis side and the −z axis side may also be called "upper side" and "lower side", respectively.

The module board 310 is, for example, a printed circuit board (PCB) such as a glass substrate or an epoxy substrate and has a rectangular parallelepiped shape. The module board 310 includes substrate-side electrodes 311 and 312 for mounting parts. The mold resin 313 is, for example, an epoxy resin.

The thermal conductivity of the first member 110 is greater than that of the second member 210. The second member 210 is thinner than the first member 110. In the present embodiment, the first member 110 is, for example, an element semiconductor member and has a rectangular parallelepiped shape. Specifically, the first member 110 is manufactured in an integrated circuit process in which a semiconductor having a single group-IV component as a main component is used as a material (hereinafter also referred to as first integrated circuit process).

In this case, the semiconductor having a single group-IV component as a main component is, for example, a semiconductor having silicon (Si) as a main component. The first integrated circuit process corresponds to, for example, a complementary metal oxide semiconductor (CMOS) or a bipolar-CMOS (BiCMOS). That is, in a semiconductor having silicon (Si) as a main component, a circuit (hereinafter also referred to as first circuit) is formed in the first integrated circuit process. Note that the first member 110 may be manufactured in the first integrated circuit process in which a semiconductor having silicon-germanium (SiGe), carbon (C), or silicon carbide (SiC) as a main component is used as a material.

In the present embodiment, the second member 210 is, for example, a compound semiconductor member and has a rectangular parallelepiped shape. Specifically, the second member 210 is manufactured in an integrated circuit process in which a semiconductor having, as a main component, a compound of a group III element and a group V element is used as a material (hereinafter also referred to as second integrated circuit process). The semiconductor described above is, for example, a semiconductor having gallium arsenide (GaAs) as a main component. The second integrated circuit process corresponds to, for example, a GaAs heterojunction bipolar transistor (HBT) or a GaAs pseudomorphic high electron mobility transistor (pHEMT). That is, in the semiconductor having GaAs as a main component, a circuit (hereinafter also referred to as second circuit) is formed using a GaAs HBT or a GaAs pHEMT. The second circuit includes, for example, an amplifier that amplifies an RF signal (a radio frequency signal).

Note that the second member 210 may be manufactured in the second integrated circuit process in which a semiconductor having indium phosphide (InP) as a main component is used as a material (for example, InP HBT or InP pHEMT) or in the second integrated circuit process in which a semiconductor having gallium nitride (GaN) as a main component is used as a material (for example, GaN HBT or GaN HEMT).

The first circuit in the first member 110 and the second circuit in the second member 210 are electrically connected to each other by a member-member connection conductor (not illustrated) without using the module board 310. In the present embodiment, a form of the member-member connection conductor is, for example, a conductor formed in or on either the first member 110 or the second member 210.

Figure 2A:
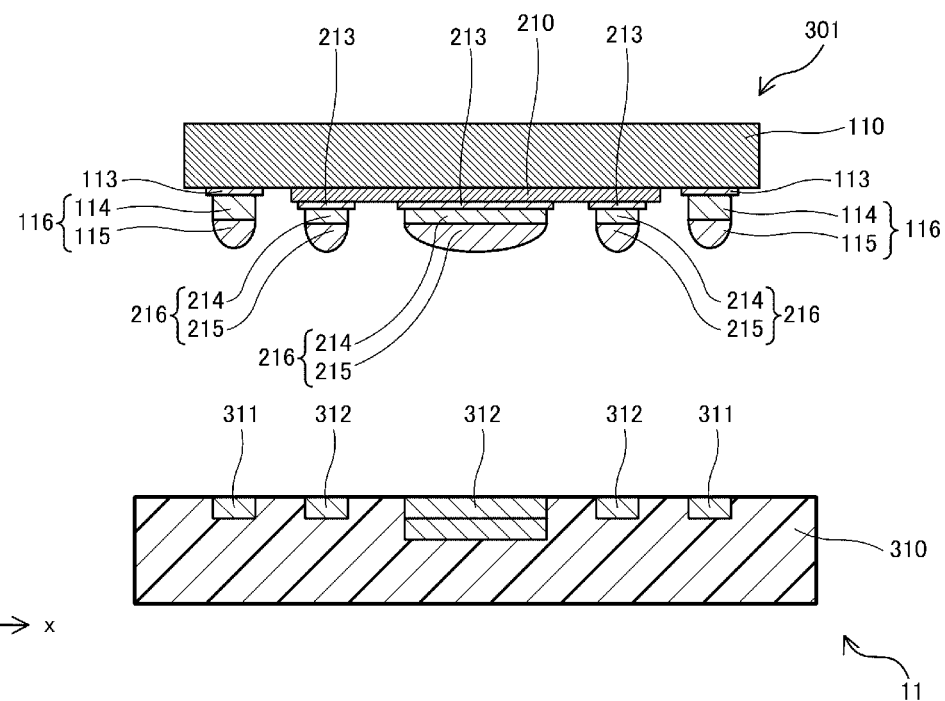
FIGS. 2A and 2B are diagrams illustrating a manufacturing process of the RF circuit module.
Figure 2B:
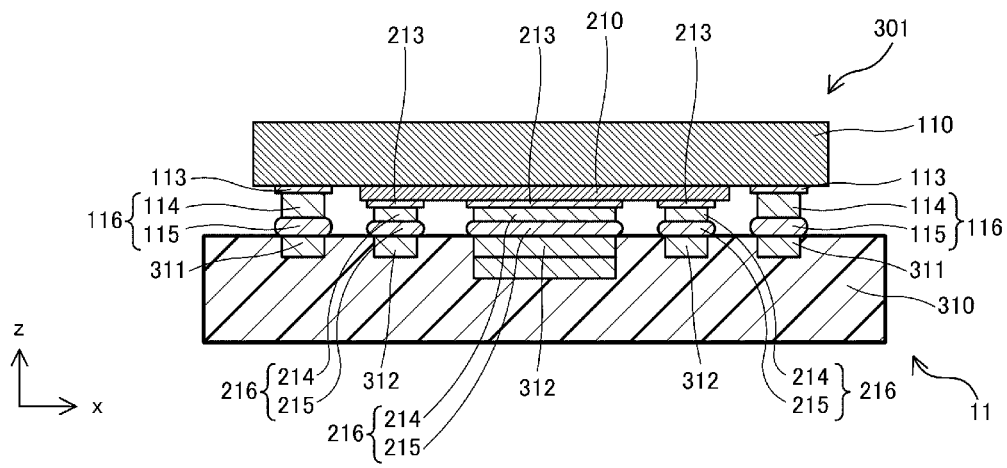

FIGS. 2A and 2B are diagrams illustrating a manufacturing process of the RF circuit module 300. FIG. 2A is a cross-sectional view illustrating a state immediately before the PA circuit element 301 is mounted on the module board 310. FIG. 2B is a cross-sectional view illustrating a state where the PA circuit element 301 is mounted on the module board 310.

A method for forming the PA circuit element 301 will be described later. First conductive protrusions 116 and second conductive protrusions 216 are formed on the bottom surface of the PA circuit element 301. The first conductive protrusions 116 and the second conductive protrusions 216 of the PA circuit element 301 are aligned with the substrate-side electrodes 311 and the substrate-side electrodes 312 of the module board 310, respectively, and are heated and subjected to pressing. As a result, as illustrated in FIG. 2B, the solder layers 115 of the first conductive protrusions 116 of the PA circuit element 301 and the solder layers 215 of the second conductive protrusions 216 of the PA circuit element 301 are connected to the substrate-side electrodes 311 and the substrate-side electrodes 312, respectively.

Figure 3:
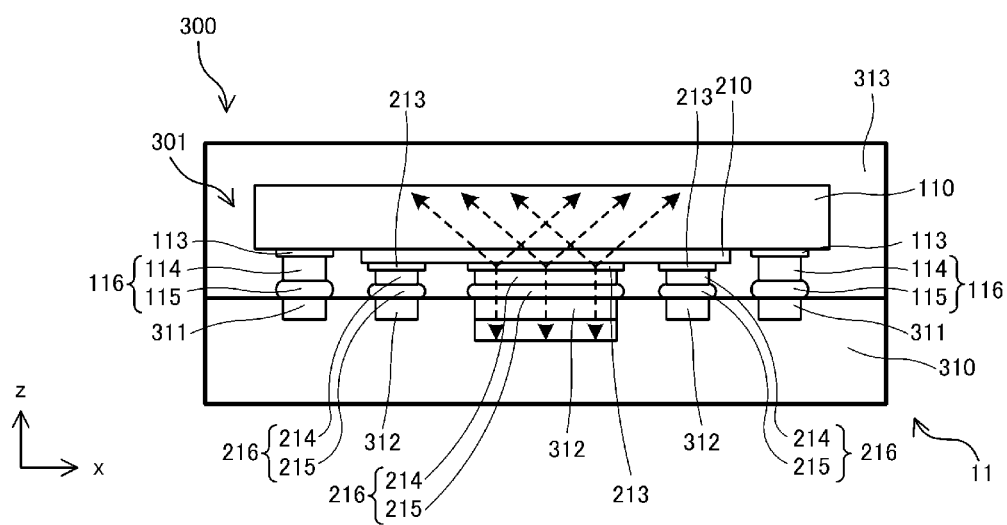
FIG. 3 is a diagram illustrating two thermal conductive paths, which are heat dissipation paths from a circuit element formed on a second member of the RF circuit module.

FIG. 3 is a diagram illustrating two thermal conductive paths, which are heat dissipation paths from a circuit element formed on the second member 210 of the RF circuit module 300. In FIG. 3, broken arrows represent two thermal conductive paths. A first thermal conductive path includes a second-member-side electrode 213 and a second conductive protrusion 216 among the second conductive protrusions 216, and heat generated by the circuit element is dissipated and exhausted through the first thermal conductive path to a substrate-side electrode 312 among the substrate-side electrodes 312 and the module board 310. A second thermal conductive path is a thermal conductive path from the second member 210 in the direction toward the first member 110, and heat generated by the circuit element is dissipated and exhausted through the second thermal conductive path.

Figure 4:
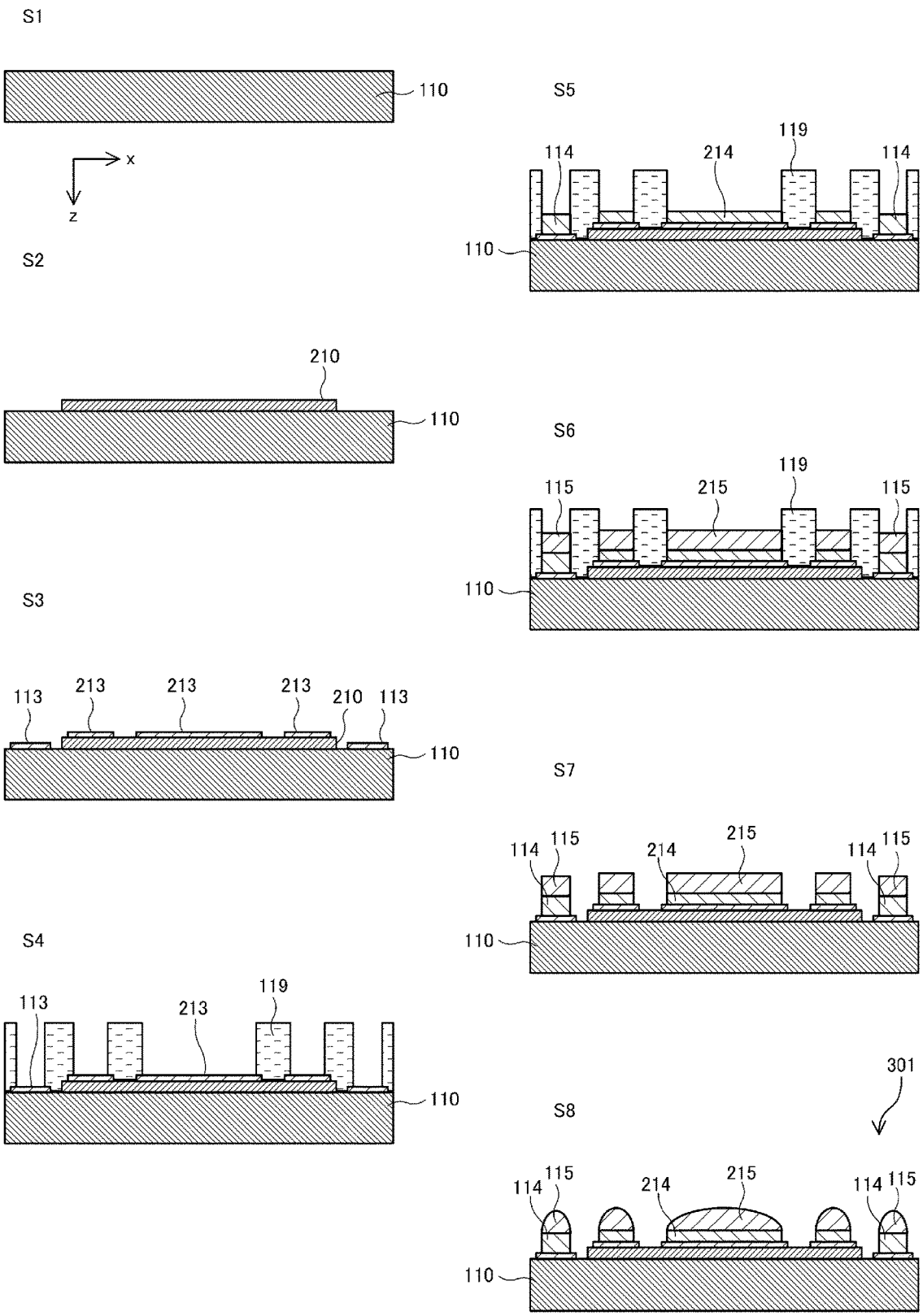
FIG. 4 is a diagram illustrating a method for manufacturing a PA circuit element.

FIG. 4 is a diagram illustrating a method for manufacturing the PA circuit element 301. Steps S1 to S7 in FIG. 4 correspond to cross-sectional views during the manufacture of the PA circuit element 301, and step S8 corresponds to a cross-sectional view of the PA circuit element 301 that is completed. Actual manufacture is performed in units of wafer; however, FIG. 4 illustrates manufacturing of a single semiconductor device.

As illustrated in FIG. 4, first, the first member 110 is arranged. In the first member 110, for example, a circuit element and an electrode are already formed in another process. A junction layer may be formed on the surface of the first member 110 as appropriate using a general semiconductor process. This junction layer is a metal film such as an Au film, a polyimide (PI) film, an organic material film using for example polybenzoxazole (PBO) or benzocyclobutene (BCB), or an insulator using for example AlN, SiC, or diamond (step S1).

Next, the second member 210 is joined onto the first member 110. In the second member 210, a circuit element and an electrode are already formed in another process to be described later (step S2).

Next, through a general semiconductor process, second-member-side electrodes 213 are formed on the second member 210, and first-member-side electrodes 113 are formed on the first member 110. Moreover, a member-member connection conductor (not illustrated) that electrically connects the first member 110 to the second member 210 is formed. Note that, if there is no problem with the manufacturing process, the second-member-side electrodes 213, the first-member-side electrodes 113, and the member-member connection conductor may be simultaneously formed (step S3).

Next, a resist film 119 is formed so as to have openings in a region where first conductive protrusions 116 and second conductive protrusions 216 (see FIGS. 2A and 2B) are to be formed. From each opening of the resist film 119, one of the first-member-side electrodes 113 or one of the second-member-side electrodes 213 is exposed (step S4).

Next, using plating, the conductive pillars 114 are deposited on the first-member-side electrodes 113, and the conductive pillars 214 are deposited on the second-member-side electrodes 213, the first-member-side electrodes 113 and the second-member-side electrodes 213 being exposed in the openings of the resist film 119. The conductive pillars 114 and 214 are formed of, for example, Cu. The conductive pillars 114 and 214 have, for example, a thickness of 40 µm (step S5).

Next, using plating, the solder layers 115 are deposited on the conductive pillars 114, and the solder layers 215 are deposited on the conductive pillars 214, the conductive pillars 114 and 214 being deposited in the openings of the resist film 119. The solder layers 115 and 215 are formed of, for example, a SnAg alloy. The solder layers 115 and 215 have, for example, a thickness of 30 µm. In this manner, the first conductive protrusions 116 and the second conductive protrusions 216 are formed (step S6).

Next, the resist film 119 is removed, and lastly the solder layers 115 and 215 are melted by reflow processing and thereafter are solidified (step S7). As a result, the PA circuit element 301 is completed (step S8).

As for the first conductive protrusions 116, a structure obtained by forming a conductive pillar 114 using Cu in step S5 and placing a solder layer 115 on the conductive pillar 114 in step S6 is called "copper pillar bump (CPB)". Note that, as the first conductive protrusions 116, a structure may be used in which solder is not placed on a top surface like Au bumps. Protrusions having such a structure are also called "pillar". Alternatively, as the first conductive protrusions 116, a structure may also be used in which conductive pillars are erected on a pad. Conductive protrusions having such a structure are also called "post". Alternatively, as the first conductive protrusions 116, ball bumps may also be used that are obtained by reflowing solder so as to have a ball shape. In addition to these various types of structure, various structures including conductors projecting from a substrate can also be used as conductive protrusions. The second conductive protrusions 216 may have substantially the same structure as the first conductive protrusions 116.

Figure 5:
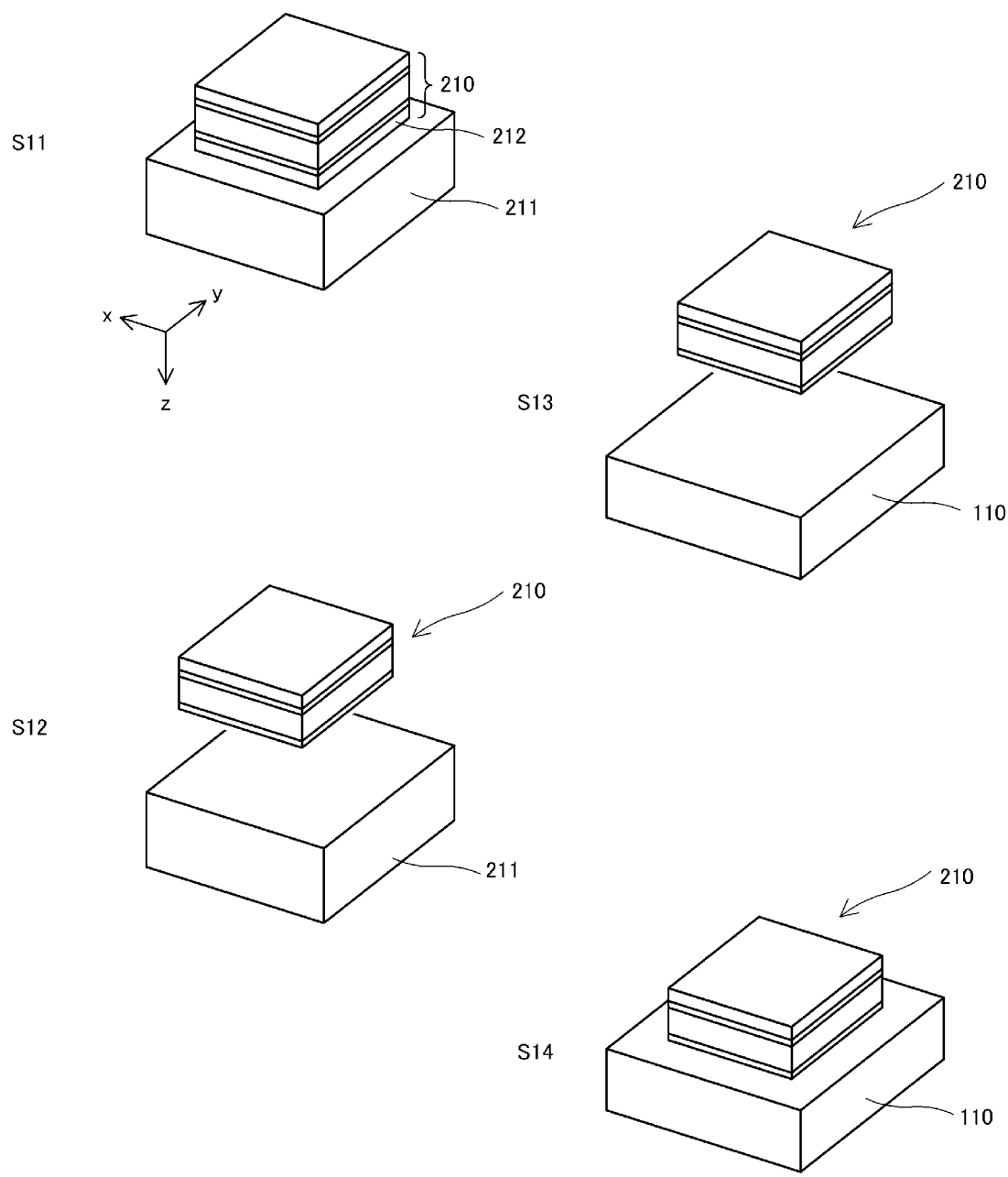
FIG. 5 is a diagram for describing a method for manufacturing the second member and a method for joining the second member to a first member.

FIG. 5 is a diagram for describing a method for manufacturing the second member 210 and a method for joining the second member 210 to the first member 110. FIG. 5 illustrates perspective views corresponding to respective processing steps. Actual manufacture is performed in units of wafer; however, FIG. 5 illustrates the processing steps for a single semiconductor device.

As illustrated in FIG. 5, first, a release layer 212 is formed on a mother substrate 211, which is a compound semiconductor member, and a semiconductor thin film is formed on a surface of the release layer 212 on the −z axis side by using an epitaxial growth method. A plurality of circuit elements and electrodes to be connected to the circuit elements are formed in or on the semiconductor thin film. This portion will be the second member 210 (step S11).

Next, by performing processing in which only the release layer 212 is selectively etched, the second member 210 (a semiconductor thin film piece) is detached from the mother substrate 211 (step S12).

Next, the second member 210 is joined to the first member 110 (bonding). That is, the semiconductor thin film piece is transferred, namely moved, from the mother substrate 211 onto the first member 110 and is fixed. In the present embodiment, the first member 110 and the second member 210 are bonded together with a van der Waals bond or a hydrogen bond (step S13).

Note that the first member 110 and the second member 210 may be joined to each other with, for example, electrostatic force, a covalent bond, or a eutectic alloy bond. The first member 110 and the second member 210 may be joined to each other using eutectic properties obtained by using an Au film. Specifically, in another process, an Au film serving as a junction layer is formed on the first member 110. The second member 210 is pressed against and brought into close contact with the surface of the junction layer to diffuse Au of the junction layer into the GaAs layer of the second member, so that Au and GaAs become eutectic. As a result, the first member 110 and the second member 210 are joined to each other.

For the second member 210, the circuit elements and electrodes are formed not only in the stage illustrated in step S11 and may be formed by performing a process on the second member 210 (a photolithography etching process) after the second member 210 is joined to the first member 110 as illustrated in step S14.

Hereinafter, a wiring line formed after joining the second member 210 and the first member 110 to each other may be referred to as a redistribution line. Examples of a redistribution line include a redistribution line that electrically connects the first circuit of the first member 110 and the second circuit of the second member 210 to each other without using the module board 310. A form of the member-member connection conductor is such a redistribution line.

As a method for releasing and transferring the above semiconductor thin film piece, for example, the following method can be applied. That is, in step S11 in FIG. 5, a support is bonded to a surface of the formed second member 210 on the −z axis side. When the second member 210 (the semiconductor thin film piece) is released from the mother substrate 211 as illustrated in step S12 in FIG. 5, the second member 210 is released from the mother substrate 211 with the support supporting the second member 210. As illustrated in step S13 in FIG. 5, the second member 210 is joined to the first member 110 with the support supporting the second member 210. After the second member 210 is joined to the first member 110, the support is released from the second member 210. In steps S11 to S13 in FIG. 5, to clearly illustrate the second member 210, illustration of the support is omitted.

The RF circuit module 300 configured in this manner and according to the present embodiment has the following effects.

(a) The first member 110 is mounted (face down) on the module board 310 by flip chip bonding, and thus a space for arranging pads and wires for wire bonding is unnecessary, so that the entire size of the RF circuit module 300 can be reduced.

(b) The first member 110 has the first conductive protrusions 116 connected to the substrate-side electrodes 311 of the module board 310, and the second member 210 has the second conductive protrusions 216 connected to the substrate-side electrodes 312 of the module board 310, so that each of the first circuit formed in the first member 110 and the second circuit formed in the second member 210 is electrically connected to the module board 310. Moreover, the first circuit and the second circuit are electrically connected to each other by the member-member connection conductor without using the module board 310, and thus a wiring line for connecting the first circuit and the second circuit to each other does not have to be formed in or on the module board 310. As a result, the entire size of the RF circuit module 300 can be reduced.

(c) Heat generated by the amplifier and other devices included in the second circuit formed in the second member 210 can be dissipated and exhausted highly efficiently, and thus there can be realized the RF circuit module 300 that is miniaturized without constraints based on heat dissipation characteristics or the RF circuit module 300 that is miniaturized but has high heat dissipation characteristics.

[Power Amplification Circuit]

A power amplification circuit according to the first embodiment will be described.

Figure 6:
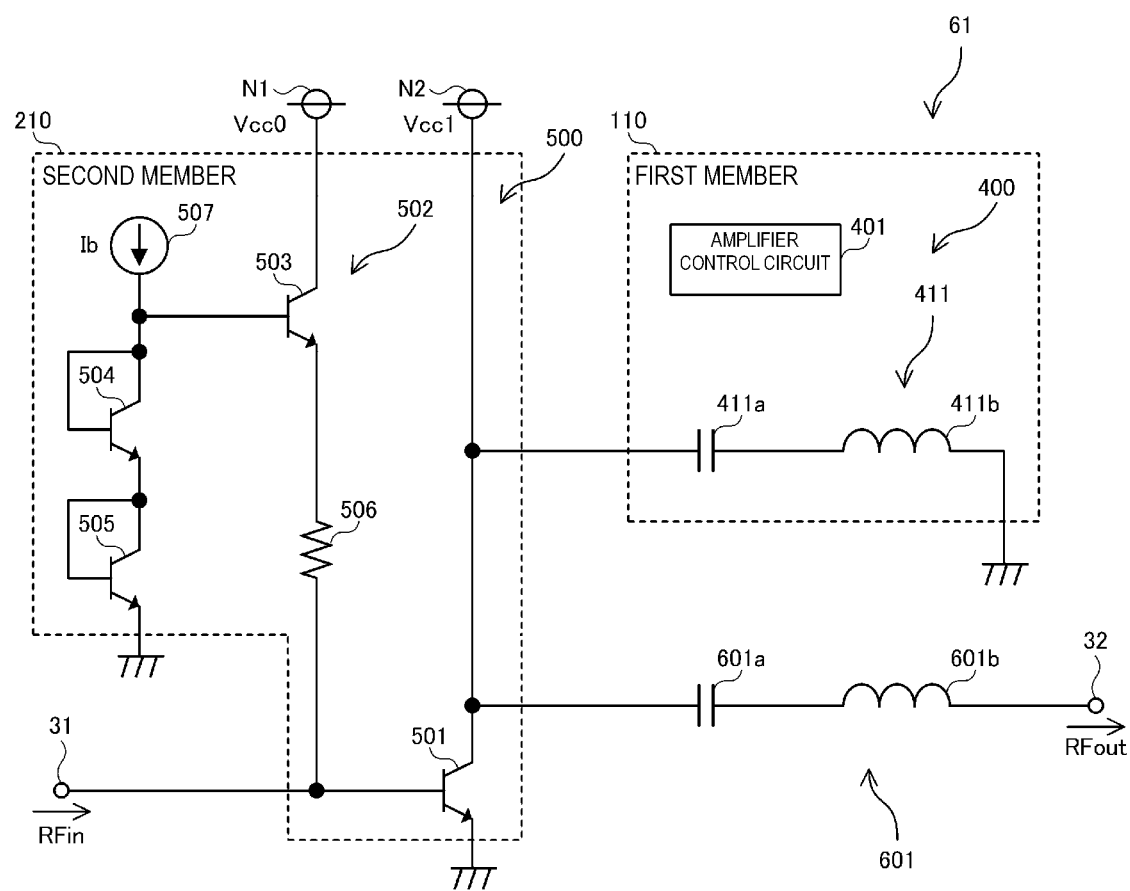
FIG. 6 is a circuit diagram of a power amplification circuit.

FIG. 6 is a circuit diagram of a power amplification circuit 61. As illustrated in FIG. 6, the power amplification circuit 61 includes a first circuit 400, a second circuit 500, and a matching circuit 601 (first matching circuit). The first circuit 400 includes an amplifier control circuit 401 and a termination circuit 411 (first termination circuit). The second circuit 500 includes an amplifier 501 (first amplifier) and a bias circuit 502. The bias circuit 502 includes a bias transistor 503, transistors 504 and 505, a resistance element 506, and a current source 507.

The power amplification circuit 61 is a circuit that amplifies an input signal RFin (an RF signal) input from an input terminal 31 and outputs an output signal RFout from an output terminal 32.

In the present embodiment, description will be made by assuming that the amplifier 501, the bias transistor 503, and the transistors 504 and 505 are constituted by, for example, a bipolar transistor such as an HBT. Note that each of the amplifier 501, the bias transistor 503, and the transistors 504 and 505 may be constituted by another transistor such as a field-effect transistor (a metal-oxide-semiconductor field-effect transistor (MOSFET)). In that case, it is sufficient that base, collector, and emitter be read as gate, drain, and source, respectively, instead.

The amplifier 501 has a base, a collector, and an emitter. The base is connected to the input terminal 31. The collector is connected to a power-supply voltage supply node N2 for supplying a power supply voltage Vcc1, and is connected to the output terminal 32 through the matching circuit 601. The emitter is grounded. The amplifier 501 amplifies the input signal RFin, which is supplied through the input terminal 31, and outputs the resulting amplified signal (first amplified signal).

The bias circuit 502 biases the base of the amplifier 501 using the bias transistor 503, which is connected as an emitter follower to the base of the amplifier 501. Specifically, the bias transistor 503 has a collector, a base, and an emitter. The collector is connected to a power-supply voltage supply node N1 for supplying a power supply voltage Vcc0. The emitter is connected to the base of the amplifier 501 through the resistance element 506.

The transistors 504 and 505 and the current source 507 supplies a bias having a predetermined level of voltage to the base of the bias transistor 503. Specifically, the current source 507 is connected to the base of the bias transistor 503. The transistor 504 has a collector, a base, and an emitter. The collector is connected to the current source 507 and the base of the bias transistor 503. The base is connected to the collector. Hereinafter, connection between the collector of a transistor and the base of the transistor may also be referred to as diode connection. The transistor 505 is a diode-connected transistor and has a collector, which is connected to the emitter of the transistor 504, and an emitter, which is grounded. Since each of the transistors 504 and 505 functions as a diode, a voltage drop corresponding to two diodes occurs in the collector-emitter path of the transistor 504 and the collector-emitter path of the transistor 505. That is, the collector voltage and base voltage of the transistor 504 with respect to ground is a voltage at a level corresponding to the voltage drop across two diodes. This voltage is supplied to the base of the bias transistor 503.

The amplifier control circuit 401 controls an amplification operation of the second circuit 500. In the present embodiment, the amplifier control circuit 401 controls the power supply voltage Vcc1, which is applied to the collector of the amplifier 501. Moreover, the amplifier control circuit 401 controls the power supply voltage Vcc0, which is applied to the collector of the bias transistor 503, and a current Ib, which is output by the current source 507. As a result, the level of a bias to be supplied to the base of the amplifier 501 is controlled.

The termination circuit 411 attenuates a harmonic wave component corresponding to an integral multiple (for example, two times or more) of the fundamental frequency of the output signal RFout. In the present embodiment, the termination circuit 411 is a series LC circuit having a capacitor 411a and an inductor 411b (first inductor). The capacitor 411a has a first end and a second end, the first end being connected to the collector of the amplifier 501. The inductor 411b has a first end and a second end. The first end is connected to the second end of the capacitor 411a, and the second end is grounded.

The matching circuit 601 adjusts, regarding the fundamental wave of the output signal RFout, an impedance when the circuits after the amplifier 501 are viewed from the amplifier 501. In other words, the matching circuit 601 is provided between the amplifier 501 and the circuits after the amplifier 501, and achieves impedance matching between the amplifier 501 and the circuits after the amplifier 501. In the present embodiment, the matching circuit 601 is provided between the collector of the amplifier 501 and the output terminal 32, and is a series LC circuit having a capacitor 601a and an inductor 601b. The capacitor 601a has a first end and a second end, the first end being connected to the collector of the amplifier 501. The inductor 601b has a first end and a second end. The first end is connected to the second end of the capacitor 601a, and the second end is connected to the output terminal 32.

Figure 7:
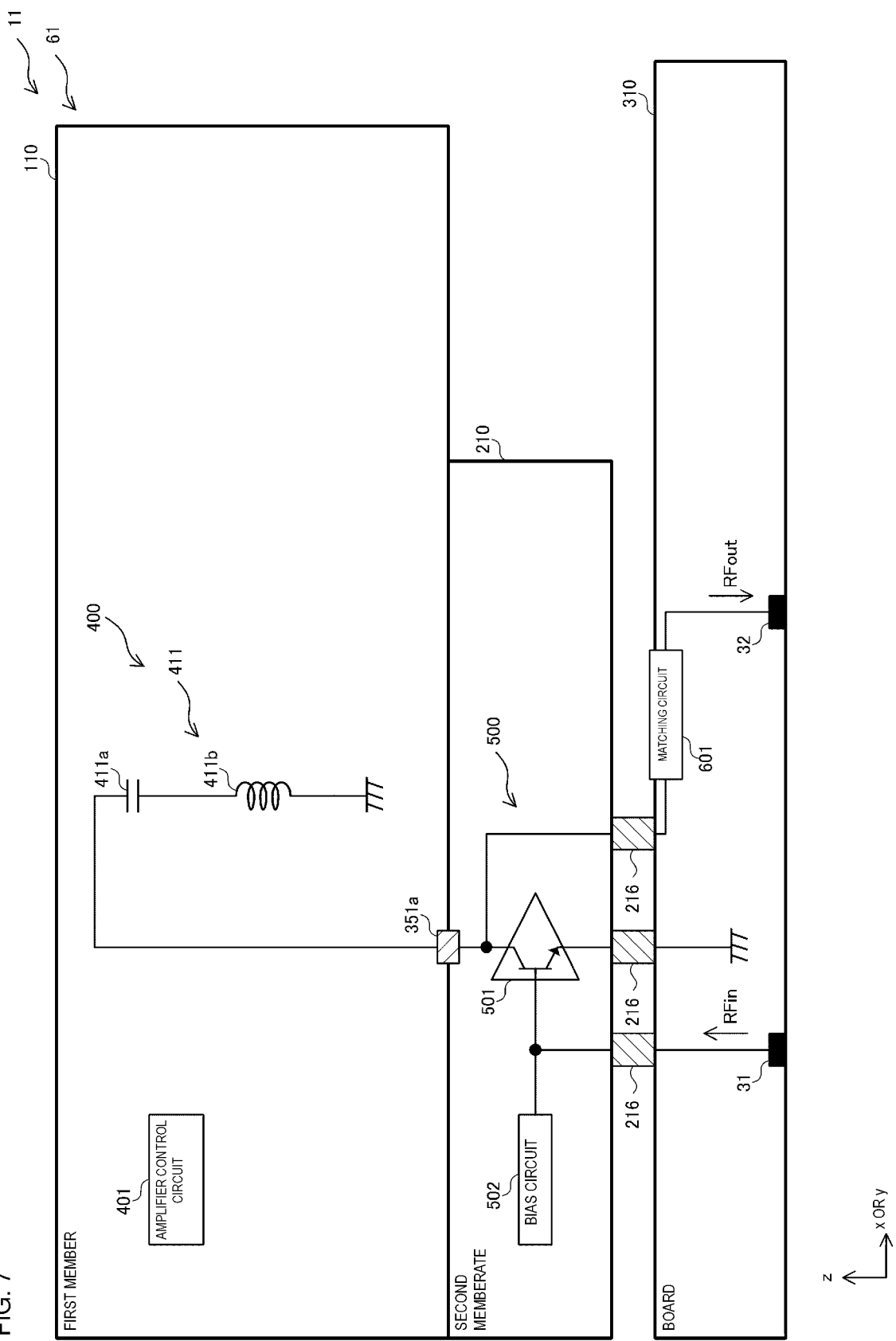
FIG. 7 is a diagram for describing arrangement of the power amplification circuit in a power amplification device.

FIG. 7 is a diagram for describing arrangement of the power amplification circuit 61 in the power amplification device 11. FIG. 7 schematically illustrates the arrangement of the power amplification circuit 61 in a cross section of the power amplification device 11.

As illustrated in FIG. 7, the amplifier control circuit 401 and the termination circuit 411 are provided in the first member 110. The amplifier 501 and the bias circuit 502 are provided in the second member 210. The input terminal 31, the output terminal 32, and the matching circuit 601 are provided in, for example, the module board 310.

The termination circuit 411 is connected to the collector of the amplifier 501 through a member-member connection conductor 351a. The member-member connection conductor 351a is a form of the member-member connection conductor. The base of the amplifier 501 is connected to the bias circuit 502 and is also connected to the input terminal 31 through a second conductive protrusion 216 among the second conductive protrusions 216. The emitter of the amplifier 501 is grounded on the module board 310 through a second conductive protrusion 216 among the second conductive protrusions 216. The collector of the amplifier 501 is connected to the output terminal 32 through a second conductive protrusion 216 among the second conductive protrusions 216 and the matching circuit 601.

Note that the configuration in which the power amplification circuit 61 includes one amplifier 501 has been described; however, the configuration is not limited thereto. The power amplification circuit 61 may have a configuration that includes a plurality of amplifiers 501. Specifically, for example, a first-stage amplifier may be provided between the input terminal 31 and the amplifier 501.

[Layout]

Figure 8:
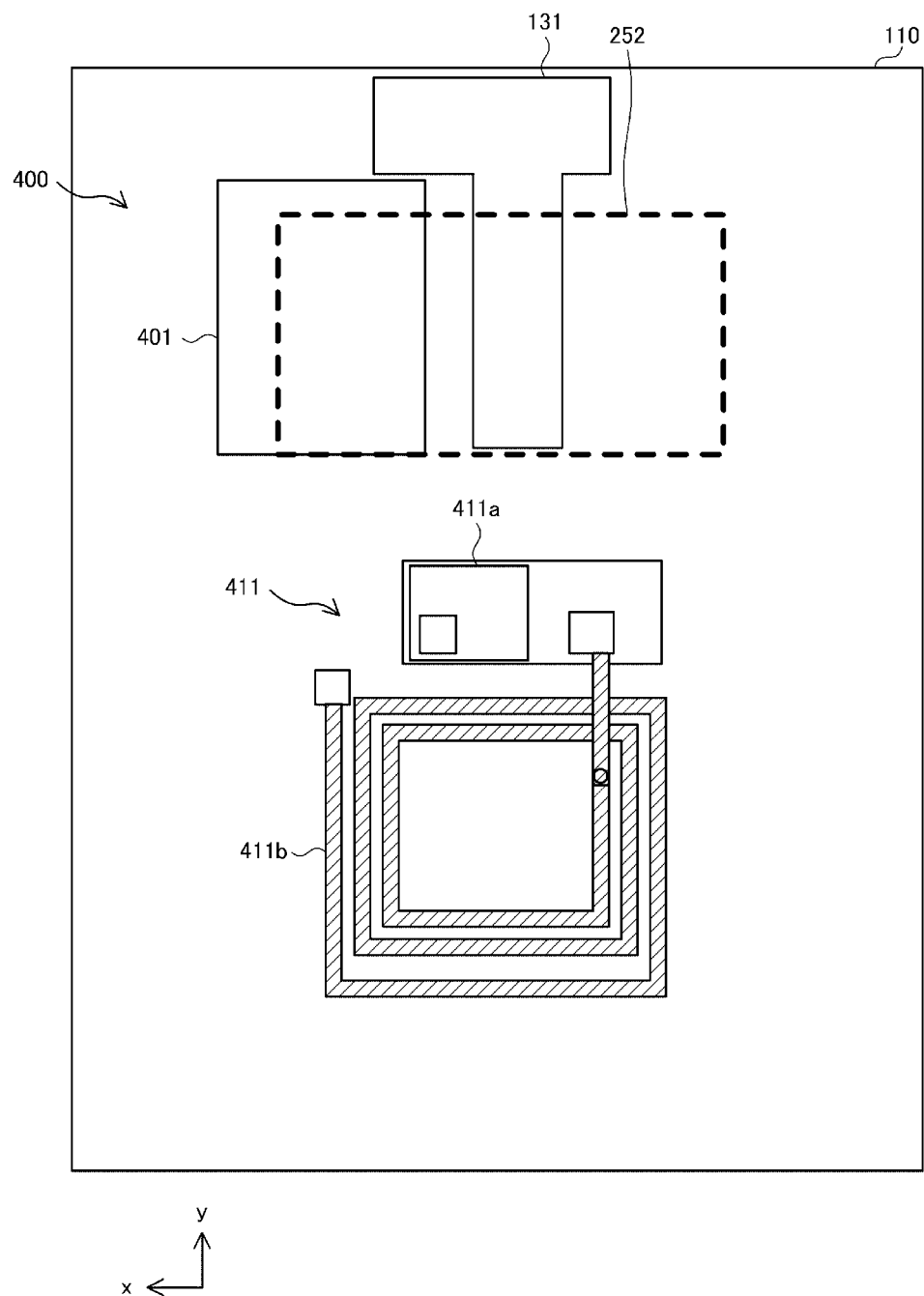
FIG. 8 is a diagram illustrating an example of the layout of a first circuit in the first member.
Figure 9:
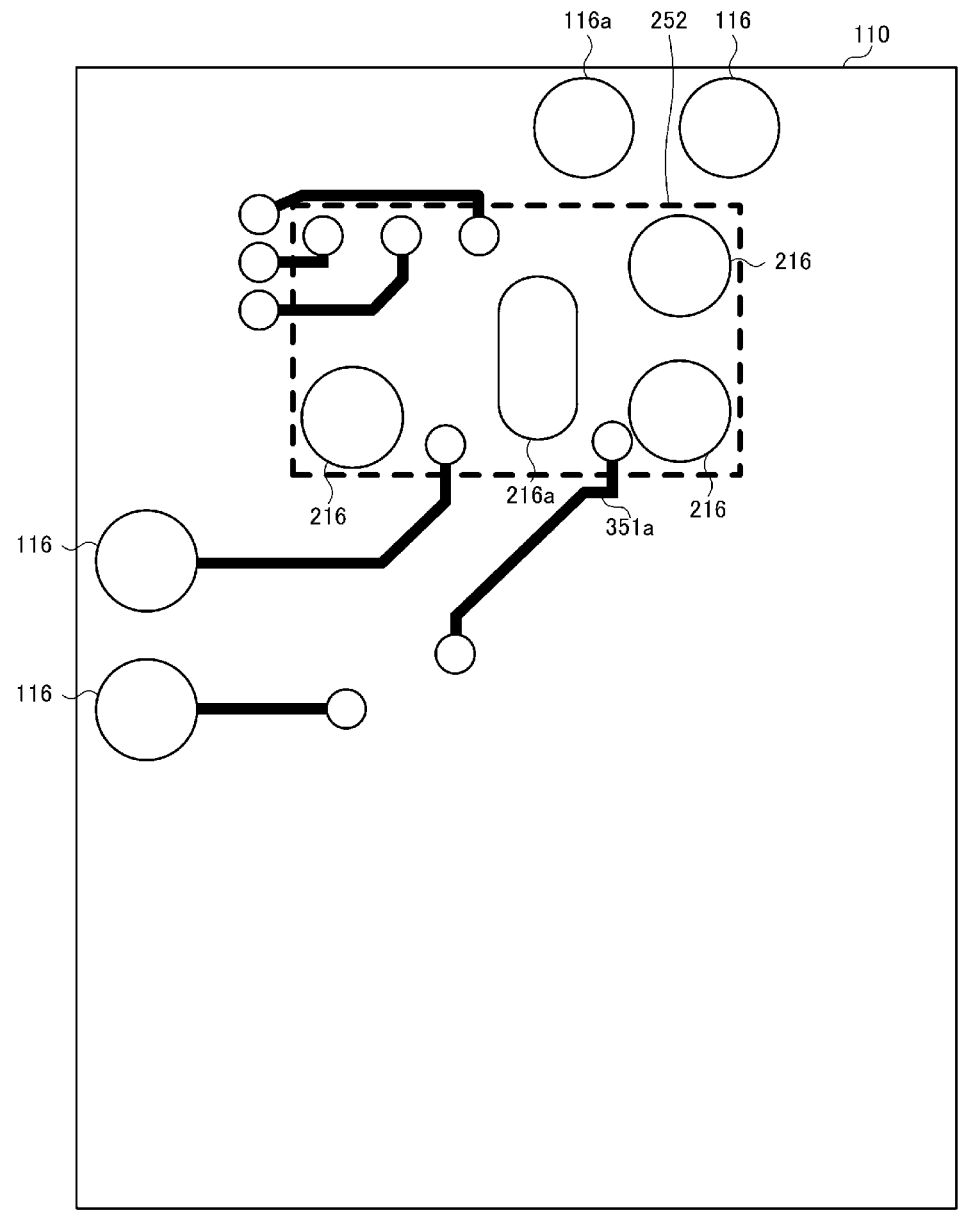
FIG. 9 is a diagram illustrating an example of the layout of electrodes provided on the −z axis side of the first member and the second member.
Figure 10:
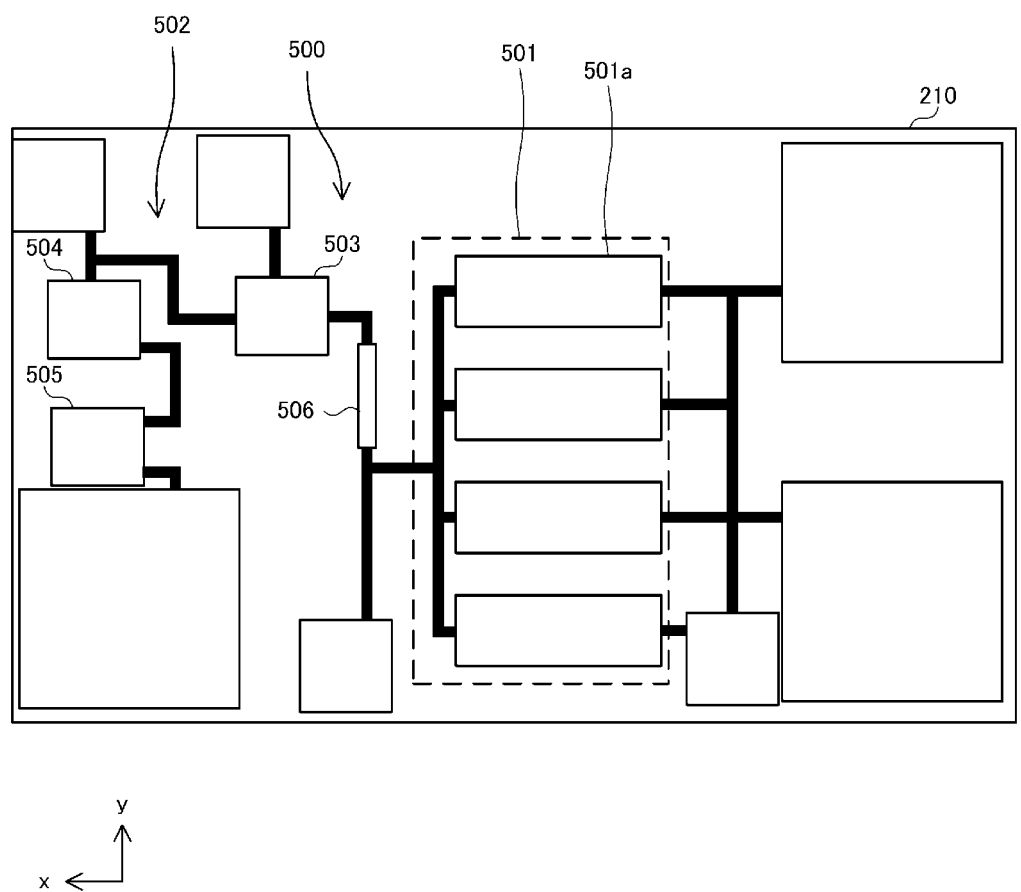
FIG. 10 is a diagram illustrating an example of the layout of a second circuit in the second member.
Figure 11:
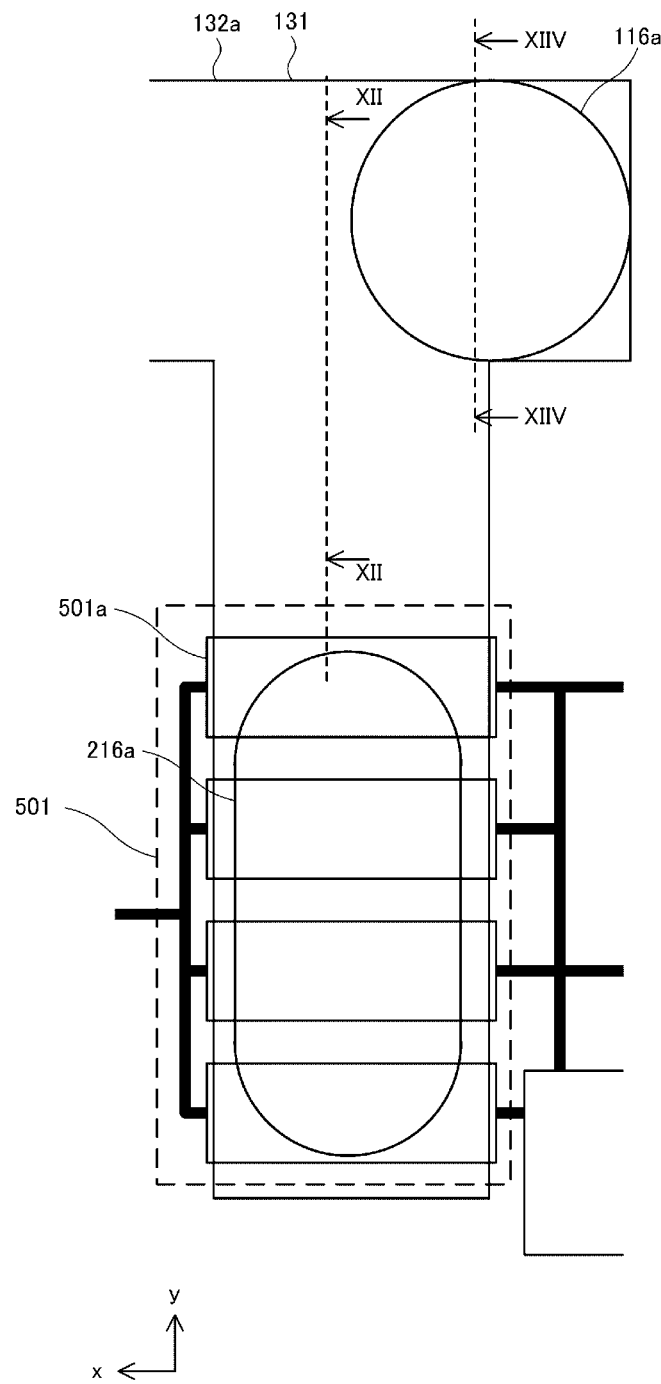
FIG. 11 is an enlarged view of an area including an amplifier and a heat spreader.

The layout of a power amplification device according to the first embodiment will be described. FIG. 8 is a diagram illustrating an example of the layout of the first circuit 400 in the first member 110. FIG. 9 is a diagram illustrating an example of the layout of electrodes provided on the −z axis side of the first member 110 and the second member 210. FIG. 10 is a diagram illustrating an example of the layout of the second circuit 500 in the second member 210. FIG. 11 is an enlarged view of an area including the amplifier 501 and a heat spreader 131. FIGS. 8 to 11 are plan views when, for example, the first member 110 or the second member 210 is viewed in a plan view from the −z axis side.

As illustrated in FIGS. 8 to 11, the capacitor 411a included in the termination circuit 411 of the first circuit 400 is provided in the vicinity of the center of the first member 110 (see FIG. 8). The inductor 411b is provided on the −y axis side of the capacitor 411a.

On the +y axis side of the capacitor 411a, a substantially rectangular region 252, to which the second member 210 is joined, is positioned (see FIG. 8). On the +y axis side of and the +x axis side of the capacitor 411a, the amplifier control circuit 401 is provided so as to partially overlap the region 252. On the −x axis side of the amplifier control circuit 401, the heat spreader 131 is provided. Details of the heat spreader 131 will be described below. The amplifier 501 is provided so as to overlap a portion of the heat spreader 131 when the first member 110 is viewed in a plan view from the −z axis side (see FIG. 11).

A plurality of first conductive protrusions 116 are provided inside the edge of the first member 110 (see FIG. 9). Note that the first member 110 may have a configuration in which one first conductive protrusion 116 is provided. A plurality of second conductive protrusions 216 are provided inside the region 252. A second conductive protrusion 216a among the plurality of second conductive protrusions 216 is provided so as to overlap the amplifier 501 when the first member 110 is viewed in a plan view from the −z axis side (see FIG. 11). The member-member connection conductor 351a connects the collector of the amplifier 501 and the first end of the capacitor 411a to each other. Note that the second member 210 may have a configuration in which one second conductive protrusion 216 is provided.

On the +x axis side of the second member 210, the bias circuit 502 of the second circuit 500 is provided (see FIG. 10). The amplifier 501 is provided on the −x axis side of the bias circuit 502.

Specifically, the transistors 504 and 505 are provided near the edge of the second member 210 on the +x axis side. On the −x axis side of the transistors 504 and 505, the bias transistor 503 is provided. On the −x axis side of and the −y axis side of the bias transistor 503, the resistance element 506 is provided so as to extend toward the −y axis side.

On the −x axis side of the resistance element 506, the amplifier 501 is formed. The amplifier 501 includes a plurality of transistor devices arranged in the y axis direction. In this case, the transistor device positioned furthermost toward the +y axis side may be referred to as transistor device 501a.

Figure 12:
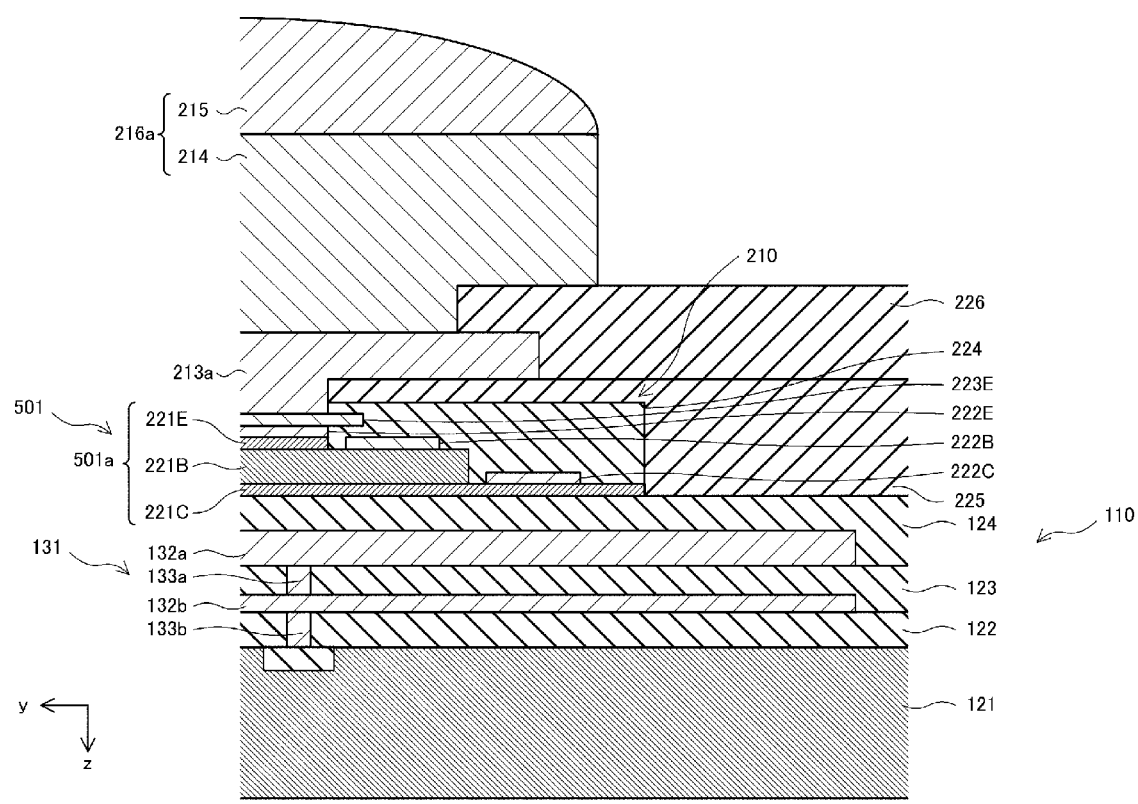
FIG. 12 is a cross-sectional view taken along line XII-XII illustrated in FIG. 11.

FIG. 12 is a cross-sectional view taken along line XII-XII illustrated in FIG. 11. As illustrated in FIGS. 11 and 12, the first member 110 includes a Si substrate 121, a first insulating film 122, a second insulating film 123, and a third insulating film 124, which are stacked in order toward the −z axis side.

The amplifier 501 is formed in the second member 210. On the −z axis side of the amplifier 501, an interlayer insulating film 224 is provided. Specifically, a transistor device included in the amplifier 501 (for example, the transistor device 501a) includes a collector layer 221C, a base layer 221B, and an emitter layer 221E, which are stacked in order from the substrate 121 side.

More specifically, the collector layer 221C is joined to a surface of the first member 110 on the −z axis side. On the −z axis side of the collector layer 221C, the base layer 221B and a collector electrode 222C, which is connected to the collector layer 221C, are provided. On the −z axis side of the base layer 221B, the emitter layer 221E and a base electrode 222B, which is connected to the base layer 221B, are provided. On the −z axis side of the emitter layer 221E, an emitter electrode 222E is provided, which is connected to the emitter layer 221E. On the −z axis side of the emitter electrode 222E, for example, an emitter wiring line 223E is provided, which electrically connects the emitter electrodes 222E of the respective transistor devices aligned in the y axis direction to each other.

The collector layer 221C, the base layer 221B, and the emitter layer 221E are formed by for example n-type GaAs, p-type GaAs, and n-type InGaP, respectively. Note that these semiconductor layers may be formed by other compound semiconductors such as, for example, InP, GaN, SiGe, or SiC.

On a surface of the third insulating film 124 on the −z axis side, a first insulating film 225 is provided so as to cover the interlayer insulating film 224. An opening is provided in the interlayer insulating film 224 and the first insulating film 225 so as to communicate with the emitter wiring line 223E from the −z axis side. An emitter pad 213a is electrically connected to the emitter wiring line 223E through the opening. The emitter pad 213a projects from the first insulating film 225 toward the −z axis side. The emitter pad 213a is a form of the second-member-side electrode 213 and is also a portion of the redistribution line.

On a surface of the first insulating film 225 on the −z axis side, a second insulating film 226 is provided. An opening is provided in the second insulating film 226 so as to communicate with the emitter pad 213a from the −z axis side. A second conductive protrusion 216a is connected to the emitter pad 213a through the opening. The second conductive protrusion 216a projects from the second insulating film 226 toward the −z axis side.

In the first member 110, the heat spreader 131 is provided on the +z axis side of the amplifier 501. The heat spreader 131 is formed by stacking conductor layers and insulator layers. Specifically, the heat spreader 131 includes first member electrodes 132a and 132b, which extend substantially parallel to the xy plane, and rod-shaped first member vias 133a and 133b, which extend in the z axis direction. The first member electrode 132a is formed on a surface of the second insulating film 123 on the −z axis side. The first member electrode 132b is formed on a surface of the first insulating film 122 on the −z axis side. The first member via 133a connects the first member electrode 132a and the first member electrode 132b to each other. The first member via 133b projects from the first member electrode 132b toward the +z axis side.

Heat generated by the amplifier 501 is released to the module board 310 (not illustrated in FIG. 12) through the emitter electrode 222E, the emitter wiring line 223E, the emitter pad 213a, and the second conductive protrusion 216a and also to the substrate 121 through the third insulating film 124 and the heat spreader 131. Since the substrate 121 is formed of Si, which is high in thermal conductivity, heat from the amplifier 501 is favorably released from the first member 110.

Figure 13:
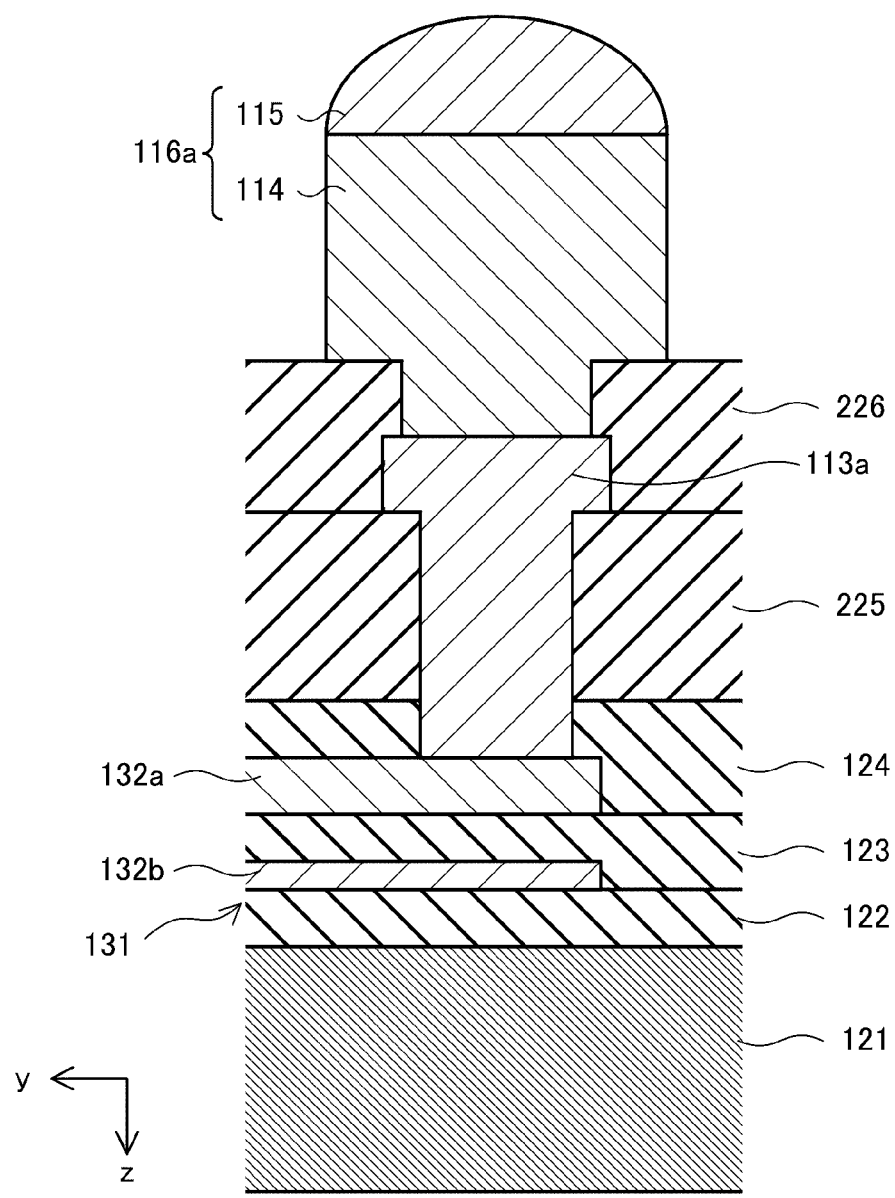
FIG. 13 is a cross-sectional view taken along line XIIV-XIIV illustrated in FIG. 11.

FIG. 13 is a cross-sectional view taken along line XIIV-XIIV illustrated in FIG. 11. As illustrated in FIGS. 11 and 13, a first conductive protrusion 116a is provided on the +y axis side of the amplifier 501. The first conductive protrusion 116a is connected to the first member electrode 132a of the heat spreader 131 through the first-member-side electrode 113a. The first-member-side electrode 113a is a portion of the redistribution line.

Specifically, the first-member-side electrode 113a is connected to the first member electrode 132a of the heat spreader 131 through an opening provided in the first insulating film 225 and the third insulating film 124. The first conductive protrusion 116a is connected to the first-member-side electrode 113a through an opening provided in the second insulating film 226.

Out of heat generated by the amplifier 501, heat transferred to the heat spreader 131 is not only moved to and released from the Si substrate 121 but also moved to and released from the module board 310 (not illustrated in FIG. 13) through the first-member-side electrode 113a and the first conductive protrusion 116a. In this manner, heat generated by the amplifier 501 can be effectively released with a configuration having a path along which heat is efficiently transferred from the heat spreader 131 to the module board 310.

Figure 14:
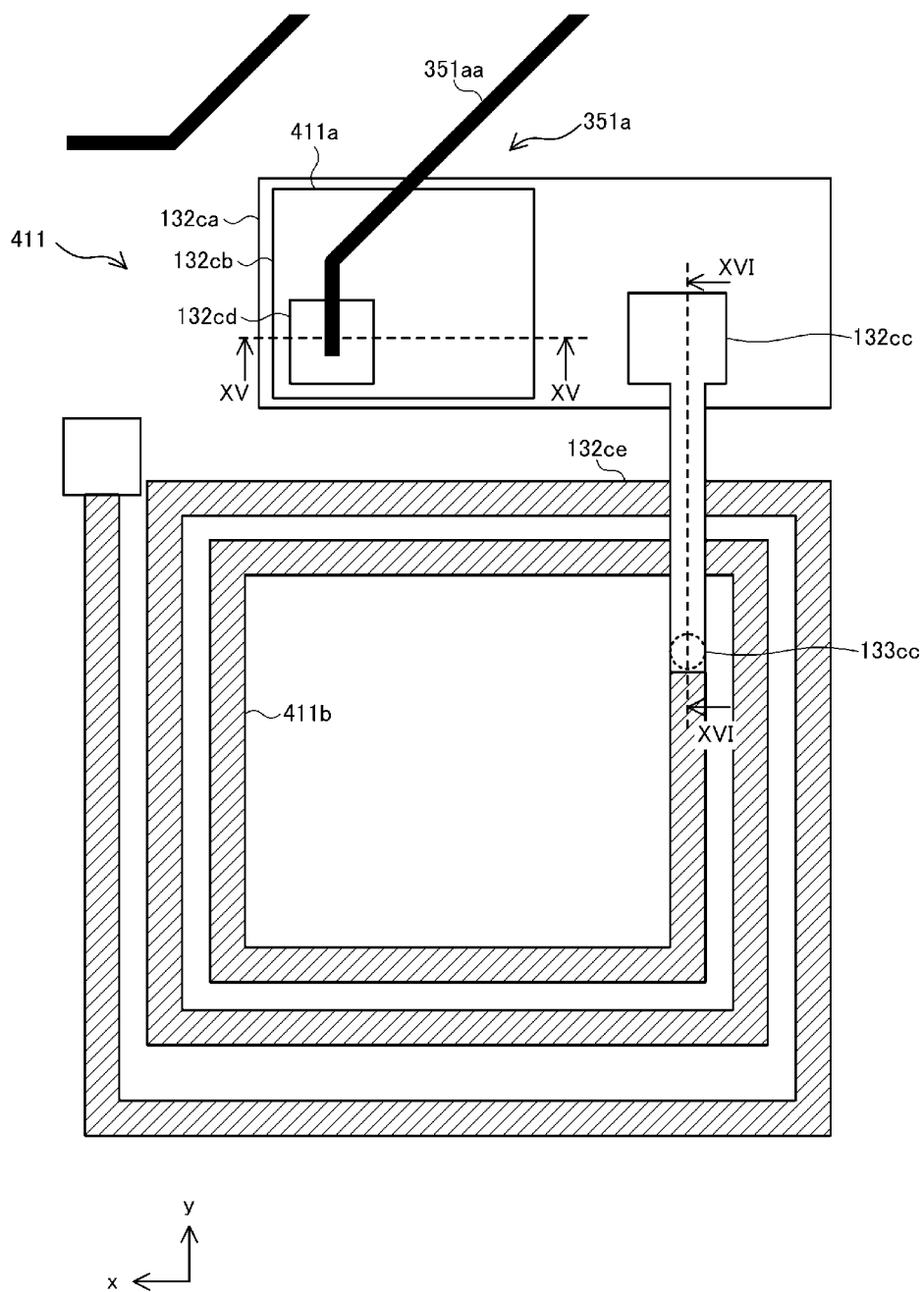
FIG. 14 is an enlarged view of an area including a termination circuit.
Figure 15:
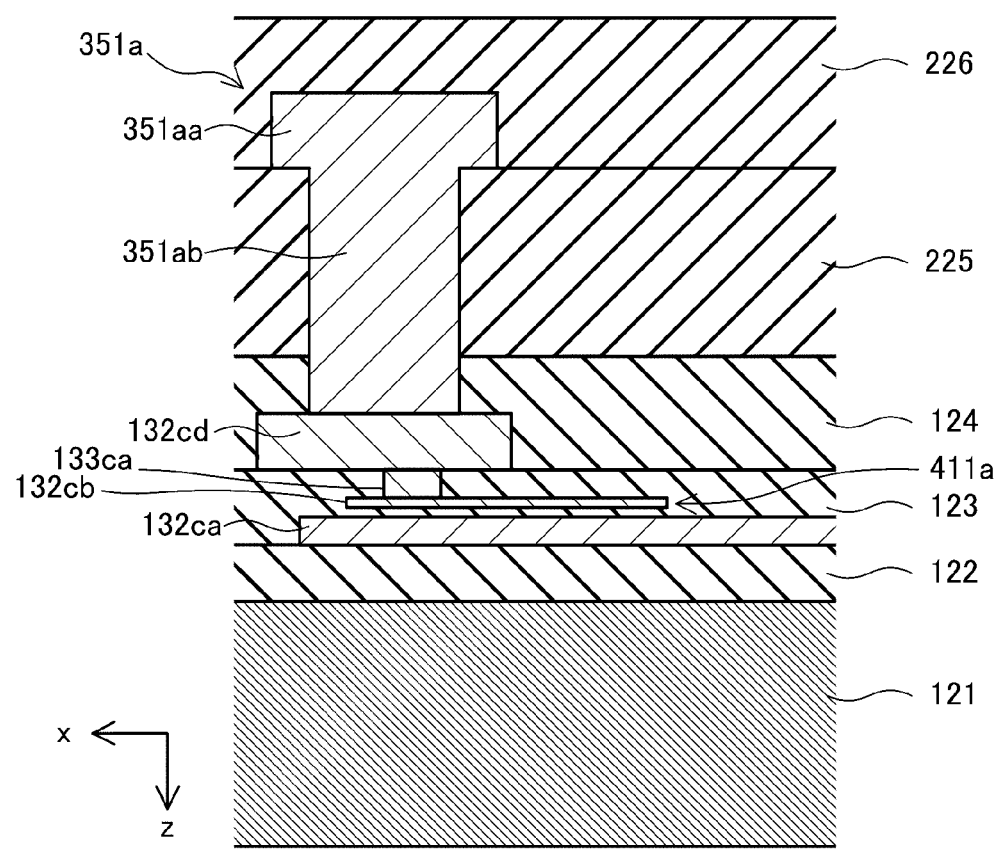
FIG. 15 is a cross-sectional view taken along line XV-XV illustrated in FIG. 14.

FIG. 14 is an enlarged view of an area including the termination circuit 411. FIG. 15 is a cross-sectional view taken along line XV-XV illustrated in FIG. 14. As illustrated in FIGS. 14 and 15, the member-member connection conductor 351a has a redistribution line 351aa and a redistribution line via 351ab and is connected to the capacitor 411a.

Specifically, the capacitor 411a has a metal-insulator-metal (MIM) structure formed by a first member metal wiring line 132ca and a first member electrode 132cb, which extend parallel to the xy plane, and the second insulating film 123, which is filled between the first member metal wiring line 132ca and the first member electrode 132cb.

More specifically, the first member metal wiring line 132ca, which has a rectangular shape when viewed in a plan view from the +z axis side and serves as an electrode of the capacitor 411a on the +z axis side, is formed on the surface of the first insulating film 122 on the −z axis side. On the −z axis side of the first member metal wiring line 132ca, the first member electrode 132cb, which has a rectangular shape when viewed in a plan view from the +z axis side and serves as an electrode of the capacitor 411a on the −z axis side, is formed at a predetermined distance from the first member metal wiring line 132ca. When viewed in a plan view from the +z axis side, the outline of the first member electrode 132cb is positioned inside the outline of the first member metal wiring line 132ca. The second insulating film 123 is filled in a region around the first member metal wiring line 132ca and the first member electrode 132cb.

On the surface of the second insulating film 123 on the −z axis side, a first member electrode 132cd is formed, which has a rectangular shape when viewed in a plan view from the +z axis side. In an opening provided in the second insulating film 123, a first member via 133ca is provided, which connects the first member electrode 132cd and the first member electrode 132cb to each other.

On the surface of the first insulating film 225 on the −z axis side, the redistribution line 351aa included in the member-member connection conductor 351a is provided. In an opening provided in the third insulating film 124 and the first insulating film 225, the redistribution line via 351ab is provided, which connects the redistribution line 351aa and the first member electrode 132cd to each other.

Figure 16:
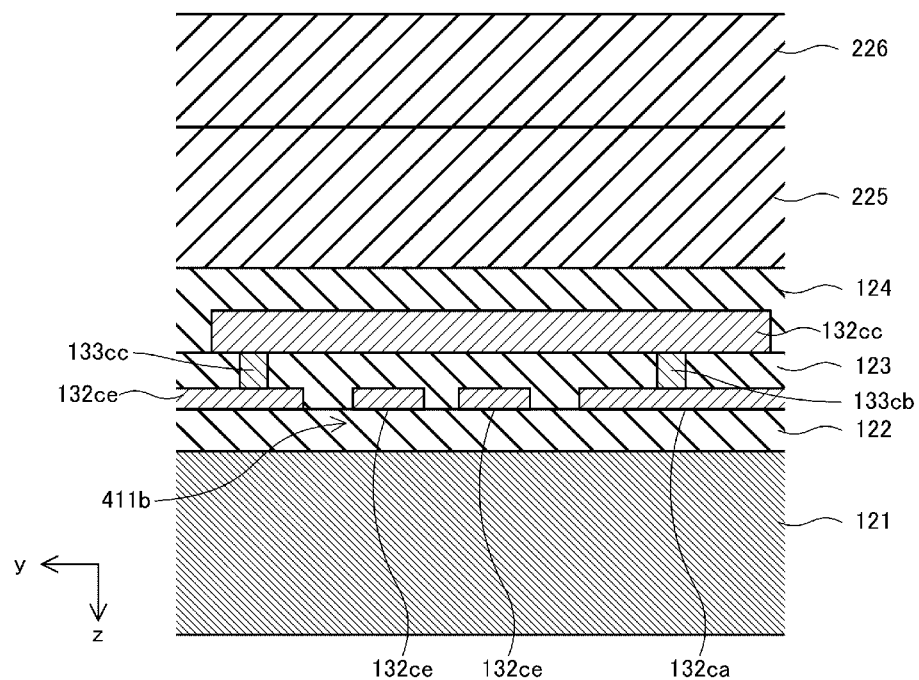
FIG. 16 is a cross-sectional view taken along line XVI-XVI illustrated in FIG. 14.

FIG. 16 is a cross-sectional view taken along line XVI-XVI illustrated in FIG. 14. As illustrated in FIGS. 14 and 16, the inductor 411b is formed by a first member metal wiring line 132ce. Specifically, the first member metal wiring line 132ce is formed on the surface of the first insulating film 122 on the −z axis side so as to be wound within the xy plane.

On the surface of the second insulating film 123 on the −z axis side, a first member metal wiring line 132cc is formed, which extends in the y axis direction when viewed in a plan view from the +z axis side. An opening is provided in the second insulating film 123 so as to communicate with the first member metal wiring line 132ca from the −z axis side. In the opening, a first member via 133cb is provided, which connects the first member metal wiring line 132ca and the first member metal wiring line 132cc to each other.

Another opening is provided in the second insulating film 123 so as to communicate with a region near an end (first end) of the first member metal wiring line 132ce from the −z axis side. In the opening, a first member via 133cc is provided, which connects the end of the first member metal wiring line 132ce and the first member metal wiring line 132cc to each other.

The first member metal wiring line 132ce is provided so as to be wound between the end of the first member metal wiring line 132ce and the first member metal wiring line 132ca.

Second Embodiment

A power amplification device and a power amplification circuit according to a second embodiment will be described. In the second embodiment and subsequent embodiments, description of items common to those of the first embodiment will be omitted, and only different points will be described. In particular, operations and effects due to similar configurations will not be mentioned one by one in each embodiment.

Figure 17:
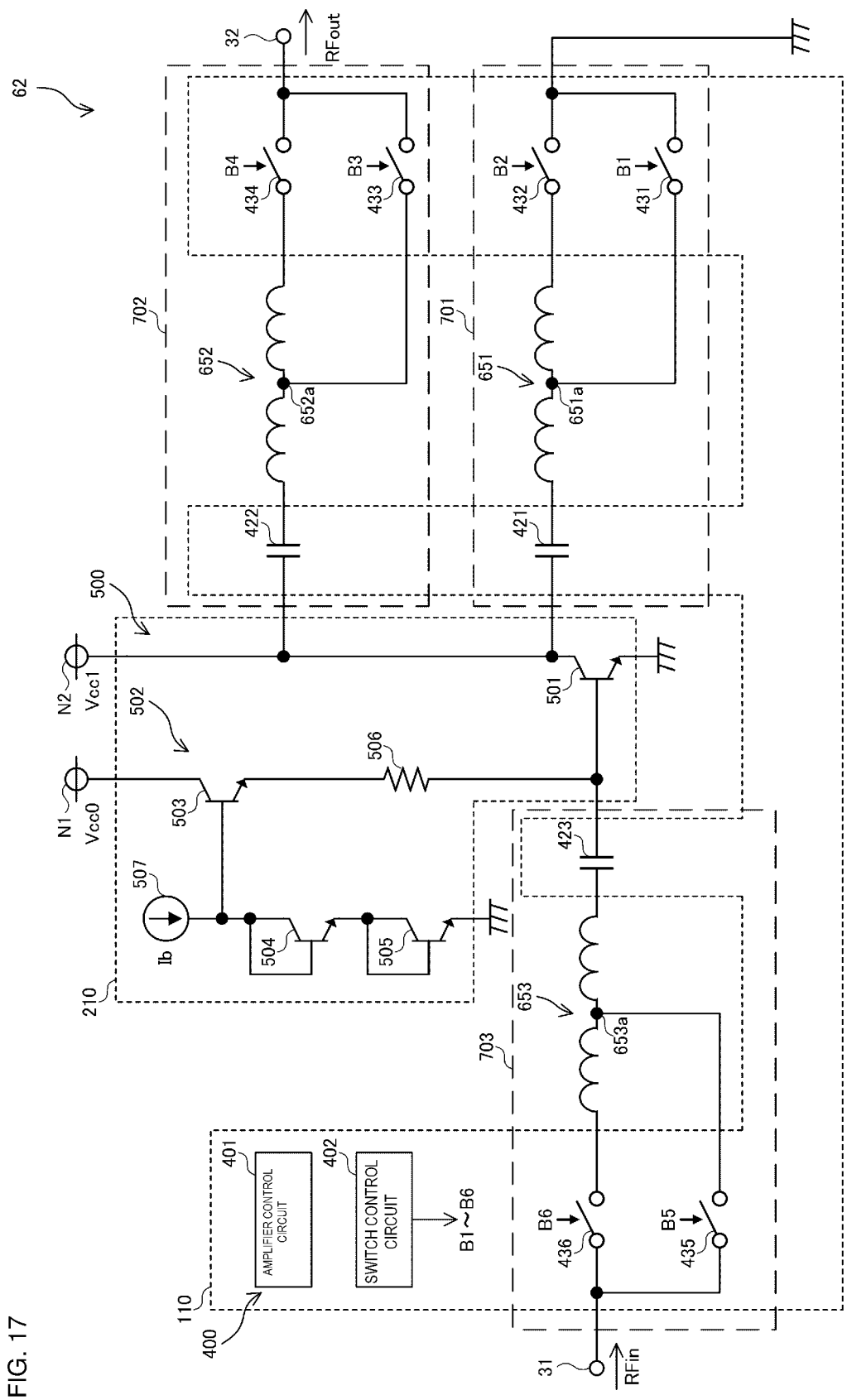
FIG. 17 is a circuit diagram of a power amplification circuit.

FIG. 17 is a circuit diagram of a power amplification circuit 62. As illustrated in FIG. 17, the power amplification circuit 62 according to the second embodiment differs from the power amplification circuit 61 according to the first embodiment in that the power amplification circuit 62 further includes an input-side matching circuit and can change the frequency band of a termination circuit, that of an output-side matching circuit, and that of the input-side matching circuit.

The power amplification circuit 62 includes the first circuit 400, the second circuit 500, an inductor 651 (third inductor), an inductor 652 (fourth inductor), and an inductor 653 (fifth inductor). The first circuit 400 includes the amplifier control circuit 401, a switch control circuit 402, capacitors 421, 422, and 423, and switches 431, 432, 433, 434, 435, and 436. The second circuit 500 includes the amplifier 501 and the bias circuit 502.

The amplifier control circuit 401, the switch control circuit 402, the capacitors 421, 422, and 423, and the switches 431, 432, 433, 434, 435, and 436 are formed in the first member 110. The amplifier 501 and the bias circuit 502 are formed in the second member 210. The inductors 651, 652, and 653 are formed by a redistribution line, and details thereof will be described later. The switches 431, 432, 433, 434, 435, and 436 are, for example, field-effect transistors.

A termination circuit 701 (first termination circuit) includes the capacitor 421, the inductor 651, and the switches 431 and 432. The termination circuit 701 attenuates a harmonic wave component corresponding to an integral multiple (for example, two times or more) of the frequency of the output signal RFout. In the termination circuit 701, the frequency of a harmonic wave component to be attenuated is switched by the switches 431 and 432.

Specifically, the capacitor 421 has a first end and a second end, the first end being connected to the collector of the amplifier 501. The inductor 651 has a first end, a center tap 651a, and a second end, the first end being connected to the second end of the capacitor 421. The switch 431 has a first end and a second end. The first end is connected to the center tap 651a, and the second end is grounded. The switch 432 has a first end and a second end. The first end is connected to the second end of the inductor 651, and the second end is grounded.

The switches 431 and 432 respectively operate on the basis of signals B1 and B2 received from the switch control circuit 402. Specifically, each of the switches 431 and 432 switches between conducting and nonconducting of the first end and the second end thereof. In the present embodiment, the switch 431 and the switch 432 operate exclusively. Specifically, when the switch 431 is off (the first end and the second end are nonconducting), the switch 432 is on (the first end and the second end are conducting), which is called a first state. When the switch 431 is on, the switch 432 is off, which is called a second state.

The resonant frequency of the termination circuit 701 in the first state is lower than that in the second state. The first state is thus appropriate for a case where low frequencies are to be attenuated. In contrast, the second state is appropriate for a case where high frequencies are to be attenuated.

In the present embodiment, the switch control circuit 402 performs control such that, for example, the termination circuit 701 is caused to shift to the first state in a case where the frequency band to which the output signal RFout belongs is low, and the termination circuit 701 is caused to shift to the second state in a case where the frequency band to which the output signal RFout belongs is high. Note that the switch control circuit 402 may perform control such that the termination circuit 701 is caused to shift to the second state in a case where the frequency band to which the output signal RFout belongs is low, and the termination circuit 701 is caused to shift to the first state in a case where the frequency band to which the output signal RFout belongs is high.

The termination circuit 701 does not have to include the switch 432 and may have a configuration in which the second end of the inductor 651 is directly grounded. Even with such a configuration, the frequency of a harmonic wave component to be attenuated can be switched.

A matching circuit 702 (first matching circuit) includes the capacitor 422, the inductor 652, and the switches 433 and 434. The matching circuit 702 adjusts, regarding the fundamental wave of the output signal RFout, an impedance (hereinafter also referred to as first impedance) when the circuits after the amplifier 501 are viewed from the amplifier 501. In the matching circuit 702, the first impedance is switched by the switches 433 and 434.

Specifically, the capacitor 422 has a first end and a second end, the first end being connected to the collector of the amplifier 501. The inductor 652 has a first end, a center tap 652a, and a second end, the first end being connected to the second end of the capacitor 422. The switch 433 has a first end and a second end. The first end is connected to the center tap 652a, and the second end is connected to the output terminal 32. The switch 434 has a first end and a second end. The first end is connected to the second end of the inductor 652, and the second end is connected to the output terminal 32.

The switches 433 and 434 respectively operate on the basis of signals B3 and B4 received from the switch control circuit 402. In the present embodiment, the switch 433 and the switch 434 operate exclusively. Specifically, when the switch 433 is off, the switch 434 is on, which is called a third state. When the switch 433 is on, the switch 434 is off, which is called a fourth state.

In general, the impedance of the inductor 652 is high when the frequency is high, and thus the first impedance for a case where the matching circuit 702 is in the third state is higher than the first impedance for a case where the matching circuit 702 is in the fourth state. That is, the third state is appropriate for impedance matching between the amplifier 501 and the circuits after the amplifier 501 for a case where the frequency band to which the output signal RFout belongs is low. In contrast, the fourth state is appropriate for impedance matching between the amplifier 501 and the circuits after the amplifier 501 for a case where the frequency band to which the output signal RFout belongs is high.

In the present embodiment, the switch control circuit 402 performs control such that the matching circuit 702 is caused to shift to the third state in a case where the frequency band to which the output signal RFout belongs is low, and the matching circuit 702 is caused to shift to the fourth state in a case where the frequency band to which the output signal RFout belongs is high. Note that the switch control circuit 402 may perform control such that the matching circuit 702 is caused to shift to the fourth state in a case where the frequency band to which the output signal RFout belongs is low, and the matching circuit 702 is caused to shift to the third state in a case where the frequency band to which the output signal RFout belongs is high.

The matching circuit 702 does not have to include the switch 434 and may have a configuration in which the second end of the inductor 652 and the output terminal 32 are directly connected to each other. Even with such a configuration, the first impedance can be switched.

A matching circuit 703 (second matching circuit) includes the capacitor 423, the inductor 653, and the switches 435 and 436. The matching circuit 703 adjusts, regarding the fundamental wave of the input signal RFin, an impedance (hereinafter also referred to as second impedance) when the amplifier 501 is viewed from the input terminal 31. In the matching circuit 703, the second impedance is switched by the switches 435 and 436.

Specifically, the switch 435 has a first end and a second end, the first end being connected to the input terminal 31. The switch 436 has a first end and a second end, the first end being connected to the input terminal 31. The inductor 653 has a first end, the center tap 653a, and a second end. The first end is connected to the second end of the switch 436, and the center tap 652a is connected to the second end of the switch 435. The capacitor 423 has a first end and a second end. The first end is connected to the second end of the inductor 653, and the second end is connected to the base of the amplifier 501.

The switches 435 and 436 respectively operate on the basis of signals B5 and B6 received from the switch control circuit 402. In the present embodiment, the switch 435 and the switch 436 operate exclusively. Specifically, when the switch 435 is off, the switch 436 is on, which is called a fifth state. When the switch 435 is on, the switch 436 is off, which is called a sixth state.

In general, the impedance of the inductor 653 is high when the frequency is high, and thus the second impedance for a case where the matching circuit 703 is in the fifth state is higher than the second impedance for a case where the matching circuit 703 is in the sixth state. That is, the fifth state is appropriate for impedance matching between the amplifier 501 and previous-stage circuits for a case where the frequency band to which the input signal RFin belongs is low. In contrast, the sixth state is appropriate for impedance matching between the amplifier 501 and the previous-stage circuits for a case where the frequency band to which the input signal RFin belongs is high.

In the present embodiment, the switch control circuit 402 performs control such that the matching circuit 703 is caused to shift to the fifth state in a case where the frequency band to which the input signal RFin belongs is low, and the matching circuit 703 is caused to shift to the sixth state in a case where the frequency band to which the input signal RFin belongs is high. Note that the switch control circuit 402 may perform control such that the matching circuit 703 is caused to shift to the sixth state in a case where the frequency band to which the input signal RFin belongs is low, and the matching circuit 703 is caused to shift to the fifth state in a case where the frequency band to which the input signal RFin belongs is high.

The matching circuit 703 does not have to include the switch 436 and may have a configuration in which the input terminal 31 and the first end of the inductor 653 are directly connected to each other. Even with such a configuration, the second impedance can be switched.

[Layout]

The layout of a power amplification device 12 according to the second embodiment will be described.

Figure 18:
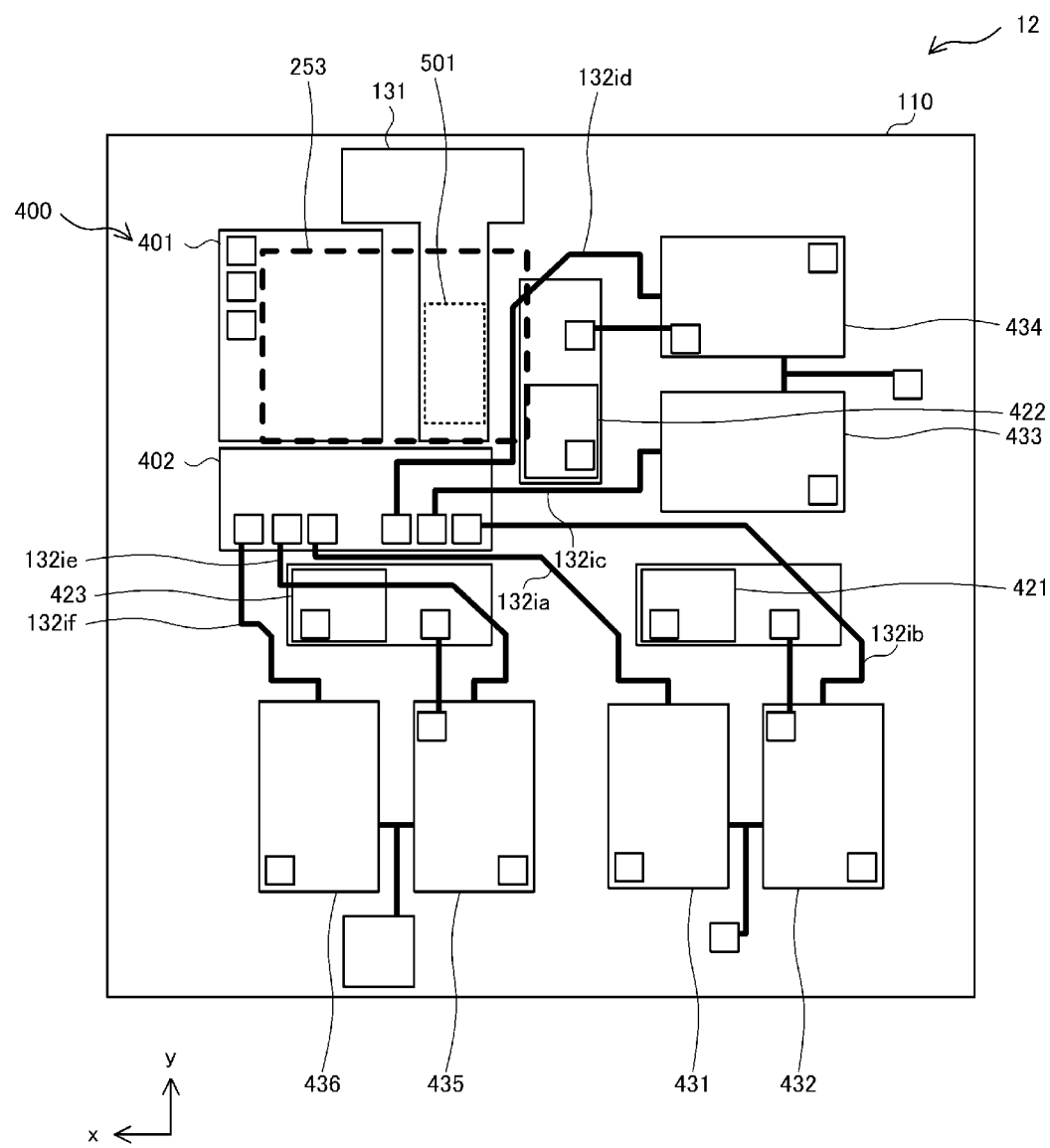
FIG. 18 is a diagram illustrating an example of the layout of the first circuit in the first member.
Figure 19:
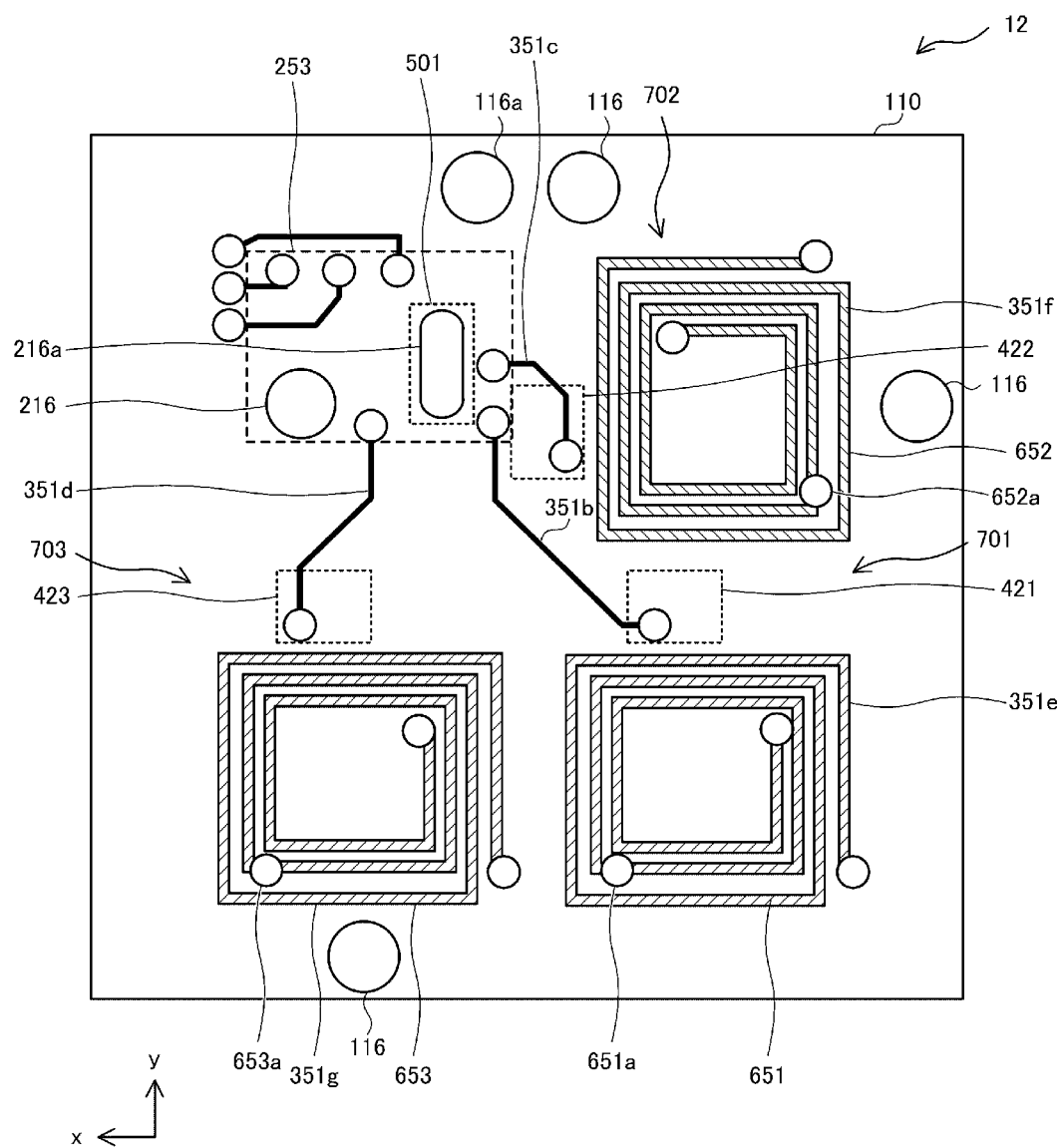
FIG. 19 is a diagram illustrating an example of the layout of electrodes provided on the −z axis side of the first member and the second member.

FIG. 18 is a diagram illustrating an example of the layout of the first circuit 400 in the first member 110. FIG. 19 is a diagram illustrating an example of the layout of electrodes provided on the −z axis side of the first member 110 and the second member 210. FIGS. 18 and 19 are plan views when, for example, the first member 110 or the second member 210 is viewed in a plan view from the −z axis side. Note that FIG. 18 illustrates the position of the amplifier 501 of the second circuit 500 in order to make description easier to understand. FIG. 19 illustrates the positions of the capacitors 421, 422, and 423.

As illustrated in FIGS. 18 and 19, in the power amplification device 12, the capacitor 421 of the first circuit 400 is provided in the vicinity of the center of and on the −x axis side of the first member 110. The inductor 651 and the switches 431 and 432 are provided on the −y axis side of the capacitor 421. The capacitor 423 is provided in the vicinity of the center of and on the +x axis side of the first member 110. The inductor 653 and the switches 435 and 436 are provided on the −y axis side of the capacitor 423. The capacitor 422 is provided in the vicinity of the center of and on the +y axis side of the first member 110. The inductor 652 and the switches 433 and 434 are provided on the −x axis side of the capacitor 422.

The switch control circuit 402 is provided on the +y axis side of the capacitor 423 (see FIG. 18). On the +y axis side of the switch control circuit 402, a substantially rectangular region 253, to which the second member 210 is joined, is positioned. On the +y axis side of the switch control circuit 402, the amplifier control circuit 401 is provided so as to partially overlap the region 253. On the −x axis side of the amplifier control circuit 401, the heat spreader 131 is provided. The amplifier 501 is provided so as to overlap a portion of the heat spreader 131 when the first member 110 is viewed in a plan view from the −z axis side.

The switches 431 and 432 are connected to the switch control circuit 402 through first member metal wiring lines 132$ia$ and 132$ib$, respectively. The signals B1 and B2 are transmitted through the first member metal wiring lines 132$ia$ and 132$ib$, respectively. The switches 433 and 434 are connected to the switch control circuit 402 through first member metal wiring lines 132$ic$ and 132$id$, respectively. The signals B3 and B4 are transmitted through the first member metal wiring lines 132$ic$ and 132$id$, respectively. The switches 435 and 436 are connected to the switch control circuit 402 through first member metal wiring lines 132$ie$ and 132$if$, respectively. The signals B5 and B6 are transmitted through the first member metal wiring lines 132$ie$ and 132$if$, respectively.

A member-member connection conductor 351$b$ connects the collector of the amplifier 501 and the first end of the capacitor 421 to each other (see FIG. 19). A member-member connection conductor 351$c$ connects the collector of the amplifier 501 and the first end of the capacitor 422 to each other. A member-member connection conductor 351$d$ connects the base of the amplifier 501 and the second end of the capacitor 423 to each other. The member-member connection conductors 351$b$, 351$c$, and 351$d$ are forms of the member-member connection conductor.

The inductors 651, 652, and 653 are formed by redistribution lines 351$e$, 351$f$, and 351$g$, respectively. Details of the redistribution lines 351$e$, 351$f$, and 351$g$ will be described below.

Figure 20:
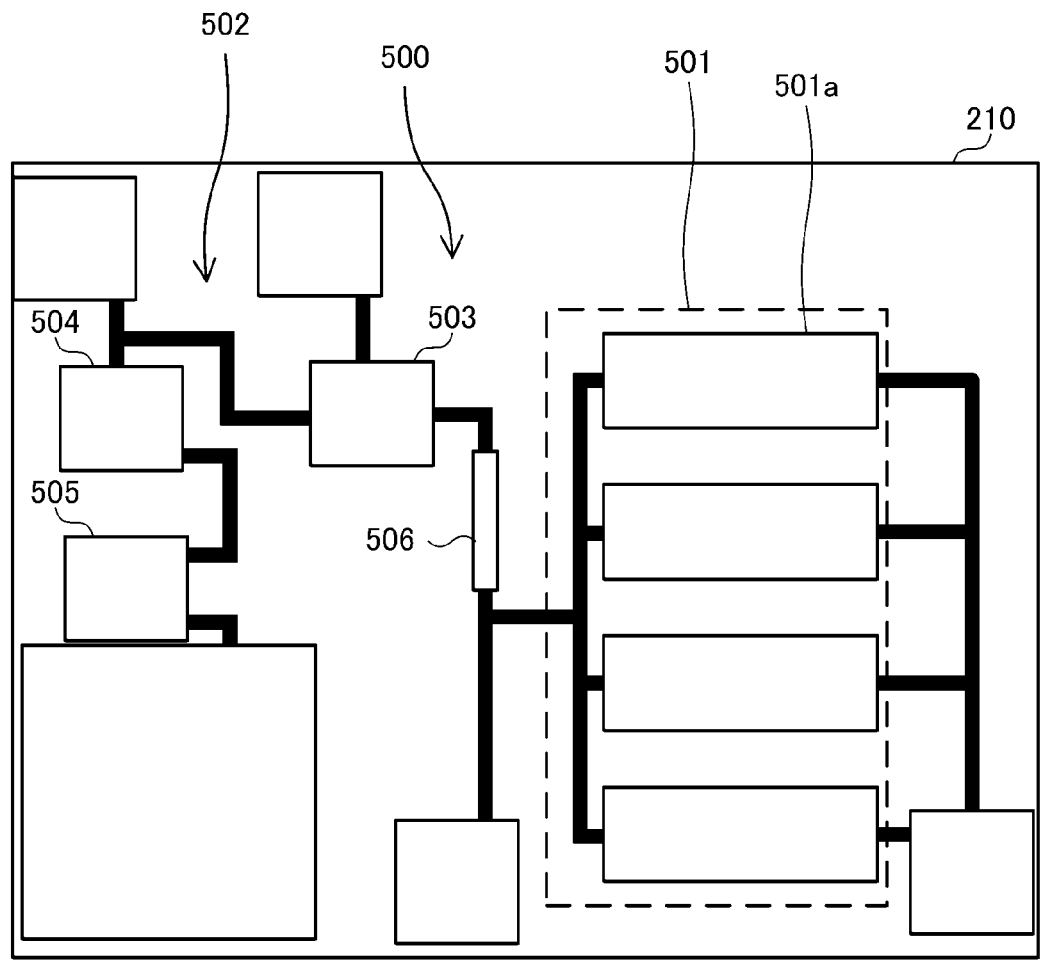
FIG. 20 is a diagram illustrating an example of the layout of the second circuit in the second member.

FIG. 20 is a diagram illustrating an example of the layout of the second circuit 500 in the second member 210. FIG. 20 is viewed substantially in the same manner as for FIG. 18. As illustrated in FIG. 20, the layout of the second circuit 500 is substantially the same as the layout of the second circuit 500 according to the first embodiment (see FIG. 10).

Figure 21:
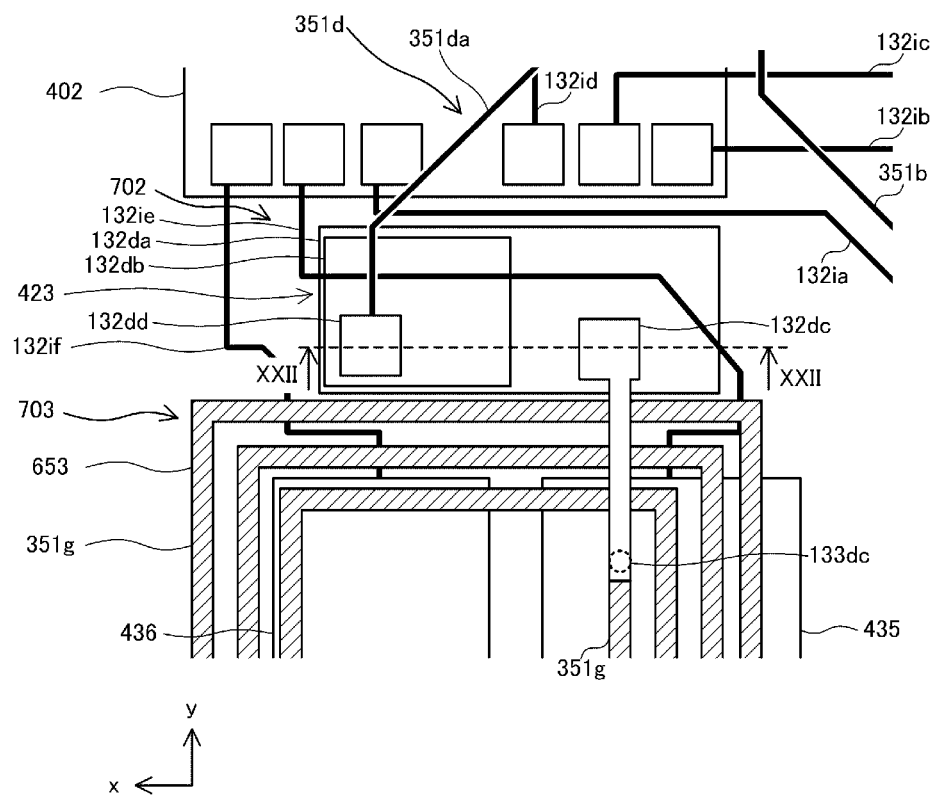
FIG. 21 is an enlarged view of an area including a matching circuit in FIG. 19.
Figure 22:
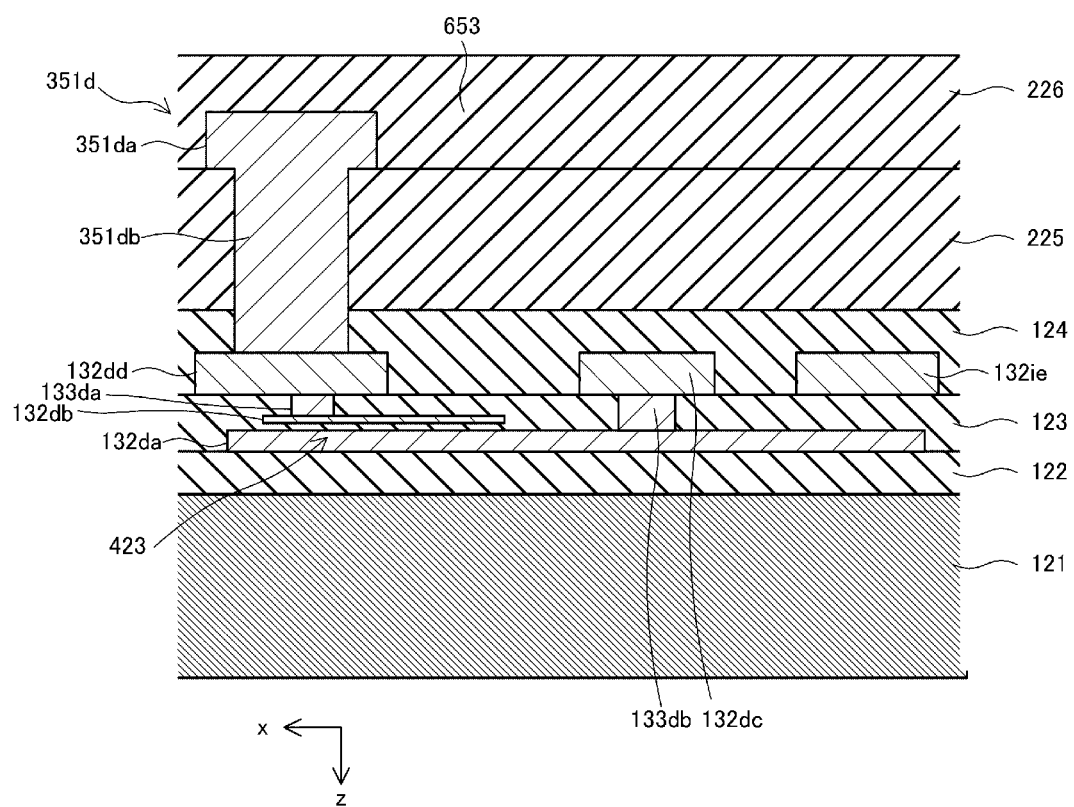
FIG. 22 is a cross-sectional view taken along line XXII-XXII illustrated in FIG. 21.

FIG. 21 is an enlarged view of an area including the matching circuit 703 in FIG. 19. FIG. 22 is a cross-sectional view taken along line XXII-XXII illustrated in FIG. 21. As illustrated in FIGS. 21 and 22, the member-member connection conductor 351$d$ has a redistribution line 351$da$ and a redistribution line via 351$db$ and is connected to the first end of the capacitor 423. The shapes and arrangements of the redistribution line 351$da$ and the redistribution line via 351$db$ are substantially the same as those of the redistribution line 351$aa$ and the redistribution line via 35 lab illustrated in FIGS. 14 and 15.

The capacitor 423 has a MIM structure formed by a first member metal wiring line 132$da$ and a first member electrode 132$db$, which extend parallel to the xy plane, and the second insulating film 123, which is filled between the first member metal wiring line 132$da$ and the first member electrode 132$db$. The first member metal wiring line 132$da$ and the first member electrode 132$db$ are respectively substantially the same as the first member metal wiring line 132$ca$ and the first member electrode 132$cb$ illustrated in FIGS. 14 to 16.

A first member metal wiring line 132$dc$, a first member electrode 132$dd$, and first member vias 133$da$ and 133$db$ around the first member metal wiring line 132$da$ and the first member electrode 132$db$ (see FIG. 22) are respectively substantially the same as the first member metal wiring line 132$cc$, the first member electrode 132$cd$, and the first member vias 133$ca$ and 133$cb$ illustrated in FIGS. 14 and 15.

A first member via 133$dc$ (see FIG. 21) connects the first member metal wiring line 132$dc$, which is provided on the surface of the second insulating film 123 on the −z axis side, and a redistribution line 351$g$ forming the inductor 653 to each other. Although details will be described later, the redistribution line 351$g$ is provided on the surface of the first insulating film 225 on the −z axis side.

The structure of and electrodes around each of the capacitors 421 and 422 are substantially the same as the structure of and electrodes around the capacitor 423.

Figure 23:
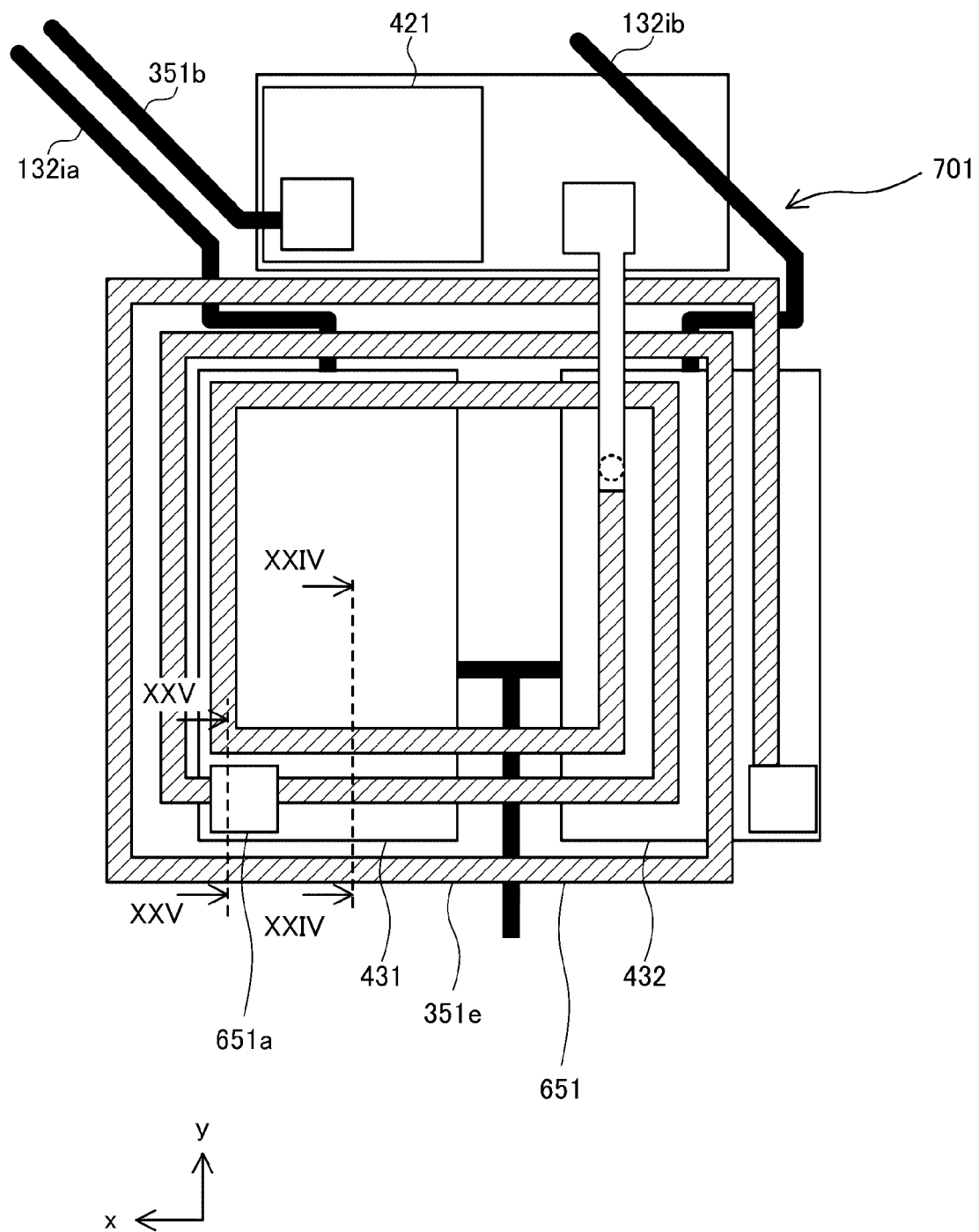
FIG. 23 is an enlarged view of an area including a termination circuit in FIG. 19.
Figure 24:
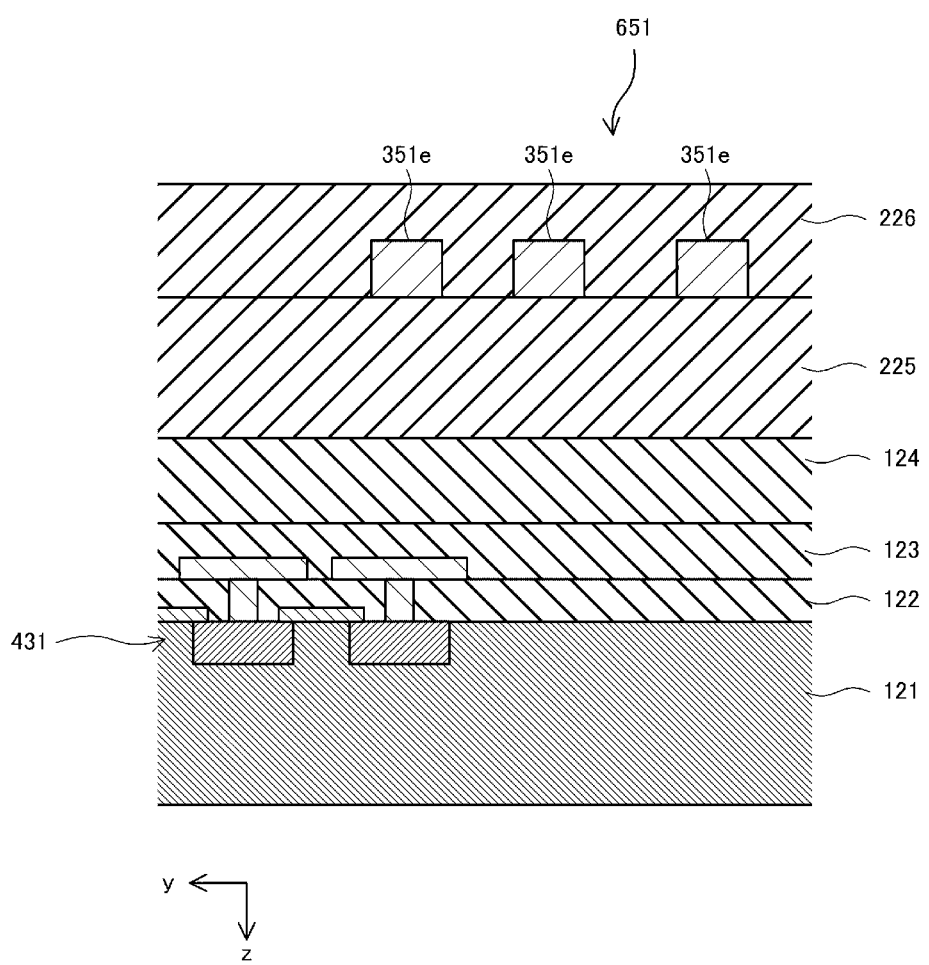
FIG. 24 is a cross-sectional view taken along line XXIV-XXIV illustrated in FIG. 23.

FIG. 23 is an enlarged view of an area including the termination circuit 701 in FIG. 19. FIG. 24 is a cross-sectional view taken along line XXIV-XXIV illustrated in FIG. 23. As illustrated in FIGS. 23 and 24, the redistribution line 351$e$ forming the inductor 651 is provided so as to be wound within the xy plane on the surface of the first insulating film 225 on the −z axis side. The switch 431 is provided in the substrate 121, the first insulating film 122, and the second insulating film 123.

Figure 25:
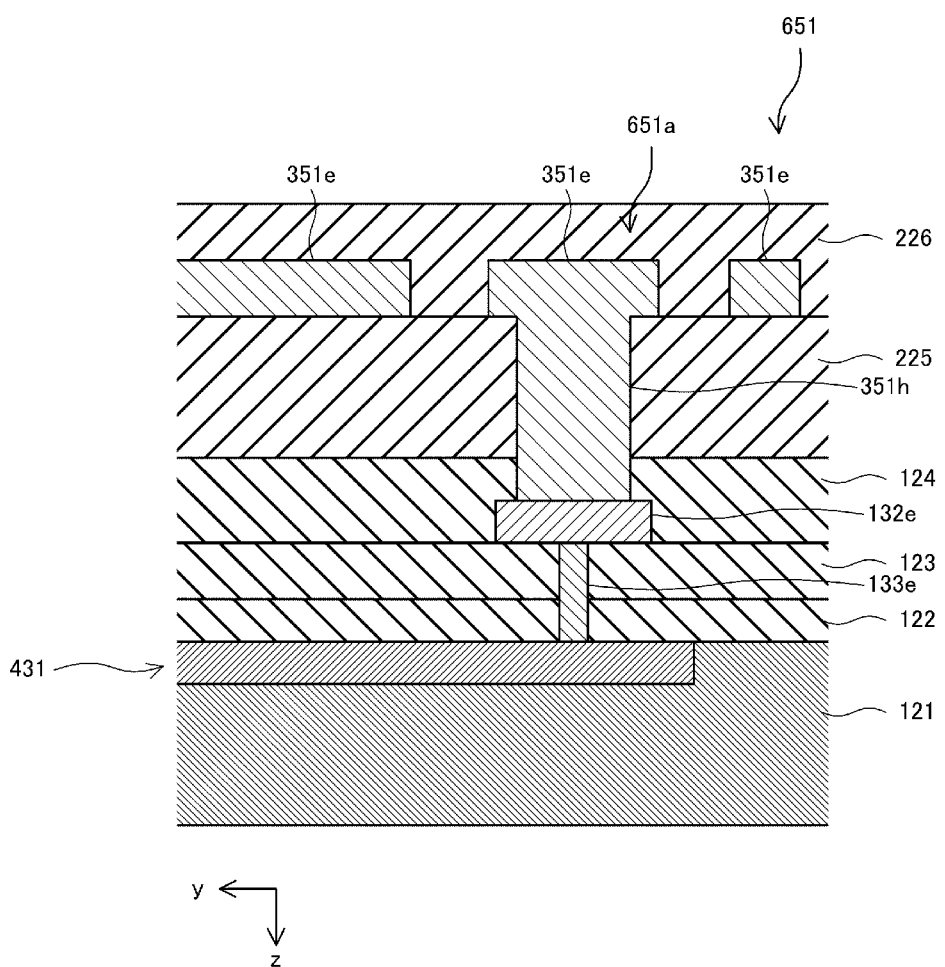
FIG. 25 is a cross-sectional view taken along line XXV-XXV illustrated in FIG. 23.

FIG. 25 is a cross-sectional view taken along line XXV-XXV illustrated in FIG. 23. As illustrated in FIGS. 23 and 25, the center tap 651$a$ of the inductor 651 is connected to the switch 431 through a redistribution line via 351$h$, a first member metal wiring line 132$e$, and a first member via 133$e$.

Specifically, the first member metal wiring line 132$e$ is formed on the surface of the second insulating film 123 on the −z axis side. The first member via 133$e$ is provided in an opening provided in the first insulating film 122 and the second insulating film 123. The first member via 133$e$ connects the first member metal wiring line 132$e$ and the first end of the switch 431 to each other. The redistribution line via 351$h$ is provided in an opening provided in the first insulating film 225 and the third insulating film 124. The redistribution line via 351$h$ connects the center tap 651$a$ and the first member metal wiring line 132$e$ to each other.

The structure of and electrodes around each of the inductors 652 and 653 are substantially the same as the structure of and electrodes around the inductor 651.

Third Embodiment

A power amplification device and a power amplification circuit according to a third embodiment will be described.

Figure 26:
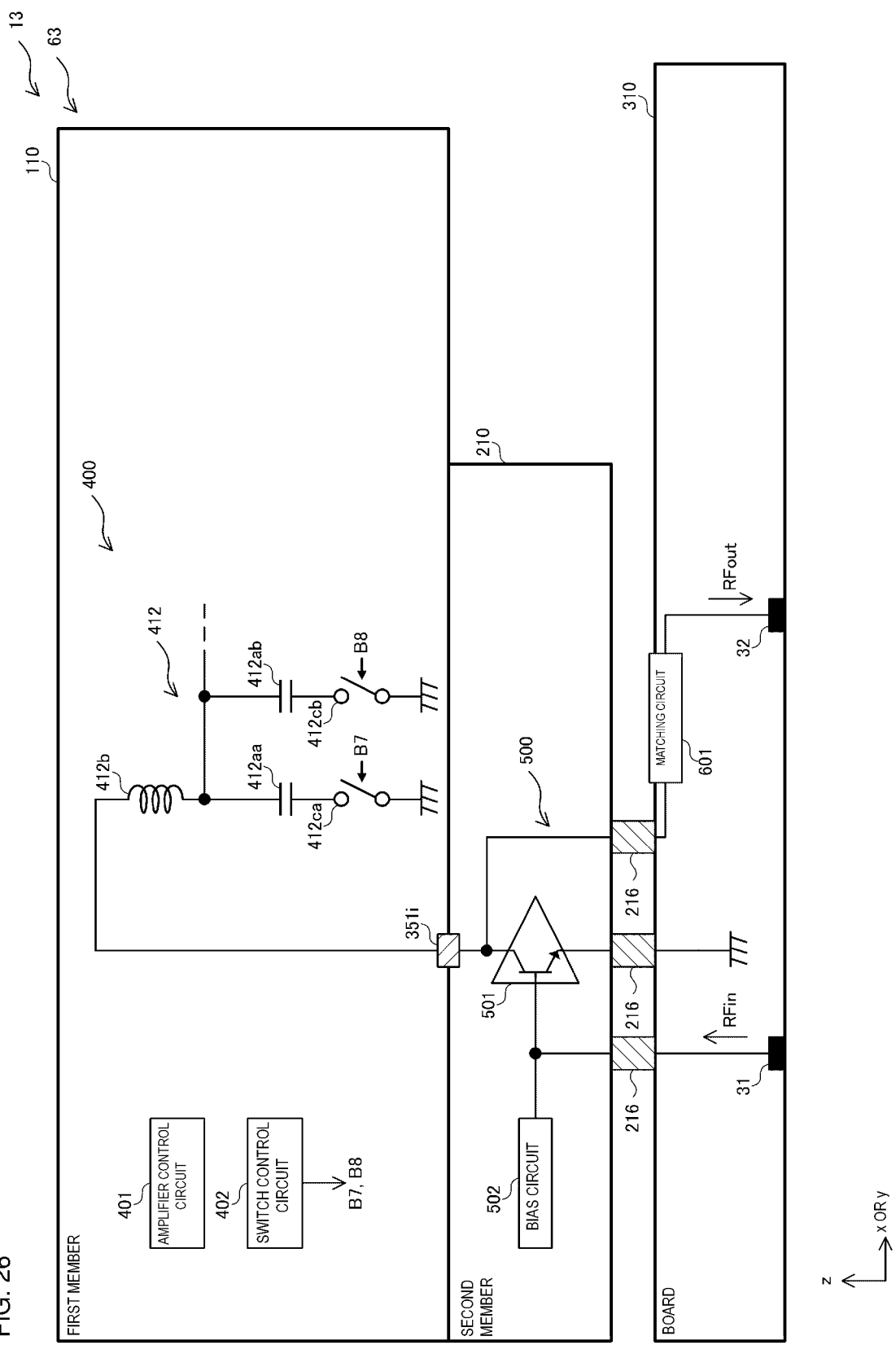
FIG. 26 is a diagram for describing arrangement of a power amplification circuit in a power amplification device.

FIG. 26 is a diagram for describing arrangement of a power amplification circuit 63 in a power amplification device 13. FIG. 26 schematically illustrates the arrangement of the power amplification circuit 63 in a cross section of the power amplification device 13. As illustrated in FIG. 26, the power amplification circuit 63 according to the third embodiment differs from the power amplification circuit 61 according to the first embodiment in that the capacitance of a capacitor in a termination circuit can be changed.

When compared with the first circuit 400 in the power amplification circuit 61 (see FIG. 7), the first circuit 400 in the power amplification circuit 63 includes a termination circuit 412 instead of the termination circuit 411 and further includes the switch control circuit 402.

The termination circuit 412 includes a capacitor 412aa and a capacitor 412ab, an inductor 412b, and switches 412ca and 412cb.

The inductor 412b has a first end and a second end, the first end being connected to the collector of the amplifier 501 of the second member 210 through a member-member connection conductor 351i. The capacitor 412aa has a first end and a second end, the first end being connected to the second end of the inductor 412b. The switch 412ca has a first end and a second end. The first end is connected to the second end of the capacitor 412aa, and the second end is grounded. The capacitor 412ab has a first end and a second end, the first end being connected to the second end of the inductor 412b. The switch 412cb has a first end and a second end. The first end is connected to the second end of the capacitor 412ab, and the second end is grounded. The member-member connection conductor 351i is, for example, a wiring line like the member-member connection conductor 351a (see FIG. 9).

The switches 412ca and 412cb are switches substantially the same as the switch 431 and respectively operate on the basis of signals B7 and B8 received from the switch control circuit 402. In the present embodiment, the switch control circuit 402 controls the switches 412ca and 412cb such that in a case where, for example, the frequency band to which the output signal RFout belongs is low, the combined capacitance of the capacitors 412aa and 412ab increases. Specifically, the switch control circuit 402 switches on both of the switches 412ca and 412cb.

In contrast, the switch control circuit 402 controls the switches 412ca and 412cb such that in a case where, for example, the frequency band to which the output signal RFout belongs is high, the combined capacitance of the capacitors 412aa and 412ab decreases. Specifically, the switch control circuit 402 switches on one out of the switches 412ca and 412cb.

Note that the switch control circuit 402 may be configured to control the switches 412ca and 412cb such that the combined capacitance of the capacitors 412aa and 412ab decreases in a case where the frequency band to which the output signal RFout belongs is low, and the combined capacitance of the capacitors 412aa and 412ab increases in a case where the frequency band to which the output signal RFout belongs is high.

The termination circuit 412 has been described as having a configuration that includes two of a pair of the capacitor 412aa and the switch 412ca and a pair of the capacitor 412ab and the switch 412cb; however, the termination circuit 412 may have a configuration that includes three or more of the pair.

Moreover, the termination circuit 412 may have a configuration in which inductors are provided instead of the capacitors, and a capacitor is provided instead of the inductor.

Moreover, the termination circuit 412 may have a configuration in which part of the termination circuit 412 is provided outside the first member 110. Specifically, for example, the termination circuit 412 may have a configuration in which an inductor (second inductor) like the redistribution line 351e (see FIG. 19) is provided as the member-member connection conductor 351i, and thus part of the inductor is provided outside the first member 110. Moreover, the termination circuit 412 may have a configuration in which, for example, the inductor 412b is not provided, the first end of the capacitor 412aa and the first end of the capacitor 412ab are connected to the member-member connection conductor 351i serving as an inductor (second inductor) like the redistribution line 351e, and thus the entirety of the inductor is provided outside the first member 110.

Fourth Embodiment

A power amplification device and a power amplification circuit according to a fourth embodiment will be described.

Figure 27:
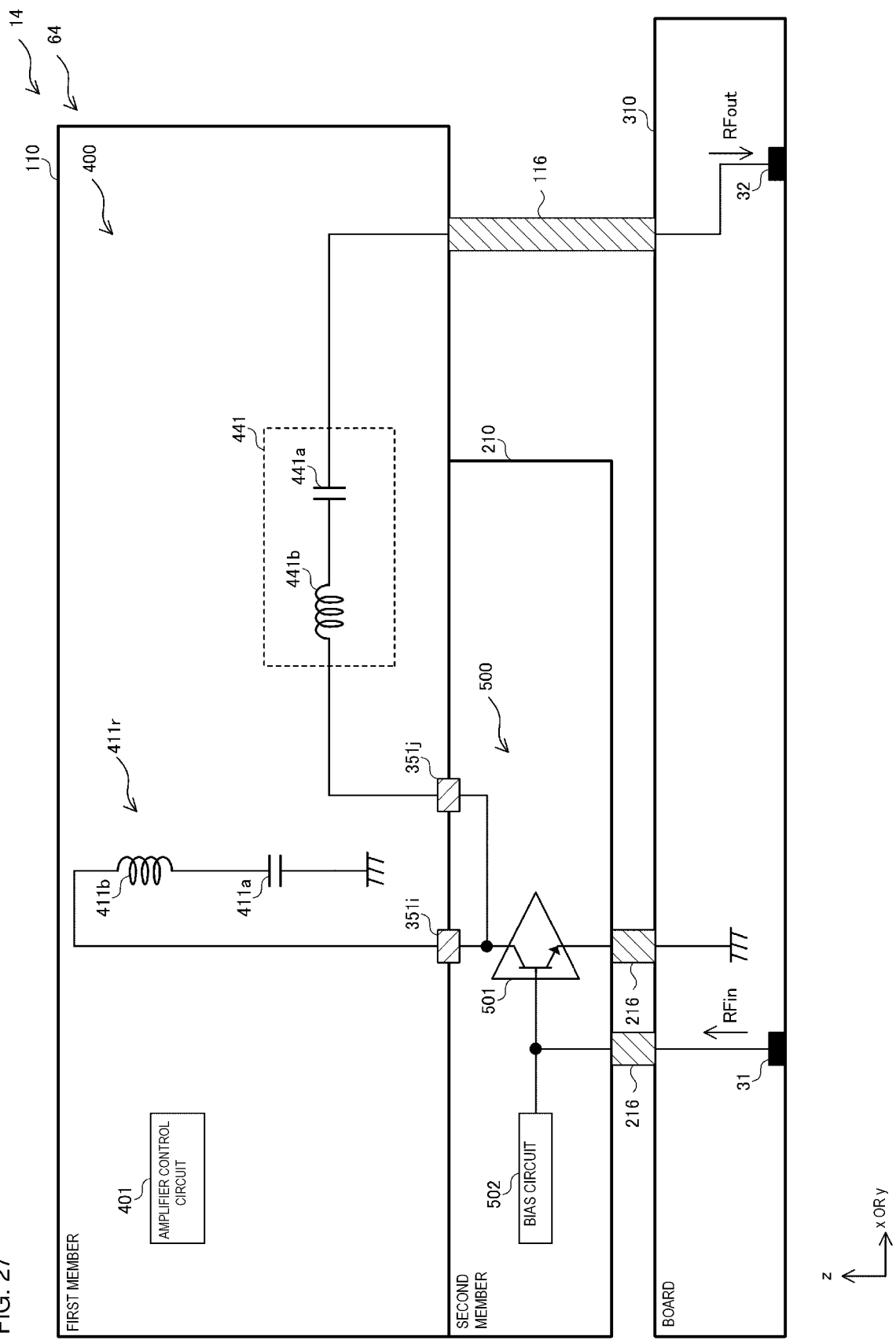
FIG. 27 is a diagram for describing arrangement of a power amplification circuit in a power amplification device.

FIG. 27 is a diagram for describing arrangement of a power amplification circuit 64 in a power amplification device 14. FIG. 27 schematically illustrates the arrangement of the power amplification circuit 64 in a cross section of the power amplification device 14. As illustrated in FIG. 27, the power amplification device 14 according to the fourth embodiment differs from the power amplification device 11 according to the first embodiment in that a matching circuit is provided in the first member 110.

When compared with the first circuit 400 in the power amplification circuit 61 (see FIG. 7), the first circuit 400 in the power amplification circuit 64 includes a termination circuit 411r instead of the termination circuit 411 and further includes a matching circuit 441.

The termination circuit 411r is a series LC circuit substantially the same as the termination circuit 411 illustrated in FIG. 7; however, the order in which a capacitor and an inductor are connected is different. That is, the inductor 411b of the termination circuit 411r has a first end and a second end, the first end being connected to the collector of the amplifier 501 of the second member 210 through the member-member connection conductor 351i. The capacitor 411a has a first end and a second end. The first end is connected to the second end of the inductor 411b, and the second end is grounded.

The matching circuit 441 is, for example, a series LC circuit substantially the same as the matching circuit 601 illustrated in FIG. 7 and includes a capacitor 441a and an inductor 441b.

The inductor 441b has a first end and a second end, the first end being connected to the collector of the amplifier 501 of the second member 210 through a member-member connection conductor 351j. The capacitor 441a has a first end and a second end. The first end is connected to the second end of the inductor 441b, and the second end is connected to the output terminal 32 of the module board 310 through a first conductive protrusion 116 among the first conductive protrusions 116.

Note that the matching circuit 441 may have a configuration in which part of the matching circuit 441 is provided outside the first member 110. Specifically, the matching circuit 441 may have a configuration in which, for example, an inductor like the redistribution line 351f (see FIG. 19) is provided as the member-member connection conductor 351j, and thus part of the inductor is provided outside the first member 110. Moreover, the matching circuit 441 may have a configuration in which, for example, the inductor 441b is not provided, the first end of the capacitor 441a is connected to the member-member connection conductor 351j serving as an inductor like the redistribution line 351f, and thus the entirety of the inductor is provided outside the first member 110.

Figure 28:
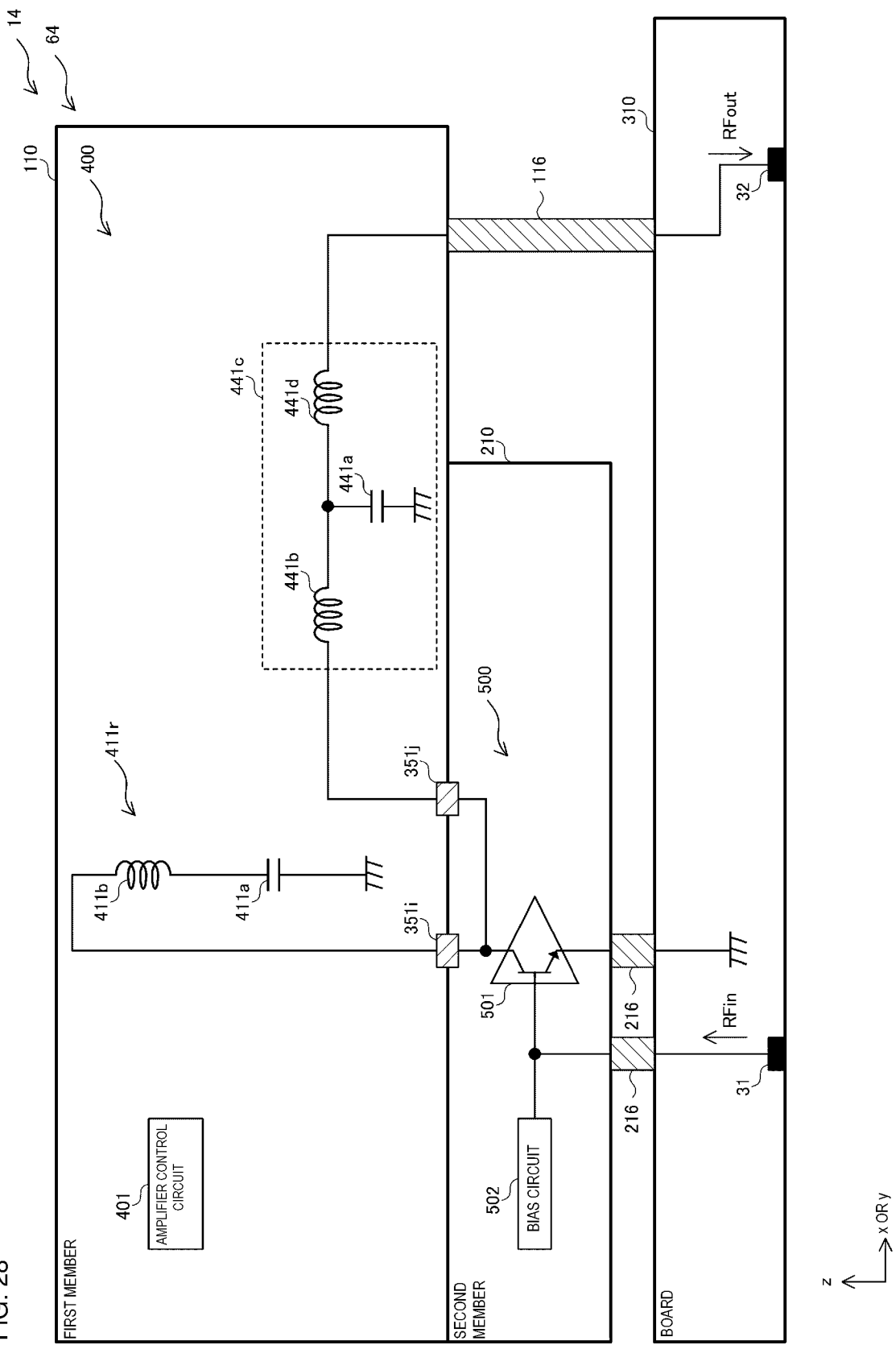
FIG. 28 is a diagram for describing a matching circuit, which is a modification of a matching circuit in the power amplification circuit.

FIG. 28 is a diagram for describing a matching circuit 441c, which is a modification of the matching circuit 441 in the power amplification circuit 64. As illustrated in FIG. 28, when compared with the matching circuit 441 illustrated in FIG. 27, the matching circuit 441c further includes an inductor 441d and has a difference connection form for the subsequent stage of the inductor 441b.

Specifically, the capacitor 441a has a first end and a second end. The first end is connected to the second end of the inductor 441b, and the second end is grounded. The inductor 441d has a first end and a second end. The first end is connected to the second end of the inductor 441b, and the second end is connected to the output terminal 32 of the module board 310 through a first conductive protrusion 116 among the first conductive protrusions 116.

Fifth Embodiment

A power amplification device and a power amplification circuit according to a fifth embodiment will be described.

Figure 29:
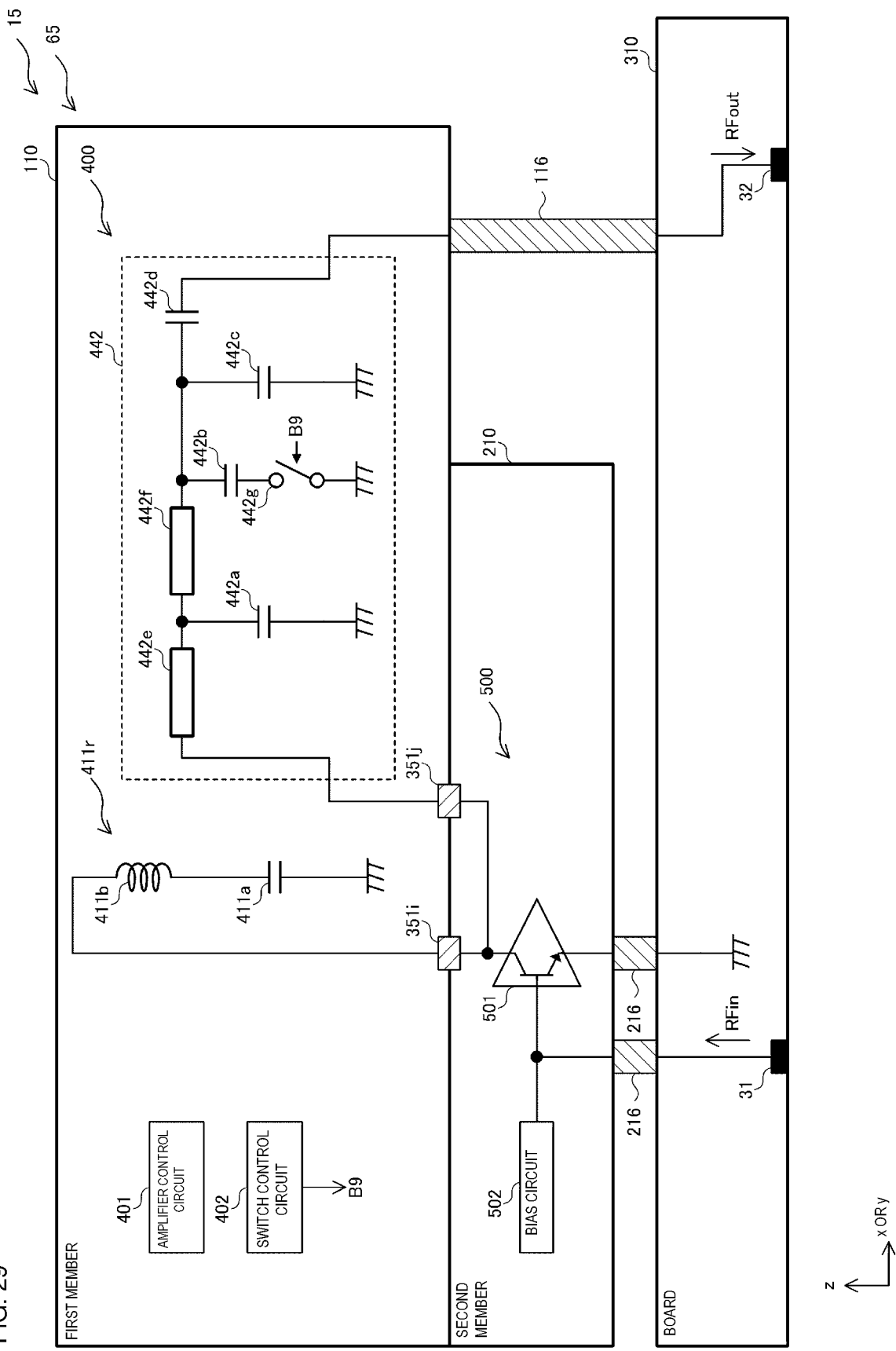
FIG. 29 is a diagram for describing arrangement of a power amplification circuit in a power amplification device.

FIG. 29 is a diagram for describing arrangement of a power amplification circuit 65 in a power amplification device 15. FIG. 29 schematically illustrates the arrangement of the power amplification circuit 65 in a cross section of the power amplification device 15. As illustrated in FIG. 29, the power amplification circuit 65 according to the fifth embodiment differs from the power amplification circuit 64 according to the fourth embodiment in that the capacitance of a capacitor in a matching circuit can be changed.

When compared with the first circuit 400 in the power amplification circuit 64 (see FIG. 27), the first circuit 400 in the power amplification circuit 65 includes a matching circuit 442 instead of the matching circuit 441 and further includes the switch control circuit 402. The matching circuit 442 includes capacitors 442a, 442b, 442c, and 442d, inductors 442e and 442f, and a switch 442g.

The matching circuit 442 adjusts the first impedance. The switch 442g switches the first impedance. Specifically, the inductor 442e has a first end and a second end, the first end being connected to the collector of the amplifier 501 of the second member 210 through the member-member connection conductor 351j. The capacitor 442a has a first end and a second end. The first end is connected to the second end of the inductor 442e, and the second end is grounded. The inductor 442f has a first end and a second end, the first end being connected to the second end of the inductor 442e. The capacitor 442b has a first end and a second end, the first end being connected to the second end of the inductor 442f. The switch 442g has a first end and a second end. The first end is connected to the second end of the capacitor 442b, and the second end is grounded. The capacitor 442c has a first end and a second end. The first end is connected to the second end of the inductor 442f, and the second end is grounded. The capacitor 442d has a first end and a second end. The first end is connected to the second end of the inductor 442f, and the second end is connected to the output terminal 32 of the module board 310 through a first conductive protrusion 116 among the first conductive protrusions 116.

The switch 442g is a switch substantially the same as the switch 431 and operates on the basis of a signal B9 received from the switch control circuit 402. In the present embodiment, the switch control circuit 402 switches on the switch 442g, for example, in a case where the frequency band to which the output signal RFout belongs is low. In contrast, the switch control circuit 402 switches off the switch 442g, for example, in a case where the frequency band to which the output signal RFout belongs is high.

Note that the switch control circuit 402 may perform control such that the switch 442g is switched off in a case where the frequency band to which the output signal RFout belongs is low, and the switch 442g is switched on in a case where the frequency band to which the output signal RFout belongs is high.

Moreover, the matching circuit 442 may have a configuration in which inductors are provided instead of the capacitors, and capacitors are provided instead of the inductors.

Sixth Embodiment

A power amplification device and a power amplification circuit according to a sixth embodiment will be described.

Figure 30:
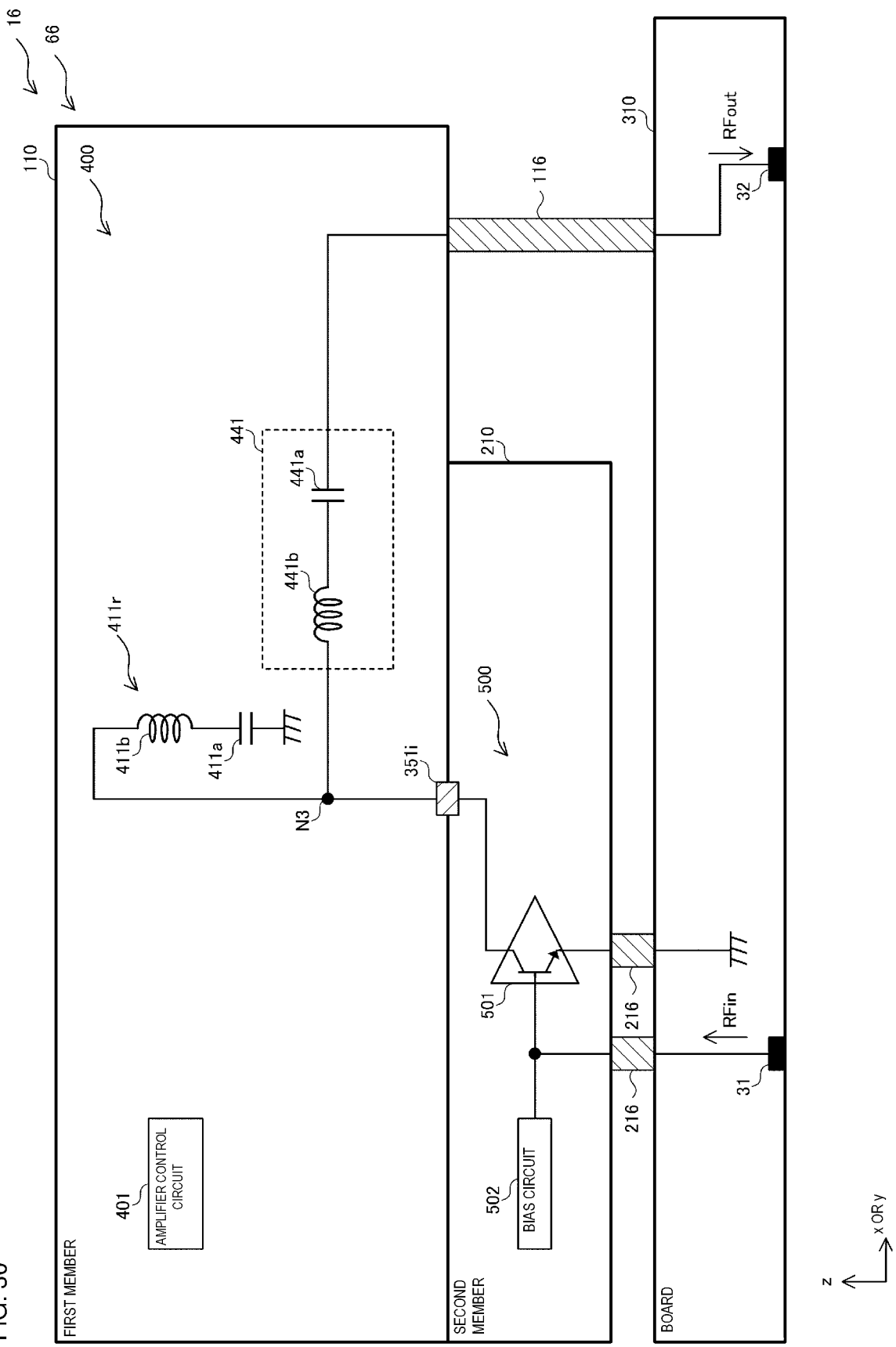
FIG. 30 is a diagram for describing arrangement of a power amplification circuit in a power amplification device.

FIG. 30 is a diagram for describing arrangement of a power amplification circuit 66 in a power amplification device 16. FIG. 30 schematically illustrates the arrangement of the power amplification circuit 66 in a cross section of the power amplification device 16. As illustrated in FIG. 30, the power amplification circuit 66 according to the sixth embodiment differs from the power amplification circuit 64 according to the fourth embodiment in that a termination circuit and a matching circuit are connected to an amplifier of the second member 210 through the same member-member connection conductor.

In the present embodiment, the first member 110 is provided with a node N3, which is connected to the collector of the amplifier 501 of the second member 210 through the member-member connection conductor 351i. The first end of the inductor 411b in the termination circuit 411r is connected to the node N3. The first end of the inductor 441b in the matching circuit 441 is connected to the node N3.

For example, when a configuration is used in which an inductor (second inductor) like the redistribution line 351e (see FIG. 19) is provided as the member-member connection conductor 351i, part of the inductor of the termination circuit 411r can be used as part of the inductor of the matching circuit 441, and vice versa. Thus, an inductor installation space in the first member 110 can be reduced, and the size of the power amplification device 16 can be made compact.

Note that a configuration may also be used in which the inductor 411b and the inductor 441b are not provided, the first end of the capacitor 411a and the first end of the capacitor 441a are connected to the member-member connection conductor 351i serving as an inductor like the redistribution line 351e. With such a configuration, the entirety of the inductor of the termination circuit 411r can be used as the entirety of the inductor of the matching circuit 441, and vice versa. Thus, the inductor installation space in the first member 110 can further be reduced, and the size of the power amplification device 16 can be made more compact.

Figure 31:
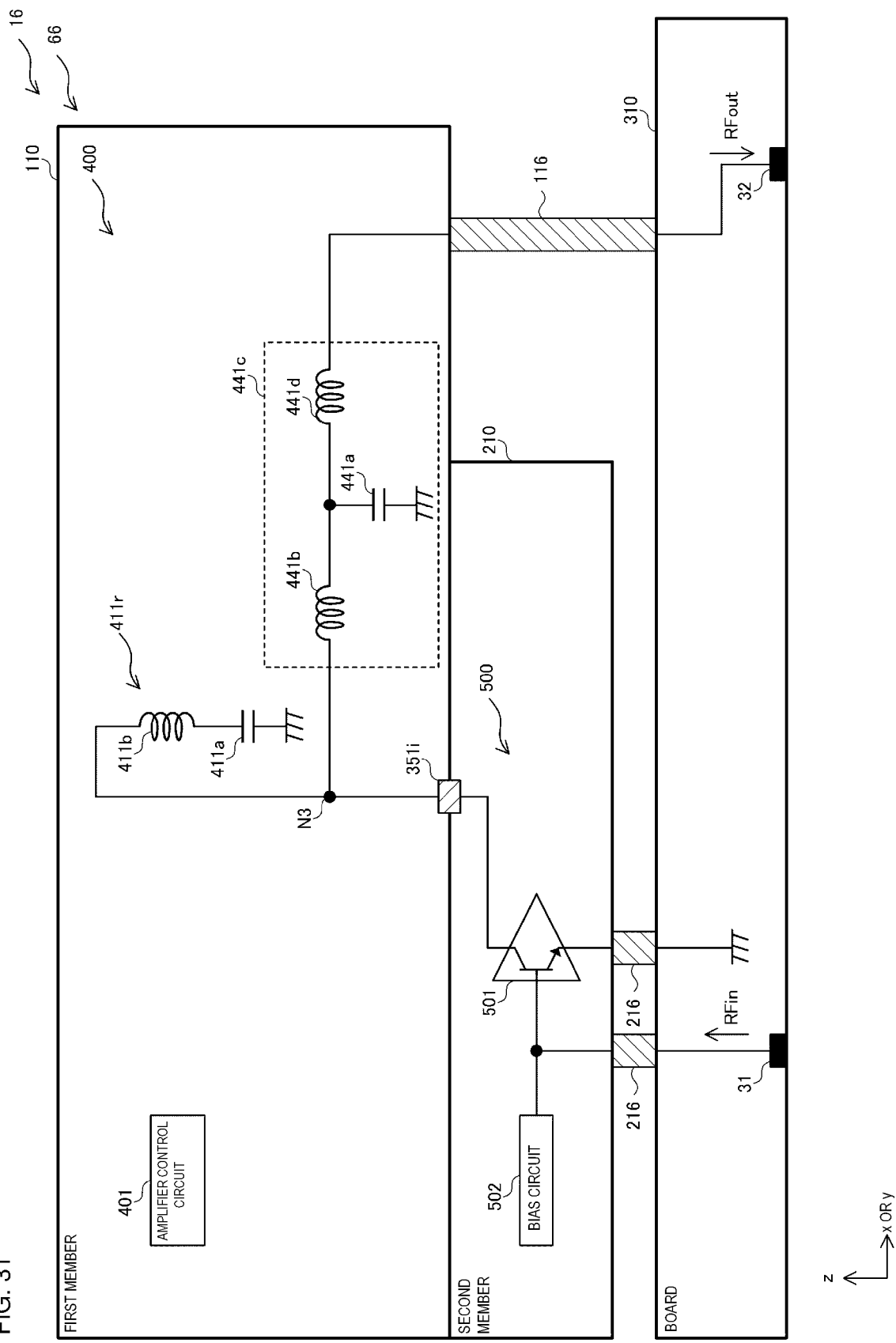
FIG. 31 is a diagram for describing the matching circuit, which is a modification of the matching circuit in the power amplification circuit.

FIG. 31 is a diagram for describing the matching circuit 441c, which is a modification of the matching circuit 441, in the power amplification circuit 66. As illustrated in FIG. 31, the matching circuit 441c has substantially the same configuration as the matching circuit 441c illustrated in FIG. 28. In the present modification, the first end of the inductor 441b in the matching circuit 441c is connected to the node N3.

Seventh Embodiment

A power amplification device and a power amplification circuit according to a seventh embodiment will be described.

Figure 32:
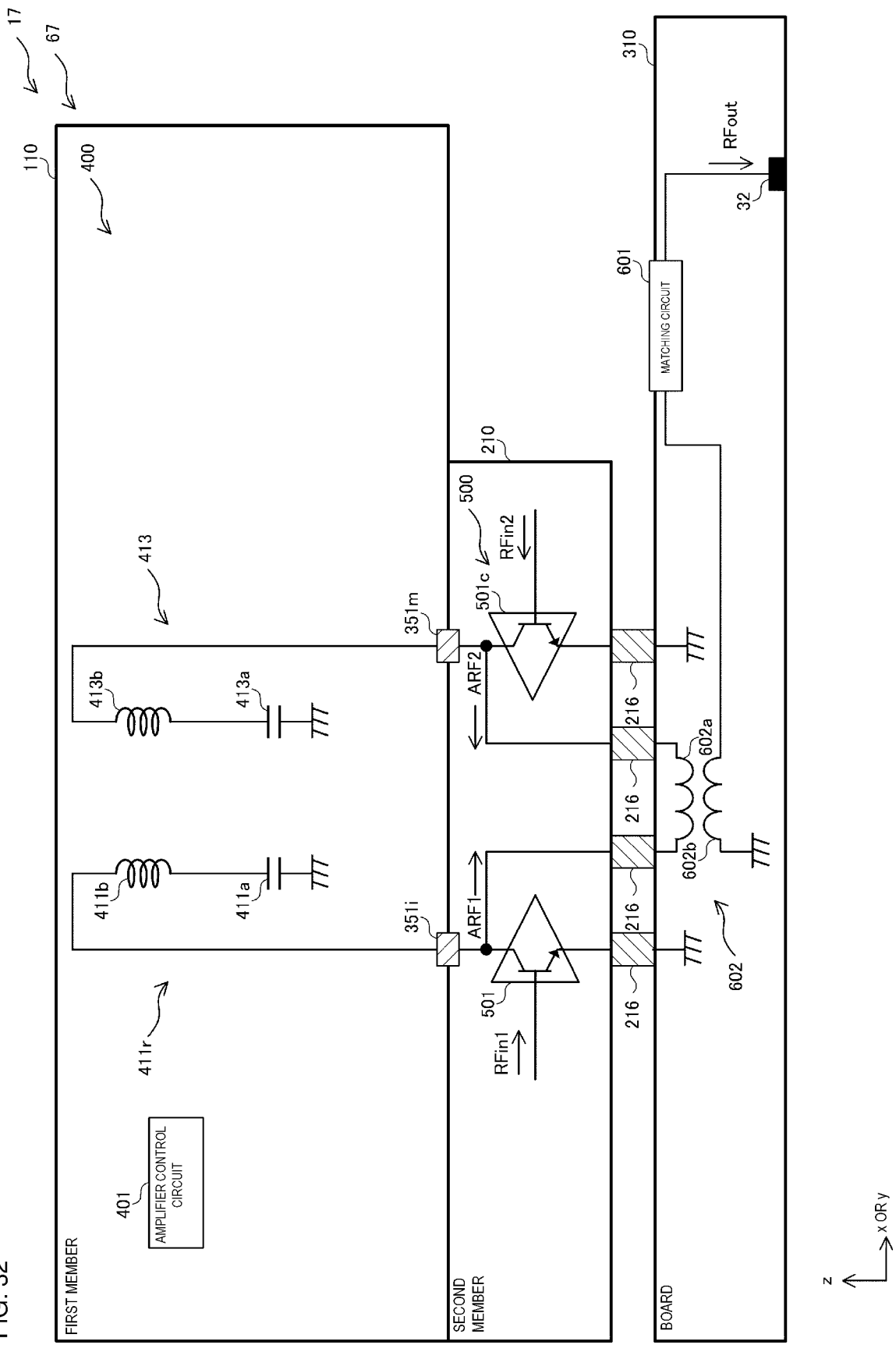
FIG. 32 is a diagram for describing arrangement of a power amplification circuit in a power amplification device.

FIG. 32 is a diagram for describing arrangement of a power amplification circuit 67 in a power amplification device 17. FIG. 32 schematically illustrates the arrangement of the power amplification circuit 67 in a cross section of the power amplification device 17. As illustrated in FIG. 32, the power amplification circuit 67 according to the seventh embodiment differs from the power amplification circuit 61 according to the first embodiment in that an input signal is amplified by a differential amplifier circuit.

The power amplification circuit 67 further includes a balun 602 when compared with the power amplification circuit 61 (see FIG. 7). When compared with the first circuit 400 in the power amplification circuit 61 (see FIG. 7), the first circuit 400 in the power amplification circuit 67 includes the termination circuit 411r instead of the termination circuit 411 and further includes a termination circuit 413 (second termination circuit). When compared with the second circuit 500 in the power amplification circuit 61 (see FIG. 7), the second circuit 500 in the power amplification circuit 67 further includes an amplifier 501c (second amplifier).

In the present embodiment, the balun 602 is provided in the module board 310. In FIG. 32, illustration of the bias circuit 502 and the input terminal 31 is omitted. The amplifier control circuit 401 further controls the operation of the amplifier 501c. As a result, a bias is supplied to the base of the amplifier 501c as in the case of the base of the amplifier 501.

For example, an input signal RFin1 (first signal) and an input signal RFin2 (second signal) forming a balanced signal are supplied to the base of the amplifier 501 and the base of the amplifier 501c, respectively. The input signals RFin1 and RFin2 are generated, for example, by dividing the input signal RFin, which is an unbalanced signal, using a balun into two signals that are about 180° out of phase with each other.

The amplifier 501 amplifies the input signal RFin1 and outputs an amplified signal ARF1 (first amplified signal). The amplifier 501c has a base to which the input signal RFin2 is to be supplied, a power-supply voltage supply node (not illustrated), a collector connected to the termination circuit 413 and the balun 602, and an emitter grounded through a second conductive protrusion 216 among the second conductive protrusions 216. The amplifier 501c amplifies the input signal RFin2 and outputs an amplified signal ARF2 (second amplified signal).

The termination circuit 413 is a series LC circuit having substantially the same configuration as the termination circuit 411r and includes a capacitor 413a and an inductor 413b. The inductor 413b has a first end and a second end, the first end being connected to the collector of the amplifier 501c of the second member 210 through a member-member connection conductor 351m. The capacitor 413a has a first end and a second end. The first end is connected to the second end of the inductor 413b, and the second end is grounded. The member-member connection conductor 351m has, for example, substantially the same configuration as the member-member connection conductor 351i.

The balun 602 converts the amplified signal ARF1 from the amplifier 501 and the amplified signal ARF2 from the amplifier 501c into the output signal RFout (third amplified signal), which is an unbalanced signal. Specifically, the balun 602 combines the amplified signals ARF1 and ARF2 to generate the output signal RFout. The balun 602 outputs the output signal RFout to the output terminal 32 through the matching circuit 601.

In the present embodiment, the balun 602 has an inductor 602a (primary winding) and an inductor 602b (secondary winding). The inductor 602a has a first end and a second end. The first end is connected to the collector of the amplifier 501 through a second conductive protrusion 216 among the second conductive protrusions 216, and the second end is connected to the collector of the amplifier 501c through a second conductive protrusion 216 among the second conductive protrusions 216. The inductor 602b electromagnetically couples to the inductor 602a and has a first end and a second end. The first end is grounded, and the second end is connected to the matching circuit 601.

The matching circuit 601 adjusts, regarding the fundamental wave of the output signal RFout, a third impedance when the circuits after the balun 602 are viewed from the balun 602.

In this manner, with a configuration in which the module board 310 is provided with the balun 602, which is large in size, the degree of flexibility of the layout of the first member 110 and the second member 210 can be improved.

Moreover, isolation can be ensured with a configuration in which the termination circuit 411r and the termination circuit 413 are provided in the first member 110, which is apart from the module board 310 to which the output signal RFout is transmitted. Thus, entering of a harmonic wave component into the output signal RFout can be suppressed.

Eighth Embodiment

A power amplification device and a power amplification circuit according to an eighth embodiment will be described.

Figure 33:
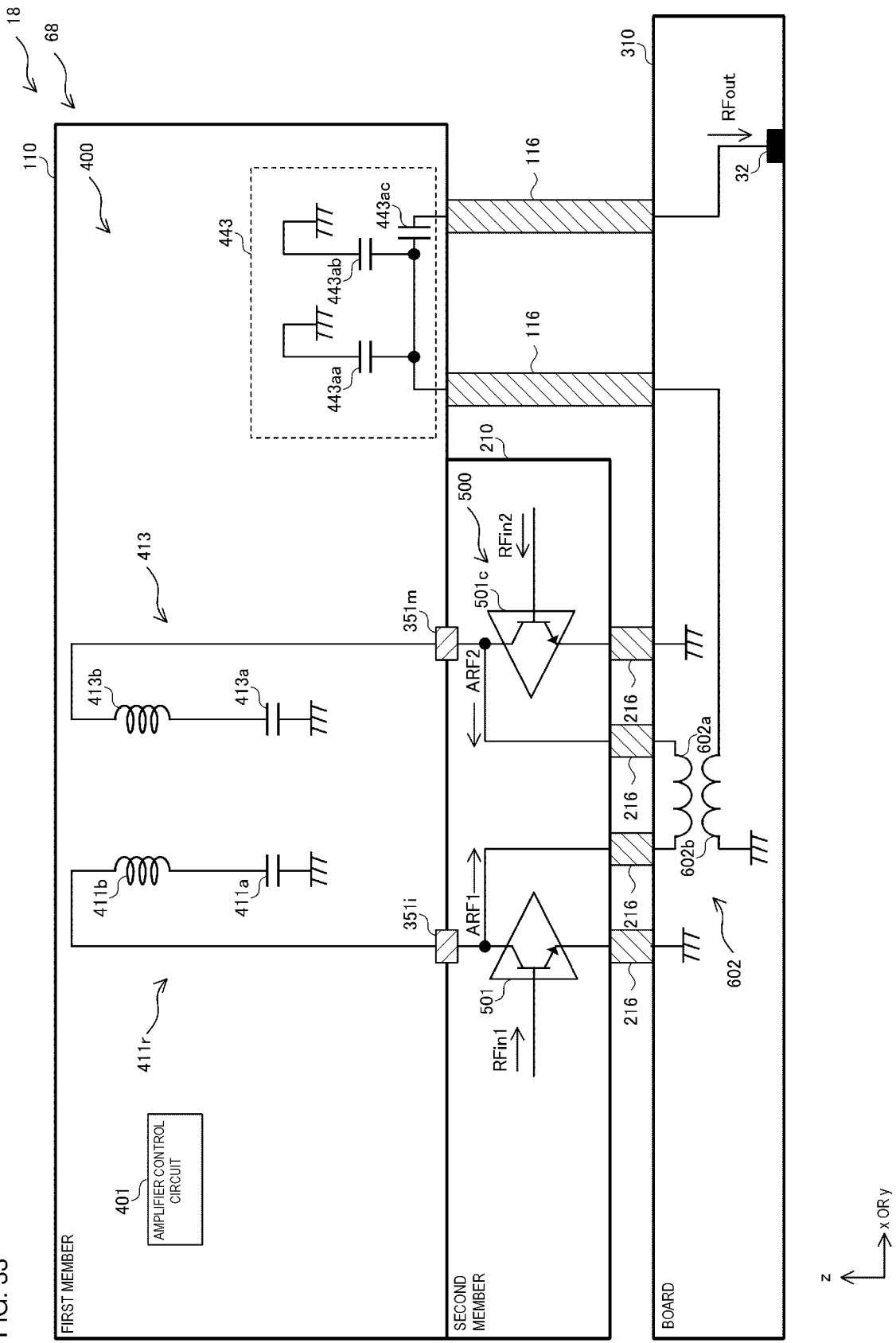
FIG. 33 is a diagram for describing arrangement of a power amplification circuit in a power amplification device.

FIG. 33 is a diagram for describing arrangement of a power amplification circuit 68 in a power amplification device 18. FIG. 33 schematically illustrates the arrangement of the power amplification circuit 68 in a cross section of the power amplification device 18. As illustrated in FIG. 33, the power amplification device 18 according to the eighth embodiment differs from the power amplification device 17 according to the seventh embodiment in that a matching circuit is provided in the first member 110.

When compared with the power amplification circuit 67 (see FIG. 32), the power amplification circuit 68 includes, instead of the matching circuit 601, a matching circuit 443 included in the first circuit 400. The matching circuit 443 includes capacitors 443aa, 443ab, and 443ac. The capacitor 443aa has a first end and a second end. The first end is connected to the second end of the inductor 602b of the balun 602 of the module board 310 through a first conductive protrusion 116 among the first conductive protrusions 116, and the second end is grounded.

The capacitor 443ab has a first end and a second end. The first end is connected to the first end of the capacitor 443aa, and the second end is grounded. The capacitor 443ac has a first end and a second end. The first end is connected to the first end of the capacitor 443aa, and the second end is connected to the output terminal 32 of the module board 310 through a first conductive protrusion 116 among the first conductive protrusions 116.

Ninth Embodiment

A power amplification device and a power amplification circuit according to a ninth embodiment will be described.

Figure 34:
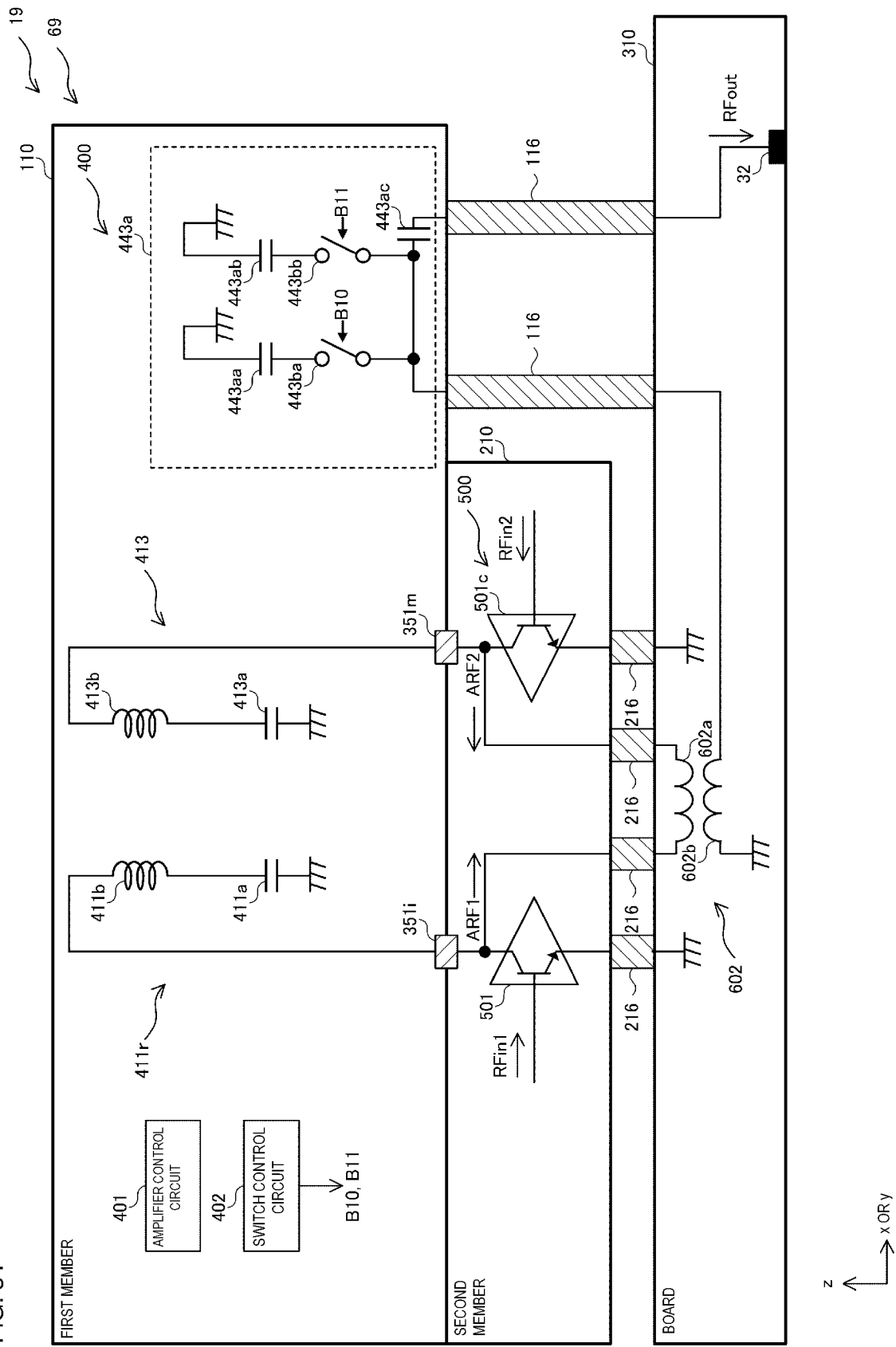
FIG. 34 is a diagram for describing arrangement of a power amplification circuit in a power amplification device.

FIG. 34 is a diagram for describing arrangement of a power amplification circuit 69 in a power amplification device 19. FIG. 34 schematically illustrates the arrangement of the power amplification circuit 69 in a cross section of the power amplification device 19. As illustrated in FIG. 34, the power amplification circuit 69 according to the ninth embodiment differs from the power amplification circuit 68 according to the eighth embodiment in that the capacitance of a capacitor in a matching circuit can be changed.

When compared with the first circuit 400 in the power amplification circuit 68 (see FIG. 33), the first circuit 400 in the power amplification circuit 69 includes a matching circuit 443a (first matching circuit) instead of the matching circuit 443 and further includes the switch control circuit 402. When compared with the matching circuit 443 (see FIG. 33), the matching circuit 443a further includes switches 443ba and 443bb. The matching circuit 443a adjusts the third impedance, similarly to the matching circuit 443. The switches 443ba and 443bb switch the third impedance.

Specifically, the switch 443ba has a first end and a second end. The first end is connected to the second end of the inductor 602b of the balun 602 of the module board 310 through a first conductive protrusion 116 among the first conductive protrusions 116 and to the first end of the capacitor 443ac, and the second end is connected to the first end of the capacitor 443aa. The switch 443bb has a first end and a second end. The first end is connected to the first end of the switch 443ba, and the second end is connected to the first end of the capacitor 443ab.

The switches 443ba and 443bb are switches substantially the same as the switch 431 and respectively operate on the basis of signals B10 and B11 received from the switch control circuit 402. In the present embodiment, the switch control circuit 402 controls the switches 443ba and 443bb such that in a case where, for example, the frequency band to which the output signal RFout belongs is low, the combined capacitance of the capacitors 443aa and 443ab increases. Specifically, the switch control circuit 402 switches on both of the switches 443ba and 443bb.

In contrast, the switch control circuit 402 controls the switches 443ba and 443bb such that in a case where, for example, the frequency band to which the output signal RFout belongs is high, the combined capacitance of the capacitors 443aa and 443ab decreases. Specifically, the switch control circuit 402 switches on one out of the switches 443ba and 443bb.

Note that the switch control circuit 402 may be configured to control the switches 443ba and 443bb such that the combined capacitance of the capacitors 443aa and 443ab decreases in a case where the frequency band to which the output signal RFout belongs is low, and the combined capacitance of the capacitors 443aa and 443ab increases in a case where the frequency band to which the output signal RFout belongs is high.

The matching circuit 443a has been described as having a configuration that includes two of a pair of the capacitor 443aa and the switch 443ba; however, the matching circuit 443a may have a configuration that includes three or more of the pair.

Tenth Embodiment

A power amplification device and a power amplification circuit according to a tenth embodiment will be described.

Figure 35:
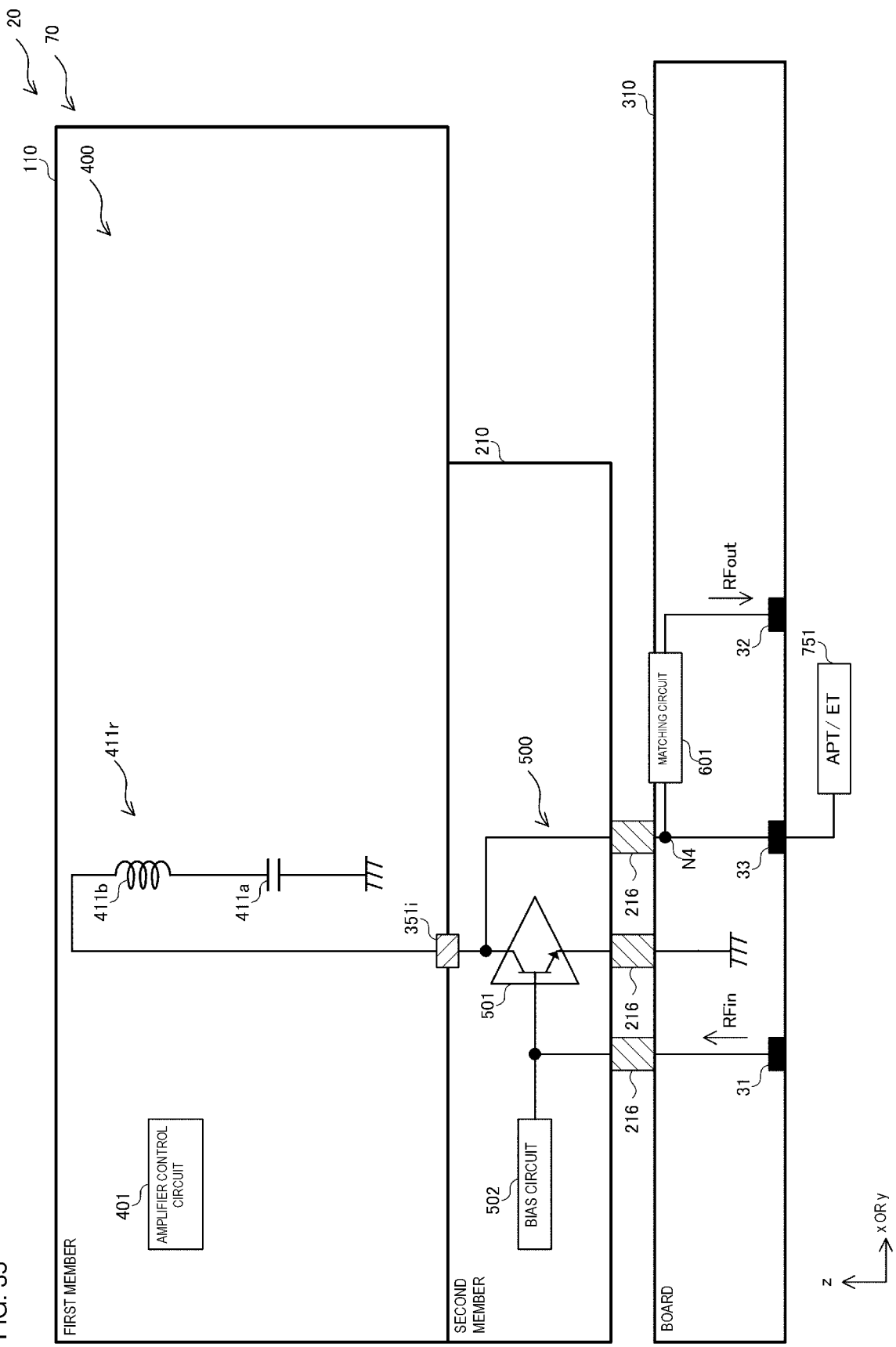
FIG. 35 is a diagram for describing arrangement of a power amplification circuit in a power amplification device.

FIG. 35 is a diagram for describing arrangement of a power amplification circuit 70 in a power amplification device 20. FIG. 35 schematically illustrates the arrangement of the power amplification circuit 70 in a cross section of the power amplification device 20. As illustrated in FIG. 35, the power amplification circuit 70 according to the tenth embodiment differs from the power amplification circuit 61 according to the first embodiment in that power is supplied to the amplifier 501 using average power tracking (APT) or envelope tracking (ET).

The power amplification device 20 further includes a power source 751 when compared with the power amplification device 11 (see FIG. 7). When compared with the first circuit 400 in the power amplification circuit 61 (see FIG. 7), the first circuit 400 in the power amplification circuit 70 includes the termination circuit 411r instead of the termination circuit 411.

The power source 751 applies a power source voltage to the collector of the amplifier 501 using, for example, average power tracking (APT) or envelope tracking (ET).

Specifically, the module board 310 is provided with a node N4, which is connected to the collector of the amplifier 501 through a second conductive protrusion 216 among the second conductive protrusions 216. An input-side terminal of the matching circuit 601, namely the first end of the capacitor 601a (see FIG. 6), is connected to the node N4. The power source 751 is, for example, provided outside the module board 310 and is connected to the node N4 of the module board 310 through a power supply terminal 33.

With such a configuration, the power consumption of the amplifier 501 can be reduced, and the amplifier 501 can be efficiently operated.

Eleventh Embodiment

A power amplification device and a power amplification circuit according to an eleventh embodiment will be described.

Figure 36:
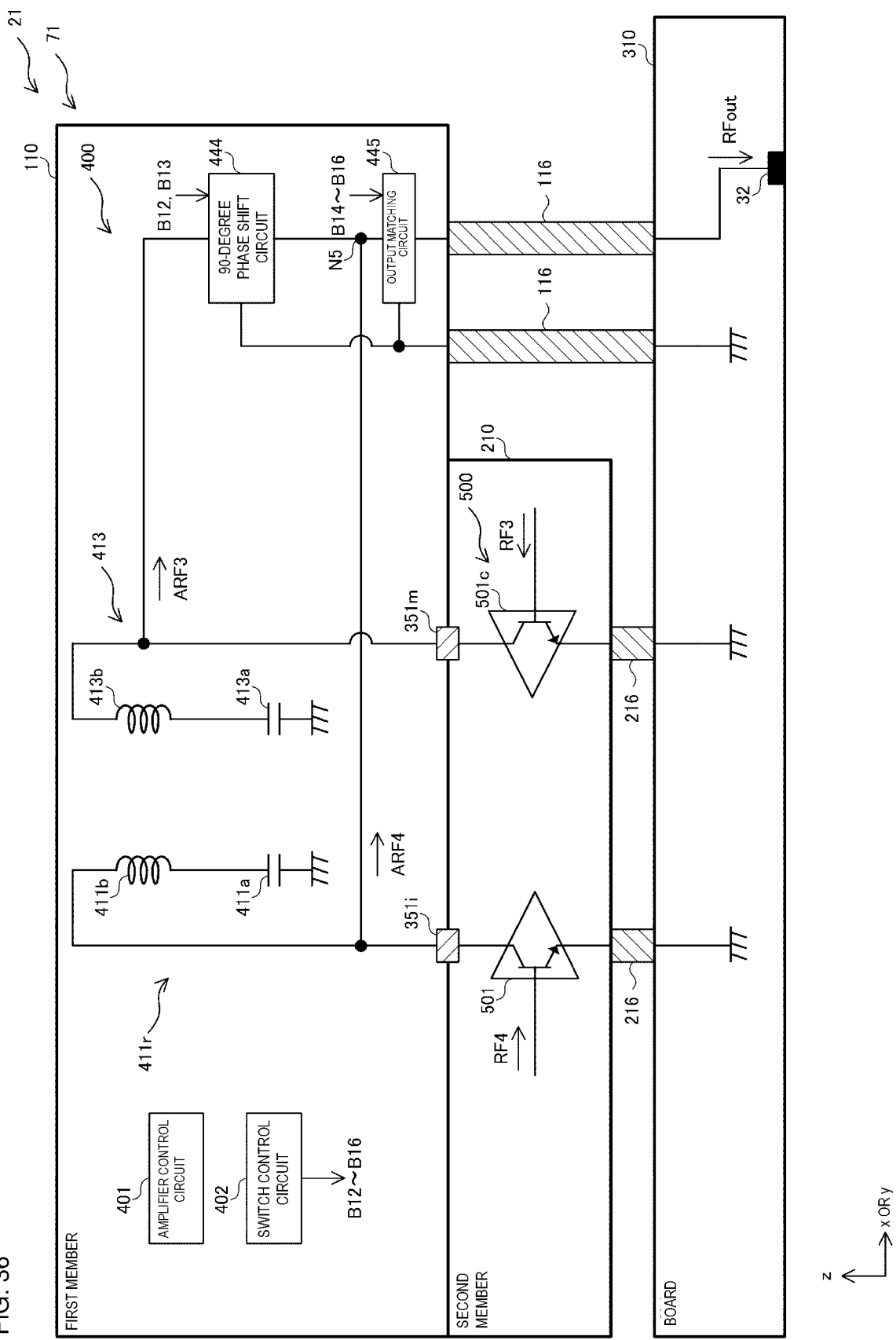
FIG. 36 is a diagram for describing arrangement of a power amplification circuit in a power amplification device.
Figure 37:
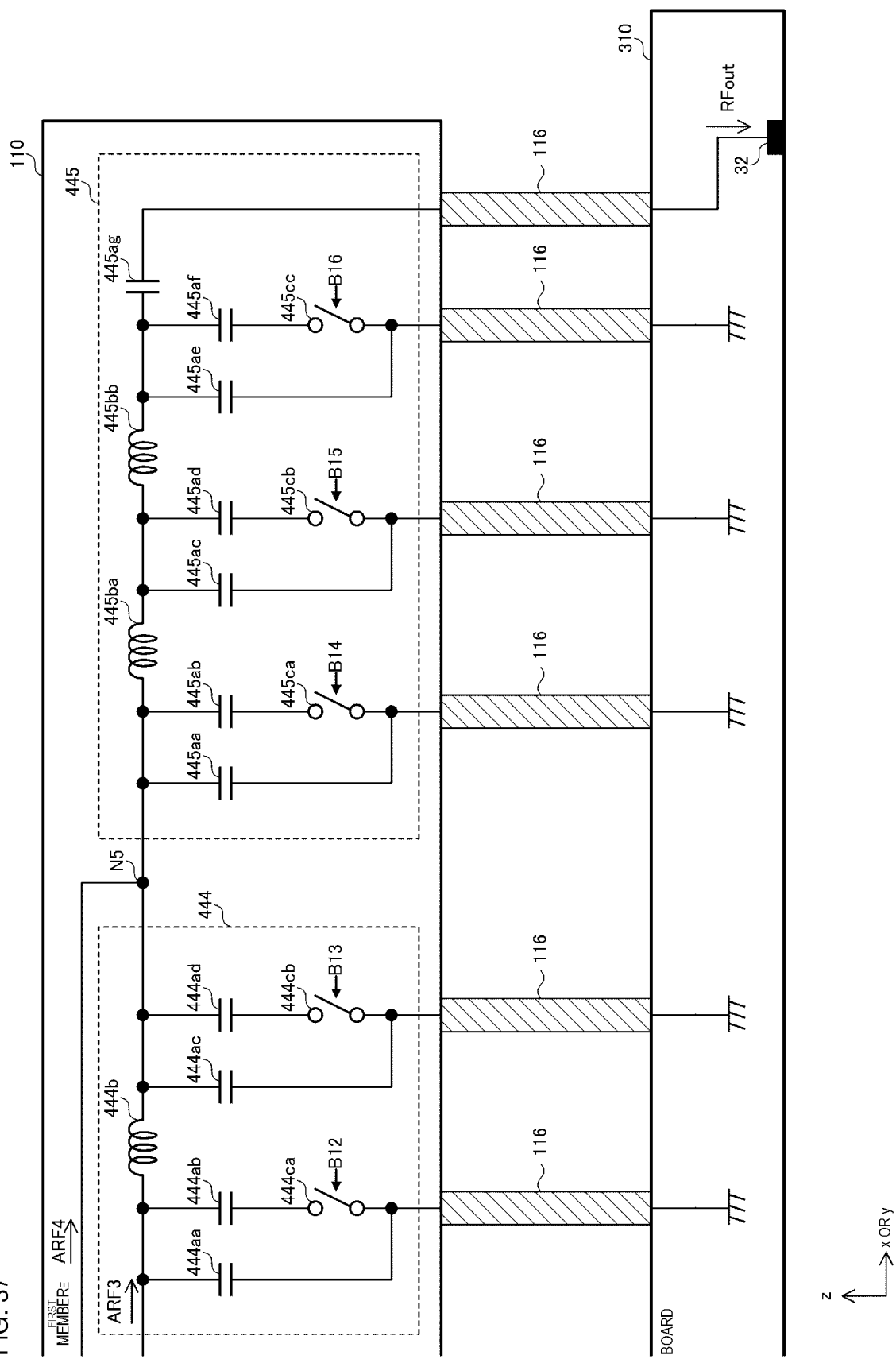
FIG. 37 is a diagram illustrating details of a 90-degree phase shift circuit and an output matching circuit illustrated in FIG. 36.

FIG. 36 is a diagram for describing arrangement of a power amplification circuit 71 in a power amplification device 21. FIG. 37 is a diagram illustrating details of a 90-degree phase shift circuit 444 and an output matching circuit 445 illustrated in FIG. 36. FIGS. 36 and 37 schematically illustrate arrangement of the power amplification circuit 71 in a cross section of the power amplification device 21. As illustrated in FIGS. 36 and 37, the power amplification circuit 71 according to the eleventh embodiment differs from the power amplification circuit 61 according to the first embodiment in that amplification is performed by the Doherty amplifier.

When compared with the first circuit 400 in the power amplification circuit 61 (see FIG. 7), the first circuit 400 in the power amplification circuit 71 includes the termination circuit 411r instead of the termination circuit 411 and further includes the switch control circuit 402, the termination circuit 413 (second termination circuit), the 90-degree phase shift circuit 444, and the output matching circuit 445 (first matching circuit). When compared with the second circuit 500 in the power amplification circuit 61 (see FIG. 7), the second circuit 500 in the power amplification circuit 71 further includes the amplifier 501c (second amplifier).

In FIG. 36, illustration of the bias circuit 502 and the input terminal 31 is omitted. In the present embodiment, a splitter that is not illustrated is provided before the amplifier 501 and the amplifier 501c. The splitter splits the input signal RFin into an input signal RFin3 (first signal) and an input signal RFin4 (second signal) having a phase delay of about 90 degrees with respect to the input signal RFin3.

The amplifier 501 is, for example, a peak amplifier and is biased to class C. The amplifier 501 amplifies the input signal RFin4 to output an amplified signal ARF4 (second amplified signal) when the power level of the input signal RFin4 indicates a predetermined power level or higher.

The amplifier control circuit 401 further controls the operation of the amplifier 501c. As a result, a bias is supplied to the base of the amplifier 501c as in the case of the base of the amplifier 501. In the present embodiment, the amplifier 501c is, for example, a carrier amplifier and is biased to class A, class AB, or class B. That is, regardless of the power level of the input signal RFin3 such as low instantaneous input power, the amplifier 501 amplifies the input signal RFin3 to output an amplified signal ARF3 (first amplified signal).

The 90-degree phase shift circuit 444 shifts the phase of the amplified signal ARF3. Specifically, the 90-degree phase shift circuit 444 delays the phase of the amplified signal ARF3 by about 90°. As a result, the phase of the amplified signal ARF3 can be made to match with the phase of the amplified signal ARF4 at the subsequent stage of the 90-degree phase shift circuit 444.

The output matching circuit 445 generates the output signal RFout (third amplified signal) by combining the amplified signal ARF4, which is supplied from the amplifier 501 through a node N5, and the input signal RFin3, which is supplied from the amplifier 501c through the 90-degree phase shift circuit 444 and the node N5. Moreover, the output matching circuit 445 adjusts, regarding the fundamental wave of the output signal RFout, a fourth impedance when the circuits after the amplifiers 501 and 501c are viewed from the amplifiers 501 and 501c. The output matching circuit 445 outputs the output signal RFout to the output terminal 32 through a first conductive protrusion 116 among the first conductive protrusions 116.

Specifically, the 90-degree phase shift circuit 444 includes capacitors 444aa, 444ab, 444ac, and 444ad, an inductor 444b, and switches 444ca and 444cb (see FIG. 37).

The capacitor 444aa of the 90-degree phase shift circuit 444 has a first end and a second end. The first end is connected to the collector of the amplifier 501c of the second member 210 through the member-member connection conductor 351m, and the second end is grounded through a first conductive protrusion 116 among the first conductive protrusions 116. The capacitor 444ab has a first end and a second end, the first end being connected to the first end of the capacitor 444aa. The switch 444ca has a first end and a second end. The first end is connected to the second end of the capacitor 444ab, and the second end is connected to the second end of the capacitor 444aa.

The inductor 444b has a first end and a second end. The first end is connected to the first end of the capacitor 444aa, and the second end is connected to the node N5.

The capacitor 444ac has a first end and a second end. The first end is connected to the node N5, and the second end is grounded through a first conductive protrusion 116 among the first conductive protrusions 116. The capacitor 444ad has a first end and a second end, the first end being connected to the node N5. The switch 444cb has a first end and a second end. The first end is connected to the second end of the capacitor 444ad, and the second end is connected to the second end of the capacitor 444ac.

The switches 444ca and 444cb are switches substantially the same as the switch 431 and respectively operate on the basis of signals B12 and B13 received from the switch control circuit 402. In the present embodiment, the switch control circuit 402 switches on the switches 444ca and 444cb, for example, in a case where the frequency band to which the amplified signal ARF3 belongs is low. In contrast, the switch control circuit 402 switches off the switches 444ca and 444cb, for example, in a case where the frequency band to which the amplified signal ARF3 belongs is high.

Note that the switch control circuit 402 may have a configuration with which the switches 444ca and 444cb are switched off in a case where the frequency band to which the amplified signal ARF3 belongs is low, and the switches 444ca and 444cb are switched on in a case where the frequency band to which the amplified signal ARF3 belongs is high.

The output matching circuit 445 includes capacitors 445aa, 445ab, 445ac, 445ad, 445ae, 445af, and 445ag, inductors 445ba and 445bb, and switches 445ca, 445cb, and 445cc (see FIG. 37).

The capacitor 445aa of the output matching circuit 445 has a first end and a second end. The first end is connected to the node N5, and the second end is grounded through a first conductive protrusion 116 among the first conductive protrusions 116. The capacitor 445ab has a first end and a second end, the first end being connected to the first end of the capacitor 445aa. The switch 445ca has a first end and a second end. The first end is connected to the second end of the capacitor 445ab, and the second end is connected to the second end of the capacitor 445aa.

The inductor 445ba has a first end and a second end, the first end being connected to the node N5. The capacitor 445ac has a first end and a second end. The first end is connected to the second end of the inductor 445ba, and the second end is grounded through a first conductive protrusion 116 among the first conductive protrusions 116. The capacitor 445ad has a first end and a second end, the first end being connected to the first end of the capacitor 445ac. The switch 445cb has a first end and a second end. The first end is connected to the second end of the capacitor 445ad, and the second end is connected to the second end of the capacitor 445ac.

The inductor 445bb has a first end and a second end, the first end being connected to the second end of the inductor 445ba. The capacitor 445ae has a first end and a second end. The first end is connected to the second end of the inductor 445bb, and the second end is grounded through a first conductive protrusion 116 among the first conductive protrusions 116. The capacitor 445af has a first end and a second end, the first end being connected to the first end of the capacitor 445ae. The switch 445cc has a first end and a second end. The first end is connected to the second end of the capacitor 445af, and the second end is connected to the second end of the capacitor 445ae.

The capacitor 445ag has a first end and a second end. The first end is connected to the second end of the inductor 445bb, and the second end is connected to the output terminal 32 of the module board 310 through the first conductive protrusion 116.

The switches 445ca, 445cb, and 445cc are switches substantially the same as the switch 431 and respectively operate on the basis of signals B14, B15, and B17 received from the switch control circuit 402. In the present embodiment, the switch control circuit 402 switches on the switches 445ca, 445cb, and 445cc, for example, in a case where the frequency band to which the output signal RFout belongs is low. In contrast, the switch control circuit 402 switches off the switches 445ca, 445cb, and 445cc, for example, in a case where the frequency band to which the output signal RFout belongs is high.

Note that the switch control circuit 402 may have a configuration with which the switches 445ca, 445cb, and 445cc are switched off in a case where the frequency band to which the output signal RFout belongs is low, and the switches 445ca, 445cb, and 445cc are switched on in a case where the frequency band to which the output signal RFout belongs is high.

Twelfth Embodiment

A power amplification device and a power amplification circuit according to a twelfth embodiment will be described.

Figure 38:
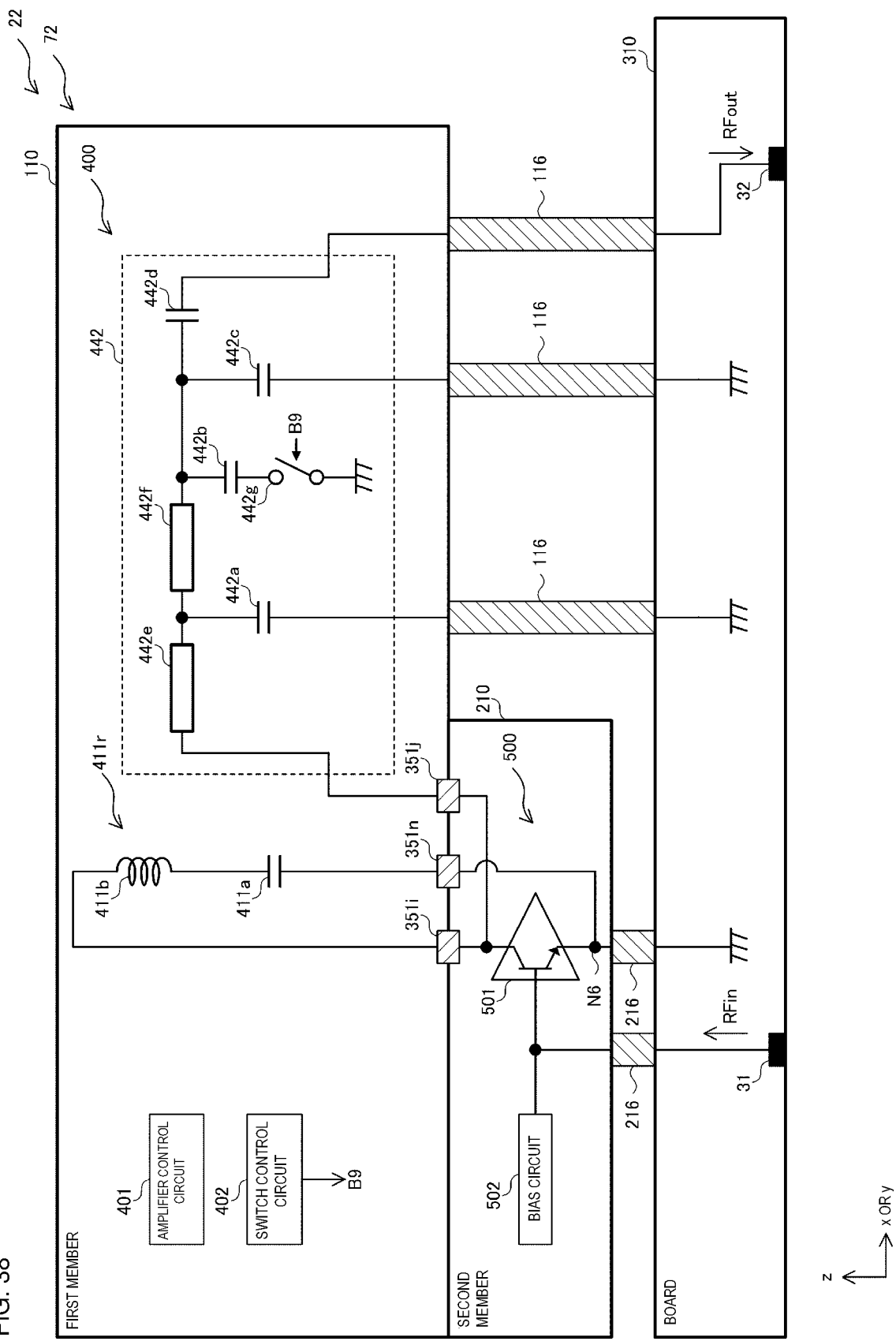
FIG. 38 is a diagram for describing arrangement of a power amplification circuit in a power amplification device.

FIG. 38 is a diagram for describing arrangement of a power amplification circuit 72 in a power amplification device 22. FIG. 38 schematically illustrates the arrangement of the power amplification circuit 72 in a cross section of the power amplification device 22. As illustrated in FIG. 38, the power amplification circuit 72 according to the twelfth embodiment differs from the power amplification circuit 65 according to the fifth embodiment in that the termination circuit 411r and the matching circuit 442 are grounded outside the first member 110.

In the second circuit 500 in the second member 210, a node N6 is provided between the emitter of the amplifier 501 and a second conductive protrusion 216 among the second conductive protrusions 216.

In the first circuit 400 in the first member 110, the second end of the capacitor 442a included in the matching circuit 442 is grounded on the module board 310 through a first conductive protrusion 116 among the first conductive protrusions 116. The second end of the capacitor 442c is grounded on the module board 310 through a first conductive protrusion 116 among the first conductive protrusions 116.

The second end of the capacitor 411a included in the termination circuit 411r is connected to the node N6 through a member-member connection conductor 351n. That is, the termination circuit 411r is grounded on the module board 310 through the member-member connection conductor 351n, the node N6, and a second conductive protrusion 216 among the second conductive protrusions 216. The member-member connection conductor 351n has, for example, substantially the same configuration as the member-member connection conductor 351i.

For example, an arrangement is conceivable in which the termination circuit 411r and the matching circuit 442 are grounded on a common ground terminal provided in the first member 110. However, with an arrangement like this, there is a high probability that a harmonic wave transferred by the termination circuit 411r enters the matching circuit 442 through the common ground terminal, and thus such an arrangement is not preferred.

In contrast to this, the power amplification circuit 72 has a configuration in which the termination circuit 411r is grounded on the module board 310 through the member-member connection conductor 351n, the second member 210, and a second conductive protrusion 216 among the second conductive protrusions 216. With this configuration, the length of a path between the termination circuit 411r and the matching circuit 442 through ground can be increased. As a result, entering of a harmonic wave from the termination circuit 411r into the matching circuit 442 through ground can be suppressed, and thus a high quality output signal RFout having a low level of harmonic wave noise can be supplied to a subsequent-stage circuit.

Note that the configuration has been described in which the amplifier 501 and the termination circuit 411r are grounded on the module board 310 through the same second conductive protrusion 216; however, the configuration is not limited thereto. A configuration may be used in which the amplifier 501 and the termination circuit 411r are grounded on the module board 310 through respective second conductive protrusions 216 among the second conductive protrusions 216.

Figure 39:
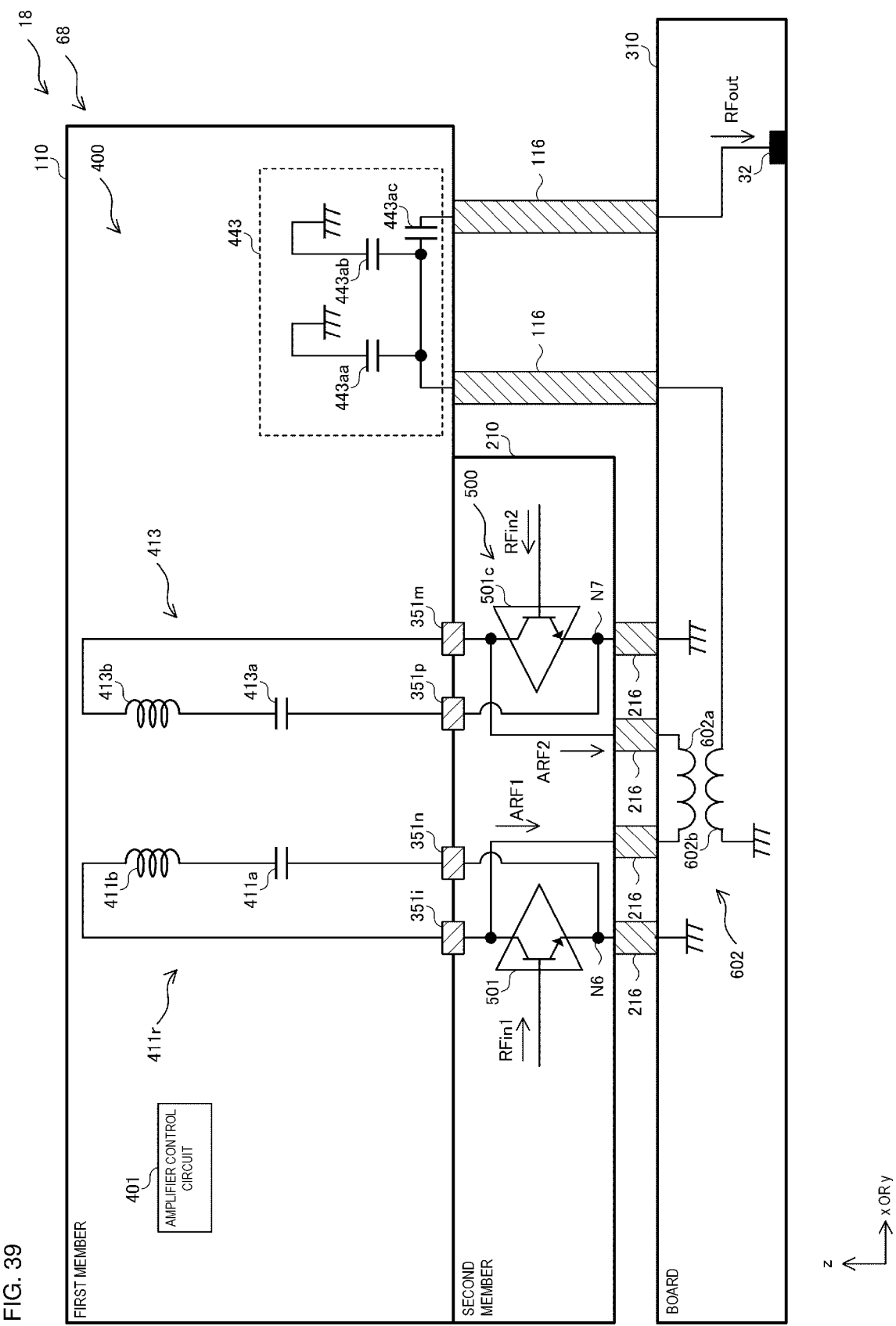
FIG. 39 is a diagram for describing a modification of the arrangement of the power amplification circuit in the power amplification device 18.
Figure 40:
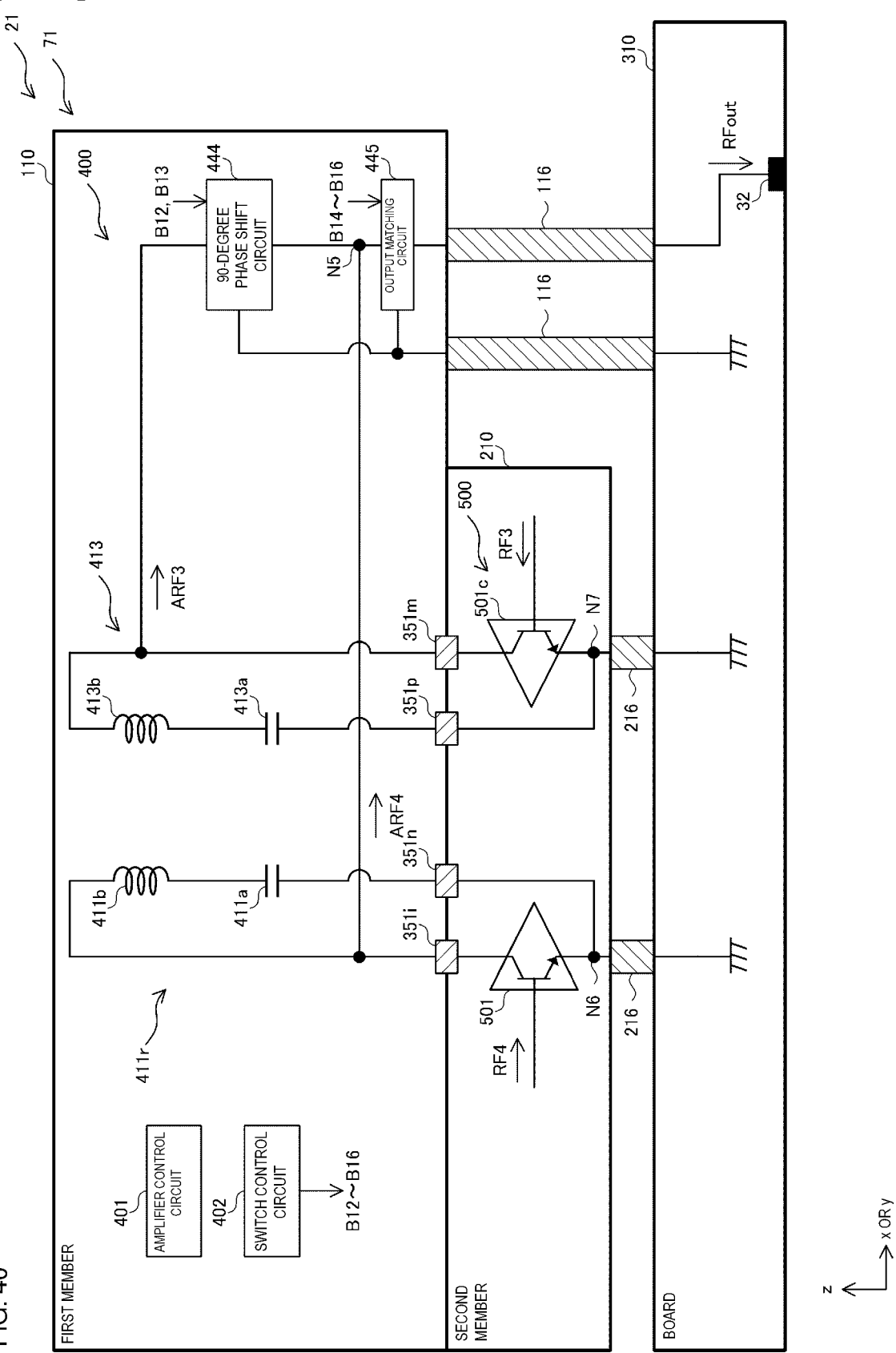
FIG. 40 is a diagram for describing a modification of the arrangement of the power amplification circuit in the power amplification device.

FIG. 39 is a diagram for describing a modification of the arrangement of the power amplification circuit 68 in the power amplification device 18. FIG. 40 is a diagram for describing a modification of the arrangement of the power amplification circuit 71 in the power amplification device 21. As illustrated in FIGS. 39 and 40, the way in which the termination circuit 411r of the power amplification device 22 is grounded (see FIG. 38) can be similarly applied to the termination circuits 411r and 413 in the power amplification device 18 (see FIG. 33) and the power amplification device 21 (see FIG. 36).

In this case, in the second circuit 500 in the second member 210, a node N7 is provided between the emitter of the amplifier 501c and a second conductive protrusion 216 among the second conductive protrusions 216.

The second end of the capacitor 413a included in the termination circuit 413 is connected to the node N7 through a member-member connection conductor 351p. That is, the termination circuit 413 is grounded on the module board 310 through the member-member connection conductor 351p, the node N7, and a second conductive protrusion 216 among the second conductive protrusions 216. The member-member connection conductor 351p has, for example, substantially the same configuration as the member-member connection conductor 351i.

Note that the configuration has been described in which the amplifier 501c and the termination circuit 413 are grounded on the module board 310 through the same second conductive protrusion 216; however, the configuration is not limited thereto. A configuration may be used in which the amplifier 501c and the termination circuit 413 are grounded on the module board 310 through respective second conductive protrusions 216 among the second conductive protrusions 216.

In the power amplification devices 11 to 22, the configuration has been described in which the first circuit 400 of the first member 110 and the second circuit 500 of the second member 210 are electrically connected to each other by a conductor formed in or on either the first member 110 or the second member 210, which is for example a member-member connection conductor; however, the configuration is not limited thereto. A configuration may be used in which the first circuit 400 and the second circuit 500 are electrically connected to each other by bumps or wire bonding.

The layouts of the power amplification circuits 63 to 72 in the power amplification devices 13 to 22 can be realized by combining, as appropriate, individual portions of the layout of the power amplification circuit 61 in the power amplification device 11 and individual portions of the layout of the power amplification circuit 62 in the power amplification device 12.

The configurations have been described in which the power amplification devices 11 to 22 have the module board 310; however, the configurations are not limited thereto. Each of the power amplification devices 11 to 22 may have a configuration that does not have the module board 310.

In the above, exemplary embodiments of the present disclosure have been described. The power amplification devices 11 to 22 have the first member 110, in which the first circuit 400 is formed, the second member 210, in which the second circuit 500 is formed, the member-member connection conductors, which electrically connect the first circuit 400 and the second circuit 500 to each other. The second member 210 is mounted on the first member 110. The second circuit 500 includes the amplifier 501, which amplifies an RF signal to output the output signal RFout. The first circuit 400 includes the amplifier control circuit 401, which controls the operation of the second circuit 500. At least part of the termination circuit 411 is formed in the first member 110, the at least part of the termination circuit 411 being connected to the amplifier 501 through a member-member connection conductor and attenuating the harmonic wave component of the output signal RFout.

For example, in a case where the termination circuit 411 is provided in the second member 210, the termination circuit 411 and a transmission path for the output signal RFout become physically close to each other, and there is a high likelihood that the harmonic wave component enters the transmission path. In contrast to this, by using a configuration in which at least part of the termination circuit 411 is formed in the first member 110, which is separate from the second member 210 provided with the amplifier 501, the termination circuit 411 can be positioned away from the transmission path for the output signal RFout. As a result, entering of a harmonic wave component into the transmission path for the output signal RFout can be suppressed, and thus radiation of a harmonic wave component from the transmission path can be suppressed, and the output signal RFout into which entering of a harmonic wave component is suppressed can be supplied to another device such as a subsequent-stage circuit. Thus, entering of a harmonic wave into another device can be suppressed, the harmonic wave being included in an amplified signal that is a signal amplified by an amplifier.

In the power amplification device 11, the termination circuit 411 includes the inductor 411b, which is formed in the first member 110.

In this manner, the inductor 411b, which is large in size, is formed in the first member 110. With this configuration, the major portion of the termination circuit 411 can be formed in the first member 110. Thus, the major portion of the termination circuit 411 can be positioned away from the transmission path for the output signal RFout.

In the power amplification device 12, the termination circuit 701 includes a second inductor formed by the member-member connection conductor 351i such as the redistribution line 351e.

With a configuration like this, the second inductor can be easily positioned away from the transmission path for the output signal RFout. Moreover, the member-member connection conductor 351i can be caused to have the function of an inductor, and thus the space for the member-member connection conductor 351i is effectively used, and the degree of freedom of layout can be improved.

In the power amplification device 12, the termination circuit 701 includes the switches 431 and 432, which switch the frequency of a harmonic wave component to be attenuated. In the power amplification device 13, the termination circuit 412 includes the switches 412ca and 412cb, which switch the frequency of a harmonic wave component to be attenuated.

In general, the harmonic frequency band that a termination circuit can attenuate is limited to a certain frequency range. With the above configuration, the frequency range in which a harmonic wave can be efficiently attenuated can be widen by the switches 431 and 432 and the switches 412ca and 412cb, and thus the power amplification devices 12 and 13 can be provided that supply a high-quality output signal RFout into which entering of a harmonic wave component is suppressed over the wide frequency band.

In the power amplification device 12, part of the matching circuit 702 is formed in the first member 110, the matching circuit 702 adjusting, regarding the fundamental wave of the output signal RFout, the first impedance when the circuits after the amplifier 501 are viewed from the amplifier 501. The matching circuit 702 includes the switches 433 and 434, which switch the first impedance. In the power amplification device 15, at least part of the matching circuit 442, which adjusts the first impedance, is formed in the first member 110. The matching circuit 442 includes the switch 442g, which switches the first impedance.

In general, the frequency band for which a matching circuit can achieve impedance matching between circuits is limited to a certain frequency range. With the above configuration, the frequency range in which impedance matching can be effectively achieved between the amplifier 501 and the circuits after the amplifier 501 can be widen by the switches 433 and 434 and the switch 442g, and thus the power amplification device 12 can be efficiently operated over the wide frequency band.

In the power amplification device 16, part of the termination circuit 411r is formed in the first member 110. Part of the matching circuit 441 is formed in the first member 110, the matching circuit 441 adjusting, regarding the fundamental wave of the output signal RFout, the first impedance when the circuits after the amplifier 501 are viewed from the amplifier 501. The termination circuit 411r and the matching circuit 441 include a second inductor that is formed by the member-member connection conductor 351i such as the redistribution line 351e and that is connected to the amplifier 501.

With such a configuration, part of the inductor of the termination circuit 411r can be used as part of the inductor of the matching circuit 441, and vice versa. Thus, the inductor installation space in the first member 110 can be reduced, and the size of the power amplification device 16 can be made compact.

In the power amplification device 17, an RF signal includes the input signal RFin1 and the input signal RFin2 forming a balanced signal. The amplifier 501 amplifies the input signal RFin1 to output the amplified signal ARF1. The second circuit 500 further includes the amplifier 501c, which amplifies the input signal RFin2 to output the amplified signal ARF2. The amplifier control circuit 401 further controls the operation of the amplifier 501c. At least part of the termination circuit 413 is formed in the first member 110, the termination circuit 413 being connected to the amplifier 501c through the member-member connection conductor 351m and attenuating the harmonic wave component of the amplified signal ARF2.

In this manner, even in the differential amplification configuration, the termination circuit 413 can be positioned away from a transmission path for the amplified signal ARF2 by using a configuration in which at least part of the termination circuit 413 is formed in the first member 110, which is separate from the second member 210 provided with the amplifier 501c. As a result, entering of the harmonic wave component into the amplified signal ARF2 can be suppressed.

The RF circuit module 300 has the power amplification device 17 and the module board 310 having the substrate-side electrodes 312. The second member 210 has the second conductive protrusions 216, which are to be connected to the substrate-side electrodes 312 of the module board 310. By using the second conductive protrusions 216, the second member 210 is mounted on the module board 310 by flip chip bonding. The module board 310 is provided with the balun 602, which converts the amplified signals ARF1 and ARF2 supplied through the second conductive protrusions 216 into the output signal RFout, which is an unbalanced signal.

In this manner, with a configuration in which the module board 310 is provided with the balun 602, which is large in size, the space for arranging a balun in the second member 210 or the first member 110 does not have to be ensured. The size of the second member 210 and that of the first member 110 can thus be reduced.

In the power amplification device 19, the first member 110 has the first conductive protrusions 116, which are to be connected to the substrate-side electrodes 311 of the module board 310. By using the first conductive protrusions 116, the first member 110 is mounted on the module board 310 by flip chip bonding. The matching circuit 443a, to which the output signal RFout is supplied from the balun 602 through a first conductive protrusion 116 among the first conductive protrusions 116 and which adjusts, regarding the fundamental wave of the output signal RFout, the third impedance when the circuits after the balun 602 are viewed from the balun 602, is formed in the first member 110. The matching circuit 443a includes the switches 443ba and 443bb, which switch the third impedance.

In general, the frequency band for which a matching circuit can achieve impedance matching between circuits is limited to a certain frequency range. With the above configuration, the frequency range in which impedance matching can be effectively achieved between the balun 602 and the circuits after the balun 602 can be widen by the switches 443ba and 443bb, and thus the power amplification device 19 can be efficiently operated over the wide frequency band.

In the power amplification device 21, an RF signal includes the input signal RFin3 and the input signal RFin4, into which the RF signal is split, the input signal RFin4 having a different phase from the input signal RFin3. The amplifier 501 amplifies the input signal RFin4 to output the amplified signal ARF4 when the power level of the input signal RFin4 indicates a predetermined power level or higher. The second circuit 500 further includes the amplifier 501c, which amplifies the input signal RFin3 to output the amplified signal ARF3. The amplifier control circuit 401 further controls the operation of the amplifier 501c. At least part of the termination circuit 413 is formed in the first member 110, the termination circuit 413 being connected to the amplifier 501c through the member-member connection conductor 351m and attenuating the harmonic wave component of the amplified signal ARF3.

In this manner, even in the configuration of the Doherty amplification circuit, the termination circuit 413 can be positioned away from a transmission path for the amplified signal ARF3 by using a configuration in which at least part of the termination circuit 413 is formed in the first member 110, which is separate from the second member 210 provided with the amplifier 501c. As a result, entering of the harmonic wave component into the amplified signal ARF3 can be suppressed.

In the power amplification device 21, the first circuit 400 includes the 90-degree phase shift circuit 444, which shifts the phase of the amplified signal ARF3. The 90-degree phase shift circuit 444 includes the switches 444ca and 444cb, which switch the amount of shift of the phase.

In general, the frequency range for which a phase shift circuit can shift the phase of a signal by 90° is narrow. That is, it has been difficult to shift the phase of a signal by 90° over a wide frequency band. With the above configuration, the amount of shift of the phase of the amplified signal ARF3 can be switched by the switches 444ca and 444cb, and thus the amount of shift can be switched in accordance with the frequency of the amplified signal ARF3, and the phase of the amplified signal ARF3 can be shifted by, for example, 90° over a wide frequency band.

In the power amplification device 21, the output matching circuit 445 is formed in the first member 110. The output matching circuit 445 combines the amplified signals ARF3 and ARF4 to generate the output signal RFout and adjusts, regarding the fundamental wave of the output signal RFout, the fourth impedance when the circuits after the amplifiers 501 and 501c are viewed from the amplifiers 501 and 501c. The output matching circuit 445 includes the switches 445ca, 445cb, and 445cc, which switch the fourth impedance.

In general, the frequency band for which a matching circuit can achieve impedance matching between circuits is limited to a certain frequency range. With the above configuration, even in the configuration of the Doherty amplification circuit, the frequency range in which impedance matching can be effectively achieved between the amplifiers 501 and 501c and the circuits after the amplifiers 501 and 501c can be widen by the switches 445ca, 445cb, and 445cc, and thus the power amplification device 21 can be efficiently operated over the wide frequency band.

The RF circuit module 300 has the power amplification device 22 and the module board 310 having the substrate-side electrodes 312. The second member 210 has the second conductive protrusions 216, which are connected to the substrate-side electrodes 312 of the module board 310. The amplifier 501 is grounded through a second conductive protrusion 216 among the second conductive protrusions 216. The termination circuit 411r is grounded through the second member 210 and the second conductive protrusion 216.

For example, in a case where the first member 110 is provided with a matching circuit, an arrangement is conceivable in which the termination circuit 411r and the matching circuit are grounded on a common ground terminal provided in the first member 110. However, with an arrangement like this, there is a high probability that a harmonic wave transferred by the termination circuit 411r enters the matching circuit through the common ground terminal, and thus such an arrangement is not preferred. As described above, with the configuration in which the termination circuit 411r is grounded on the module board 310 through the second member 210 and the second conductive protrusion 216, the length of a path between the termination circuit 411r and the matching circuit through ground can be increased. As a result, entering of a harmonic wave from the termination circuit 411r into the matching circuit through ground can be suppressed, and thus a high quality output signal RFout having a low level of harmonic wave noise can be supplied to a subsequent-stage circuit. Moreover, for example, the second conductive protrusion 216 can be used for both of the grounding path for the amplifier 501 and the grounding path for the termination circuit 411r, and thus the number of second conductive protrusions 216 can be reduced.

The RF circuit module 300 includes the power amplification device 18 or 21 or both and the module board 310 having the substrate-side electrodes 312. The second member 210 has the second conductive protrusions 216, which are connected to the substrate-side electrodes 312 of the module board 310. The amplifier 501c is grounded through a second conductive protrusion 216 among the second conductive protrusions 216. The termination circuit 413 is grounded through the second member 210 and the second conductive protrusion 216.

For example, in a case where the first member 110 is provided with a matching circuit, an arrangement is conceivable in which the termination circuit 413 and the matching circuit are grounded on a common ground terminal provided in the first member 110. However, with an arrangement like this, there is a high probability that a harmonic wave transferred by the termination circuit 413 enters the matching circuit through the common ground terminal, and thus such an arrangement is not preferred. As described above, with the configuration in which the termination circuit 413 is grounded on the module board 310 through the second member 210 and the second conductive protrusion 216, the length of a path between the termination circuit 413 and the matching circuit through ground can be increased. As a result, entering of a harmonic wave from the termination circuit 413 into the matching circuit through ground can be suppressed, and thus a high quality output signal RFout having a low level of harmonic wave noise can be supplied to a subsequent-stage circuit. Moreover, for example, the second conductive protrusion 216 can be used for both of the grounding path for the amplifier 501c and the grounding path for the termination circuit 413, and thus the number of second conductive protrusions 216 can be reduced.

The RF circuit module 300 has one out of the power amplification devices 11 to 22 and the module board 310 having the substrate-side electrodes 311 and 312. The first member 110 has the first conductive protrusions 116, which are to be connected to the substrate-side electrodes 311 of the module board 310. By using the first conductive protrusions 116, the first member 110 is mounted on the module board 310 by flip chip bonding. The member-member connection conductor is a conductor formed in or on either the first member 110 or the second member 210 and electrically connects the first circuit 400 and the second circuit 500 to each other without using the module board 310. The second member 210 has the second conductive protrusions 216, which are connected to the substrate-side electrodes 312 of the module board 310.

In this manner, with the configuration in which the first member 110 is mounted on the module board 310 by flip chip bonding, the space for arranging pads and wires for wire bonding is unnecessary, so that the entire sizes of the power amplification devices 11 to 22 can be reduced. Each of the first circuit 400 and the second circuit 500 can be electrically connected to the module board 310 with the configuration in which the first member 110 has the first conductive protrusions 116 connected to the substrate-side electrodes 311 of the module board 310, and the second member 210 has the second conductive protrusions 216 connected to the substrate-side electrodes 312 of the module board 310. With the configuration in which the first circuit 400 and the second circuit 500 are electrically connected to each other by the member-member connection conductor without using the module board 310, forming of a wiring line for connecting the first circuit 400 and the second circuit 500 to each other in or on the module board 310 can be made unnecessary. As a result, the entire sizes of the power amplification devices 11 to 22 can be reduced. Heat generated by, for example, the amplifier 501 included in the second circuit 500 formed in the second member 210 can be transferred along two paths, which are a heat dissipation path to the first member 110 and a heat dissipation path to the module board 310, and thus heat can be released and wasted highly efficiently. As a result, there can be realized the power amplification devices 11 to 22 that are miniaturized without constraints based on heat dissipation characteristics or the power amplification devices 11 to 22 that are small in size but have high heat dissipation characteristics.

The RF circuit module 300 has one out of the power amplification devices 11 to 22 and the module board 310 having the substrate-side electrodes 312. The second member 210 has one or more second conductive protrusions 216 connected to the substrate-side electrodes 312 of the module board 310. A second conductive protrusion 216a among the one or more second conductive protrusions 216 is provided so as to overlap the amplifier 501 when the second member 210 is viewed in a plan view from the −z axis side.

With a configuration like this, heat generated by the amplifier 501 can be efficiently transferred to the module board 310 through the second conductive protrusion 216a and released at the module board 310, and thus a rise in the temperature of the amplifier 501 can be effectively suppressed.

In the power amplification devices 11 to 22, in the first member 110, the heat spreader 131 is provided at a position that overlaps the amplifier 501 when the second member 210 is viewed in a plan view from the −z axis side.

With a configuration like this, heat generated by the amplifier 501 can be efficiently transferred to the heat spreader 131 and can be efficiently released at the heat spreader 131, and thus a rise in the temperature of the amplifier 501 can be effectively suppressed.

In the power amplification device 12, the termination circuit 701 includes the inductor 651 having the first end, the center tap 651a, and the second end. The first end is connected to the amplifier 501, and the second end is grounded. The termination circuit 701 includes the switch 431, which is a switch having the first end and the second end and which switches between conducting and nonconducting between the first end and the second end, the first end being connected to the center tap 651a and the second end being grounded.

With a configuration like this, the effective length of the inductor 651 can be switched using a simple configuration of the switch 431 connected to the center tap 651a, and thus switching of inductance in the termination circuit 701 can be easily achieved.

In the power amplification device 12, the matching circuit 702 includes the inductor 652 having the first end, the center tap 652a, and the second end. The first end is connected to the amplifier 501, and the second end is connected to the output terminal 32. The matching circuit 702 includes the switch 433, which is a switch having the first end and the second end and which switches between conducting and nonconducting between the first end and the second end, the first end being connected to the center tap 652a and the second end being connected to the output terminal 32.

With a configuration like this, the effective length of the inductor 652 can be switched using a simple configuration of the switch 433 connected to the center tap 652a, and thus switching of inductance in the matching circuit 702 can be easily achieved.

In the power amplification device 12, at least part of the matching circuit 703 is formed in the first member 110, the matching circuit 703 adjusting, regarding the fundamental wave of the input signal RFin, the second impedance when the amplifier 501 is viewed from the input terminal 31. The matching circuit 703 includes the inductor 653 having the first end, the center tap 653a, and the second end. The first end is connected to the input terminal 31, and the second end is connected to the amplifier 501 via the capacitor 423. The matching circuit 703 includes the switch 435, which is a switch having the first end and the second end and which switches between conducting and nonconducting between the first end and the second end, the first end being connected to the input terminal 31 and the second end being connected to the center tap 653a.

With a configuration like this, the effective length of the inductor 653 can be switched using a simple configuration of the switch 435 connected to the center tap 653a, and thus switching of inductance in the matching circuit 703 can be easily achieved.

In the power amplification devices 11 to 22, the first member 110 is an element semiconductor member. The second member 210 is a compound semiconductor member.

With a configuration like this, in the second member 210, the amplifier 501, which is a high-performance amplifier, can be formed from a compound semiconductor. In the first member 110, an element semiconductor appropriate to form an FET or the like can be used as a material, and thus a switch or the like can be formed in the first member 110.

In the power amplification devices 11 to 22, the thermal conductivity of the first member 110 is greater than that of the second member 210.

With a configuration like this, regarding heat generated by the amplifier 501, the amount of heat released at the second member 210, which is low in thermal conductivity, is small; however, the heat can be released at the first member 110 by transferring the heat to the first member 110 through the member-member connection conductor. As a result, a rise in the temperature of the amplifier 501 can be effectively suppressed.

In the power amplification devices 11 to 22, the second member 210 is thinner than the first member 110.

In this manner, regarding the power amplification devices 11 to 22, the entire thickness can be reduced with the configuration in which the second member 210, which is thin, is mounted on the first member 110, which is thick, even though the power amplification devices 11 to 22 have two-chip stacking structures.

Note that the individual embodiments described above are used to facilitate understanding of the present disclosure and are not intended to interpret the present disclosure in a limited manner. The present disclosure can be modified or improved without departing from the gist of the present disclosure and includes equivalents thereof. That is, embodiments obtained by those skilled in the art through addition of design changes to the individual embodiments as appropriate are also included in the scope of the present disclosure as long as the embodiments have characteristics of the present disclosure. For example, each element included in the individual embodiments and, for example, the arrangement, material, condition, shape, and size of the element is not limited to those illustrated and can be changed as appropriate. Moreover, the individual embodiments are examples, and it is needless to say that the structures of different embodiments among the individual embodiments can be partially replaced or combined and the resulting embodiments are also included in the scope of the present disclosure as long as the embodiments have characteristics of the present disclosure.

What is claimed is:

1. An RF circuit module comprising:
a module substrate;
a first member in which a first circuit is configured;
a second member in which a second circuit is configured; and
a member-member connection conductor is a conductor configured in or on either the first member or the second member and is configured to electrically connect the first circuit and the second circuit to each other without using the module substrate, wherein
the second member is mounted on the first member,
the second circuit includes a first amplifier configured to amplify a radio frequency signal to output a first amplified signal,
the first circuit includes a control circuit configured to control an operation of the second circuit,
the first member is a flip chip bonded to the module substrate, and
at least part of a first termination circuit, which is connected to the first amplifier through the member-member connection conductor and which is configured to attenuate a harmonic wave component of the first amplified signal, is configured in the first member.

2. The RF circuit module according to claim 1, wherein the first termination circuit includes a first inductor, which is configured in the first member.

3. The RF circuit module according to claim 1, wherein the first termination circuit includes a second inductor, which is configured by the member-member connection conductor.

4. The RF circuit module according to claim 1, wherein the first termination circuit includes a switch configured to switch a frequency of the harmonic wave component to be attenuated.

5. The RF circuit module according to claim 1, wherein
at least part of a first matching circuit, configured to adjust, regarding a fundamental wave of the first amplified signal, an impedance when a circuit after the first amplifier is viewed from the first amplifier, is configured in the first member, and
the first matching circuit includes a switch configured to switch the impedance.

6. The RF circuit module according to claim 1, wherein
part of the first termination circuit is configured in the first member,
part of a first matching circuit, which is configured to adjust, regarding a fundamental wave of the first amplified signal, an impedance when a circuit after the first amplifier is viewed from the first amplifier, is configured in the first member, and
the first termination circuit and the first matching circuit include a second inductor, which is configured by the member-member connection conductor and which is connected to the first amplifier.

7. The RF circuit module according to claim 1, wherein
the radio frequency signal includes a balanced signal comprising a first signal and a second signal,
the first amplifier is configured to amplify the first signal to output the first amplified signal,
the second circuit further includes a second amplifier, which is configured to amplify the second signal to output a second amplified signal,
the control circuit is further configured to control an operation of the second amplifier, and
at least part of a second termination circuit, which is connected to the second amplifier through the member-member connection conductor and which is configured to attenuate a harmonic wave component of the second amplified signal, is configured in the first member.

8. The RF circuit module according to claim 1, wherein the radio frequency signal includes a first signal and a second signal, into which the radio frequency signal is split, the second signal having a different phase from the first signal,
the first amplifier is configured to amplify the second signal to output a second amplified signal in a case where a power level of the second signal indicates a predetermined power level or higher,
the second circuit further includes a second amplifier, which is configured to amplify the first signal to output the first amplified signal,
the control circuit is further configured to control an operation of the second amplifier, and
at least part of a second termination circuit, which is connected to the second amplifier through the member-member connection conductor and which is configured to attenuate a harmonic wave component of the second amplified signal, is configured in the first member.

9. The RF circuit module according to claim 8, wherein the first circuit includes a phase shift circuit that is configured to shift a phase of the first amplified signal, and
the phase shift circuit includes a switch configured to switch an amount of shift of the phase.

10. The RF circuit module according to claim 8, wherein a first matching circuit, which is configured to generate a third amplified signal by combining the first amplified signal and the second amplified signal and which is configured to adjust, regarding a fundamental wave of the third amplified signal, an impedance when a circuit after the first amplifier and the second amplifier is viewed from the first amplifier and the second amplifier, is configured in the first member, and
the first matching circuit includes a switch configured to switch the impedance.

11. The RF circuit module according to claim 1, wherein, in the first member, a heat spreader is provided at a position that overlaps the first amplifier when the second member is viewed in a plan view.

12. The RF circuit module according to claim 1, wherein the first termination circuit includes
a third inductor having a first end, a center tap, and a second end, the first end being connected to the first amplifier, the second end being grounded, and
a switch that has a first end and a second end and that is configured to switch between conducting and nonconducting between the first end and the second end, the first end being connected to the center tap of the third inductor, the second end being grounded.

13. The RF circuit module according to claim 1, wherein at least part of a first matching circuit, which is configured to adjust, regarding a fundamental wave of the first amplified signal, an impedance when a circuit after the first amplifier is viewed from the first amplifier, is configured in the first member, and
the first matching circuit includes
a fourth inductor having a first end, a center tap, and a second end, the first end being connected to the first amplifier, the second end being connected to an output terminal, and
a switch that has a first end and a second end and that is configured to switch between conducting and nonconducting between the first end and the second end, the first end being connected to the center tap of the fourth inductor, the second end being connected to the output terminal.

14. The RF circuit module according to claim 1, wherein at least part of a second matching circuit, which is configured to adjust, regarding a fundamental wave of the radio frequency signal, an impedance when the first amplifier is viewed from an input terminal, is configured in the first member, and
the second matching circuit includes
a fifth inductor having a first end, a center tap, and a second end, the first end being connected to the first amplifier, the second end being connected to the input terminal, and
a switch that has a first end and a second end and that is configured to switch between conducting and nonconducting between the first end and the second end, the first end being connected to the center tap of the fifth inductor, the second end being connected to the input terminal.

15. The RF circuit module according to claim 7, wherein the module substrate has electrodes, and
the second member has second-member-side conductive protrusion portions, which are connected to the electrodes of the module substrate, and the module substrate is provided with a balun that is configured to convert the first amplified signal and the second amplified signal into a third amplified signal, which is an unbalanced signal, the first amplified signal and the second amplified signal being supplied through the second-member-side conductive protrusion portions.

16. The RF circuit module according to claim 15, wherein the first member has a first-member-side conductive protrusion portion, which is to be connected to an electrode among the electrodes of the module substrate, and is mounted on the module substrate by flip chip bonding by using the first-member-side conductive protrusion portion,
a first matching circuit, to which the third amplified signal is supplied from the balun through the first-member-side conductive protrusion portion and which is configured to adjust, regarding a fundamental wave of the third amplified signal, an impedance when a circuit after the balun is viewed from the balun, is configured in the first member, and
the first matching circuit includes a switch configured to switch the impedance.

17. The RF circuit module according to claim 7, wherein the module substrate an electrode,
the second member has a second-member-side conductive protrusion portion, which is connected to the electrode of the module substrate,
the second amplifier is grounded through the second-member-side conductive protrusion portion, and
the second termination circuit is grounded through the second member and the second-member-side conductive protrusion portion.

18. The RF circuit module according to claim 1, further comprising:
the module substrate has an electrode, wherein
the second member has a second-member-side conductive protrusion portion, which is connected to the electrode of the module substrate,
the first amplifier is grounded through the second-member-side conductive protrusion portion, and the first termination circuit is grounded through the second member and the second-member-side conductive protrusion portion.

19. The RF circuit module according to claim 1, wherein the module substrate has electrodes, the first member has a first-member-side conductive protrusion portion, which is to be connected to an electrode among the electrodes of the module substrate, and is mounted on the module substrate by flip chip bonding by using the first-member-side conductive protrusion portion, and the second member has a second-member-side conductive protrusion portion, which is connected to an electrode among the electrodes of the module substrate.

20. The RF circuit module according to claim 1, wherein the module substrate has electrodes, the second member has one or more second-member-side conductive protrusion portions, which are connected to one or more electrodes among the electrodes, and at least one out of the one or more second-member-side conductive protrusion portions is provided so as to overlap the first amplifier when the second member is viewed in a plan view.

* * * * *